United States Patent
Takigawa et al.

[11] Patent Number: 6,097,744
[45] Date of Patent: Aug. 1, 2000

[54] COOLING DEVICE OF A PLANAR LIGHT SOURCE

[75] Inventors: Hiroshi Takigawa; Yuji Nishikawa, both of Kawasaki, Japan

[73] Assignee: Fujitsu Limited, Kawasaki, Japan

[21] Appl. No.: 08/974,555

[22] Filed: Nov. 19, 1997

[30] Foreign Application Priority Data

Nov. 22, 1996 [JP] Japan ............... 8-312338
Jun. 30, 1997 [JP] Japan ............... 9-174579

[51] Int. Cl.⁷ ............... H01S 3/043
[52] U.S. Cl. ............... 372/34; 372/35
[58] Field of Search ............... 372/34–36

[56] References Cited

U.S. PATENT DOCUMENTS

| | | | |
|---|---|---|---|
| 4,027,206 | 5/1977 | Lee | 361/697 |
| 4,559,580 | 12/1985 | Lutfy | 361/689 |
| 5,105,429 | 4/1992 | Mundinger et al. | 372/34 |
| 5,311,530 | 5/1994 | Wagner et al. | 372/36 |
| 5,325,384 | 6/1994 | Herb et al. | 372/36 |

FOREIGN PATENT DOCUMENTS

| | | |
|---|---|---|
| 0 508 717 A1 | 10/1985 | European Pat. Off. . |
| 0 161 282 B1 | 11/1985 | European Pat. Off. . |
| 33 29 325 A1 | 3/1984 | Germany . |
| 43 15 580 A1 | 11/1994 | Germany . |
| 43 29 936 A1 | 3/1995 | Germany . |
| 44 27 309 A1 | 2/1996 | Germany . |
| 195 06 091 A1 | 8/1996 | Germany . |
| 195 06 093 A1 | 8/1996 | Germany . |
| WO 92/19027 | 10/1992 | WIPO . |

*Primary Examiner*—John D. Lee
*Attorney, Agent, or Firm*—Armstrong, Westerman, Hattori, McLeland and Naughton

[57] ABSTRACT

A cooling device of a laser diode array includes a stacking of a plurality of metal plate members formed with a branched groove pattern or apertures acting as a cooling water path, by a chemical etching process.

60 Claims, 38 Drawing Sheets

10

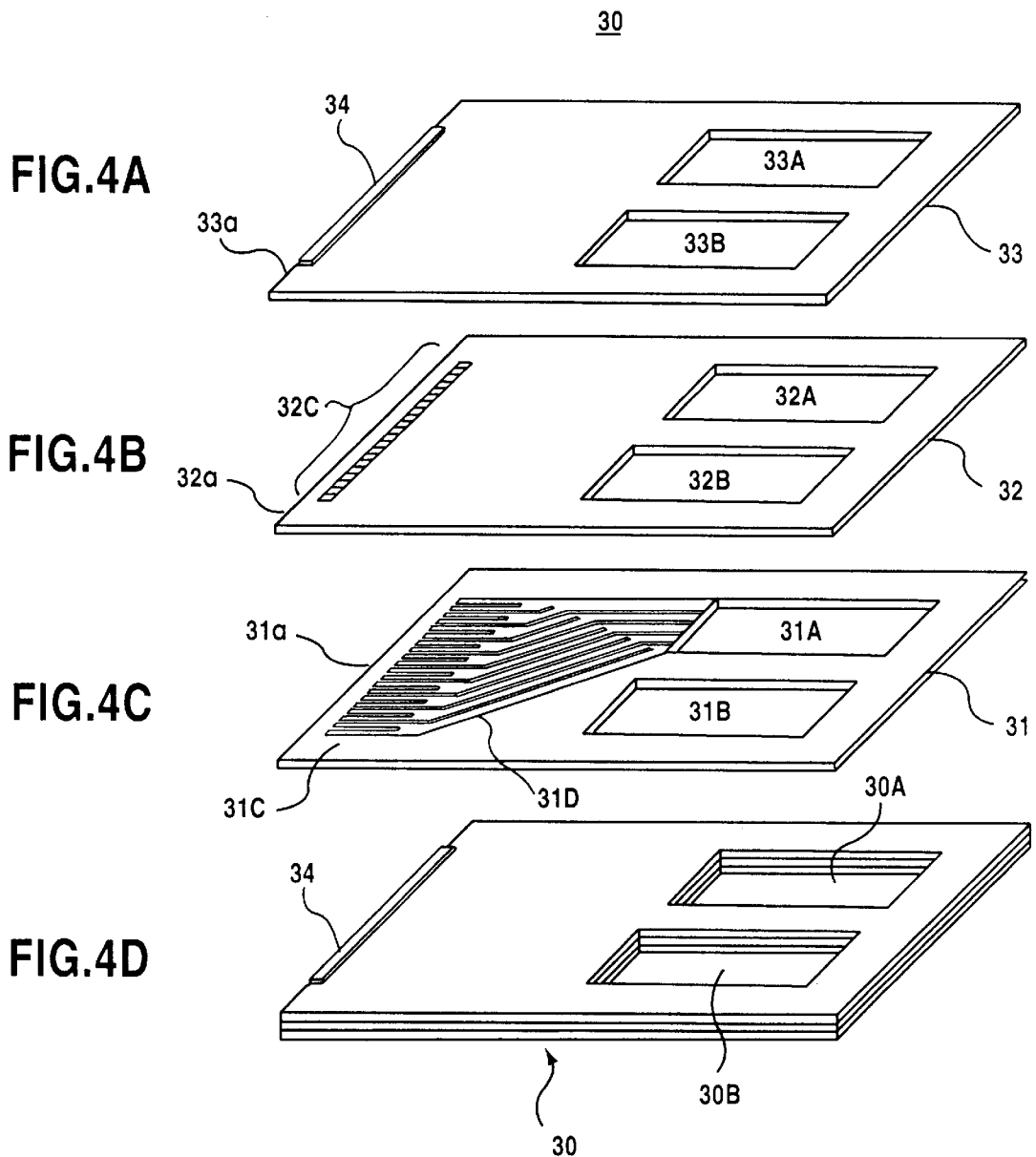

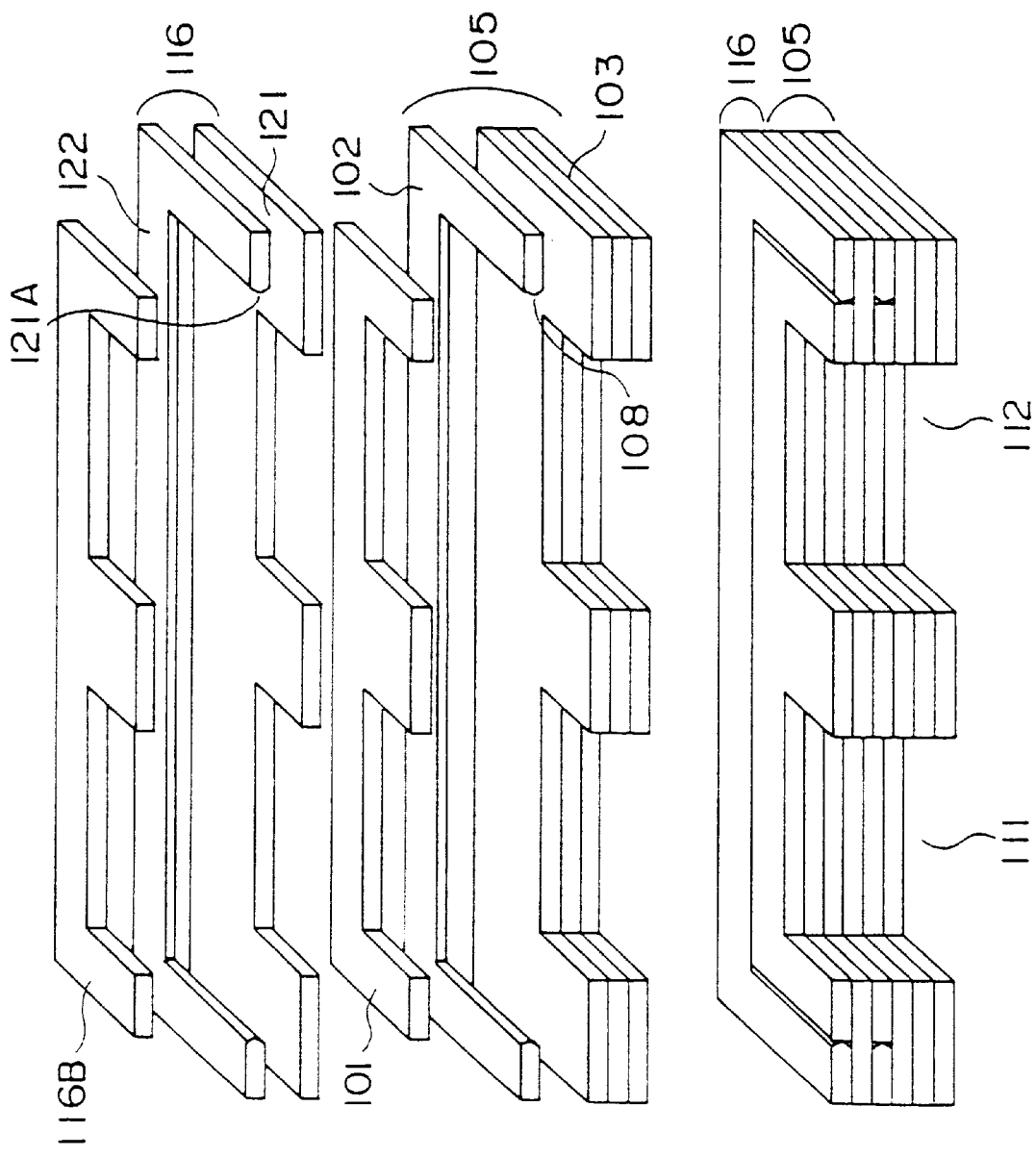

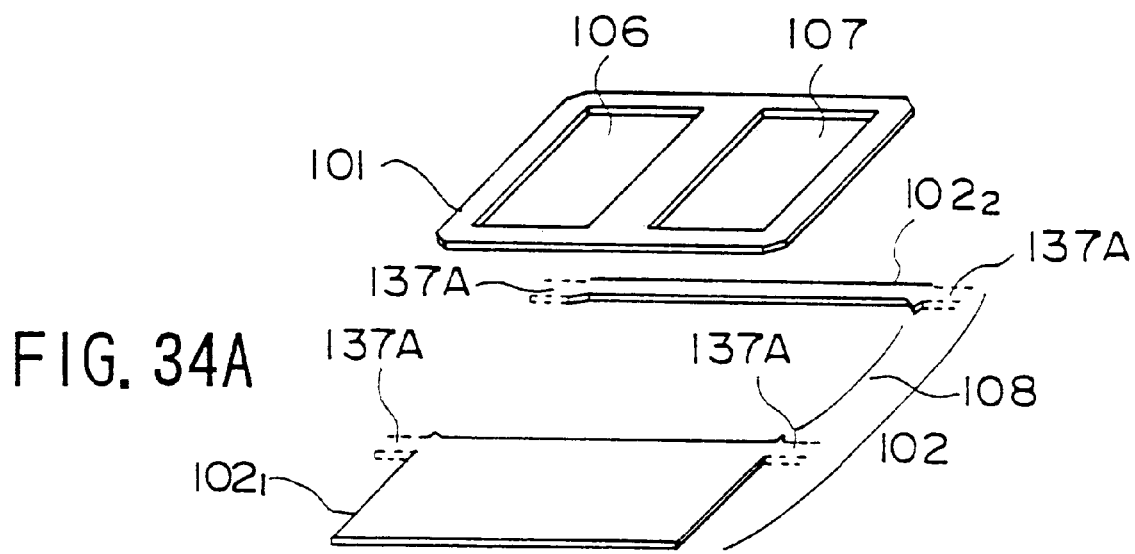
FIG. 34A
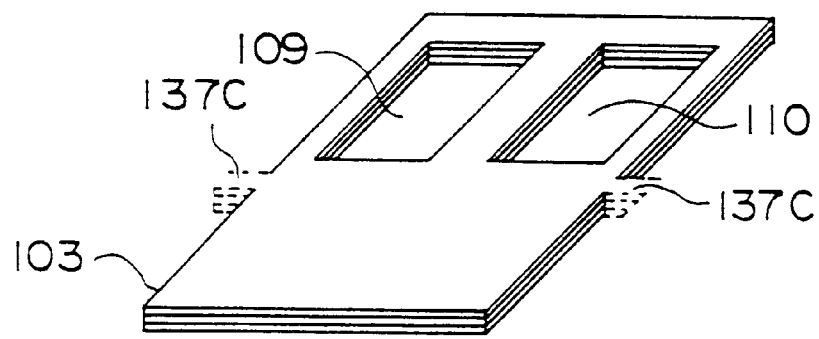
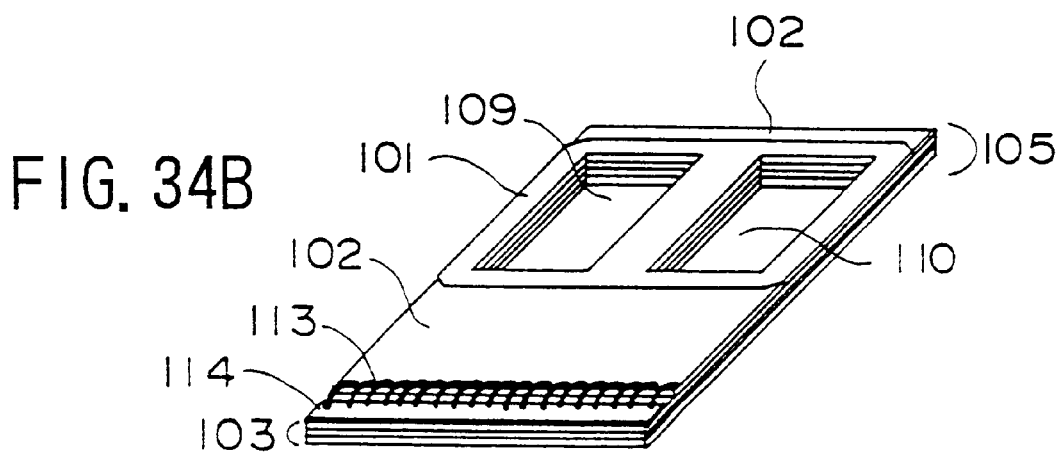
FIG. 34B

COOLING DEVICE OF A PLANAR LIGHT SOURCE

BACKGROUND OF THE INVENTION

The present invention generally relates to cooling devices and more particularly to a cooling device of a high-power laser diode array and a fabrication process of such a cooling device. Further, the present invention relates to a high-power laser diode array that is equipped with such a cooling device.

In high-power solid lasers for use in various industrial applications, it is advantageous to use a laser diode array for optical pumping. By pumping a solid laser by such a high-power laser diode array that produces an output optical beam bundle with a characteristically narrow laser oscillation spectrum, in place of a conventional xenon lamp, an efficient pumping of the solid laser becomes possible.

When a laser diode array is used for such pumping purposes, it is required that the laser diode array is capable of producing the desired high-power laser beam bundle continuously with an optical power of several tens of watts. As such a continuous high-power operation of the laser diode array causes a severe heating therein, an efficient cooling device is indispensable in a laser diode array of such high-power applications. In addition, in order that the use of a high-power laser diode array is accepted in the art of high-power solid lasers, it is necessary to reduce the cost of the laser diode array per unit optical power as much as possible, including the cost of the cooling device.

FIG. 1 shows the construction of a conventional cooling device 10 disclosed in the U.S. Pat. No. 5,105,429 for cooling a laser diode array for high-power applications.

Referring to FIG. 1, the cooling device 10 includes a lower plate 1 and an upper plate 3 each formed with a channel of cooling water, wherein the lower and upper plates 1 and 3 are assembled so as to sandwich therebetween an intermediate plate 2 made of an insulating material such as a glass slab. The lower plate 1 includes an inlet opening 1A and an outlet opening 1B of the cooling water, while the upper plate 3 is formed with an inlet opening 3A and an outlet opening 3B of the cooling water similarly to the lower plate 1. Further, the top surface of the lower plate 1 carries a branched channel 1C of the cooling water, wherein the channel 1C has a first end in communication with the foregoing cooling water inlet 1A and a plurality of second ends in correspondence to a plurality of branches of the branched water channel 1C.

The intermediate plate 2, on the other hand, is formed, along a front edge 2a thereof, with a slit 2C in correspondence to the foregoing branched second ends of the water channel 1C, wherein the slit 2C acts as a channel of the cooling water flowing across the intermediate plate 2 from a lower side thereof to an upper side thereof. Further, cooling water channels 2A and 2B are formed in the intermediate plate 2 respectively in correspondence to the cooling water inlet 1A and the cooling water outlet 1B.

Further, the upper plate 3 carries, on the bottom surface thereof, micro-channels (not shown) along a front edge 3a of the upper plate 3 in communication with the outlet opening 3B, and the micro-channels are formed with a reduced pitch as compared with the pitch of the water channel 1C.

The upper plate 3 carries on a top surface thereof a laser diode array 4 along the foregoing front edge 3a, and the micro-channels are formed on the bottom surface of the plate 3 right underneath the laser diode array 4.

The lower plate 1, the intermediate plate 2 and the upper plate 3 are assembled with each other as explained already and are fixed by a clamping bolt inserted through aligned central openings 1D–3D, which are formed in the plates 1–3 respectively. Each of the laser diodes in the laser diode array 4 are driven by a driver 5.

In the conventional cooling device 10 of this prior art, it should be noted that the plates 1 and 3 are formed of a single crystal Si substrate, and the channel 1C on the plate 1 as well as the micro-channels on the plate 3 are formed by a photolithographic patterning process that uses a resist process. Thereby, each of the grooves forming the micro-channels on the plate 1 or 3 has a width of about 25 $\mu$m and a depth of about 125 $\mu$m, and is defined by a crystal surface characteristic to a wet-etching process that is used in the photolithographic patterning process. By using such micro-channels having a very small width, the formation of a boundary layer in the cooling water along the surface of the channel is suppressed effectively and the efficiency of cooling by the cooling water through the micro-channels is enhanced substantially.

In the cooling device 10 of FIG. 1, it should be noted that the photolithographic process used to form the micro-channels requires an expensive exposure apparatus and various associated facilities. Thus, the cooling device of FIG. 1 has a drawback of high production cost. Further, the Si substrate used for the upper and lower plates 1 and 3 or the glass slab forming the intermediate plate 2 is a brittle material, and the cooling device of this prior art suffers from the problem of low yield of production. It should be noted that the front edge 2a of the glass plate 2, which is defined by the slot 2C, is particularly fragile and vulnerable. Because of the mechanical fragileness, the plates 1–3 cannot be tightened when stacked to form the cooling device 10. Thus, the cooling device 10 tends to suffer from the problem of water leakage even when a silicone rubber packing is interposed between adjacent plates. This problem becomes particularly serious in a long-duration operation of the laser diode array.

The cooling device 10 of FIG. 1 further suffers from the problem of increased serial resistance when driving the laser diode array 4 by a driving current that is supplied through the plates 1–3. As the cooling device 10 uses a glass slab for the intermediate plate 2, and because of the fact that a rubber packing material is interposed between the plates 1–3 for eliminating water leakage, it is not possible to supply the drive current to the laser diode array 4 through the plates 1–3, unless a conductor path is provided so as to bypass the plates 1–3.

Thus, it is proposed to provide a metallization layer or a conductive clip on a side wall of the layered body of the plates 1–3 in combination with the use of a conductive rubber packing material in place of using an ordinary insulating rubber packing material for eliminating the water leakage. However, none of these approaches are sufficient to eliminate the problem of increased serial resistance of the laser diode array, and the problem of unwanted Joule heating has been inevitable.

In addition, the cooling device 10 of FIG. 1 has a drawback in that the cooling device 10 does not use the part other than the part where the micro-channels are formed effectively for the cooling of the laser diode array 4. Associated therewith, the efficiency of cooling of the cooling device 10 is not high as is expected.

More specifically, the plate 1 or plate 3, which is formed of Si, has a thermal conductivity substantially smaller than a thermal conductivity of a metal, and thus, the efficient cooling of the laser diode array 4 through the plate 1 or plate 3 by heat conduction is not expected. In addition, no substantial heat conduction is expected through the glass intermediate plate 2. Making things worse, the front edge part 2a of the glass intermediate plate 2 is thermally isolated from the rest of the glass plate 2 by the slot 2C, and thus, no effective cooling is expected for the front edge part 2a, while this front edge part 2a, being located right underneath the laser diode array 4, collects majority of the heat produced by the laser diode array 4.

Thus, the cooling device 10 of FIG. 1 relies solely on the micro-channels for cooling the laser diode array 4, and thus, it is necessary to secure a sufficient surface area for the micro-channels in order to achieve the desired cooling of the laser diode array 4. However, the formation of such a micro-channel structure is expensive as noted before and increases the cost of the cooling device 10. Further, the cooling device 10 is vulnerable to the problem of clogging due to the dust particles contained in the cooling water. Thus the cooling device 10 has a problem of expensive maintenance cost.

In addition, the cooling device 10 of FIG. 1, in which the micro-channels are formed by an anisotropic etching process of the Si substrate, has a drawback in that the degree of freedom of the flow-path pattern is relatively limited. Thus, the cooling water is once divided into a plurality of flows by the micro-channels 1C, while the plurality of flows may merge again in the channel 2C of the intermediate plate 2. Such a merging of the cooling water may cause an inhomogeneous supply of the cooling water in the length direction of the laser diode bar 4. When such a temperature variation occurs, the oscillation wavelength of the laser diode may vary in the length direction. In view of the relatively small thermal conductivity of Si, the variation of the oscillation wavelength appears conspicuously.

FIGS. 2A–2E show the construction of another conventional cooling device 20.

Referring to FIGS. 2A–2E, the cooling device 20 includes a lower lid member 21 formed with a cooling water inlet 21A and a cooling water outlet 21B, on which a lower plate 22, formed with a cooling water inlet 22A and a cooling water outlet 22B in correspondence to the foregoing cooling water inlet 21A and the cooling water outlet 21B, is provided. On the lower plate 22, an intermediate plate 23, formed also with a cooling water inlet 23A and a cooling water outlet 23B in correspondence to the foregoing cooling water inlet 22A and the cooling water outlet 22B, is provided, and an upper plate 24, formed similarly with a cooling water inlet 24A and a cooling water outlet 24B in correspondence to the foregoing cooling water inlet 23A and the cooling water outlet 23B, provided on the intermediate plate 23. Further, an upper lid member 25, formed with a cooling water inlet 25A and a cooling water outlet 25B in correspondence to the foregoing cooling water inlet 24A and the cooling water outlet 24B, provided on the upper plate 24.

It should be noted that the lower plate 22 is formed with a cooling water channel 22C in communication with the foregoing cooling water inlet 22A with a shape that increases in width toward a front edge 22a thereof. On the other hand, the intermediate plate 23 is formed with a slit 23C in the vicinity of a front edge 23 a thereof, wherein the slit 23C is isolated from the foregoing cooling water inlet 23A or the cooling water outlet 23B. Thereby, the slit 23C acts as a channel for the cooling water flowing across the plate 23 from the lower side to the upper side of the plate 23.

The upper plate 24 is formed with a micro-channel 24D along a front edge 24a thereof in correspondence to the foregoing slit 23C of the underlying plate 23, wherein the upper plate 24 further includes a cooling water channel 24C in continuation from the micro-channel 24D to the cooling water outlet 24B, with a decreasing width toward to the outlet 24B.

Each of the plates 21–24 is formed of a thermally conductive material such as a Cu plate, and a cooling device is assembled by stacking the plates 21–24 upon each other. In the cooling device thus formed, the cooling water introduced into the inlet 21A reaches the micro-channel 24D after passing through the slit 23C. The cooling water thus reaching the micro-channel 24D absorbs the heat produced by a laser diode array (not shown), which is mounted on the upper lid plate 25 along a front edge 25a thereof. The cooling water is then caused to flow to the cooling water outlet 25B after flowing through the cooling water channel 24C.

FIG. 3 shows the micro-channel 24d in detail.

Referring to FIG. 3, the micro-channel 24D is formed of a number of parallel ribs 24d formed by a laser machining process. Typically, the ribs 24d are formed so as to define a micro-channel or minute cooling water channel between a pair of adjacent ribs 24b such that the micro-channel thus formed has a width of about 20 $\mu$m.

In the cooling device 20 of FIGS. 2A–2E, in which the Cu plates 21–25 are stacked, the problem of poor thermal conductivity and electrical conductivity of the plate members forming the cooling device is successfully resolved, contrary to the case of the cooling device 10 of FIG. 1. On the other hand, the cooling device 20 of FIGS. 2A–2E still has a drawback in that each of the plates 21–25 has to be formed one by one by a laser machining process. Thereby, the production cost of the cooling device 20 increases inevitably. While the production cost itself may be reduced by using a wet etching process, a wet etching proceeds isotropically when applied to a metal such as a Cu plate, and the channel thus formed generally has a width more than two times as large as the thickness thereof. In other words, no micro-channel can be formed according to such a wet-etching process. When no micro-channels are formed, the efficiency of cooling of the cooling device is reduced inevitably.

Further, the cooling device 20 tends to suffer from the problem of poor yield of production due to the construction of stacking five or more Cu plates. When staking the Cu plates 21–25 to form a water-tight structure, there arises a problem in that the Cu-plates experience a substantial mechanical deformation as a result of the pressure and heat applied at the time of a diffusion welding process. It should be noted that the part of the Cu plates covering a large opening such as the water channel 22C or 24C experiences a particularly severe deformation. Further, a similar deformation occurs also in the front edge part 23 a of the plate 23 where the slit 23C is formed. Further, such a deformation of the cooling device 20 causes a corresponding deformation in the laser diode array provided thereon, and the lifetime of the laser diode array is reduced as a consequence.

Further, in relation to the foregoing deformation of the Cu plates, which tends to cause a collapse in the water channel, the cooling device 20 of FIGS. 2A–2E suffers from the problem of non-uniform cooling of the laser diode array. When this occurs, an unwanted temperature distribution is induced in the laser diode array in the length direction thereof similarly to the case of the cooling device 10 of FIG. 1 as explained already, and the oscillation wavelength of the laser diodes changes variously in the length direction of the laser diode array.

In addition, the cooling device 20, which uses a Cu plate for all of the plates 21–25, has a problem in that the cooling device 20 requires an insulating substrate for carrying the laser diode array. However, the use of such a separate insulating substrate increases the number of parts and hence the number of steps of fabrication of the cooling device 20.

Further, it should be noted that the cooling device 20, which uses a wide water channel 24C in continuation with the micro-channel 24D, suffers from the problem of relatively low cooling efficiency due to the formation of boundary layers in the channel 24C. In other words, the channel 24C does not contribute to the cooling of the laser diode array substantially. Thus, the cooling device 20 also relies primarily upon the micro-channels, and the desired efficient cooling is not achieved. Further, it should be noted that the front edge part 23 a of the intermediate plate 23 is thermally isolated from the rest of the Cu plate 23 by the slit 23C. Thereby, the heat transfer from the front edge part 23 a to the cooling water via the Cu plate 23 is also not expected. As a result of the use of the micro-channels, the cooling device 20 suffers from the problem of increased fabrication cost and increased maintenance cost, similar to the cooling device 10 of FIG. 1.

SUMMARY OF THE INVENTION

Accordingly, it is a general object of the present invention to provide a novel and useful cooling device and a fabrication process thereof, as well as a laser diode array equipped with such a cooling device, wherein the foregoing problems are eliminated.

Another and more specific object of the present invention is to provide a highly efficient and reliable cooling device of a laser diode array that is formed by using a well-established, low-cost chemical etching process, which is used widely in the field of semiconductor packages for producing lead-frame structures, as well as a laser diode array equipped with such a cooling device.

Another object of the present invention is to provide a low-cost production process for producing a highly efficient cooling device of a laser diode, by using a well-established, low-cost chemical etching process, which is used widely in the field of semiconductor packages for producing lead-frame structures.

Another object of the present invention is to provide a cooling device, comprising:
  a layered body of plate members stacked with each other and adapted for thermal contact with an object to be cooled;
  said layered body comprising:
    a first plate member of a metal, said first plate member having an inlet opening for a cooling medium;
    a first branched groove provided on a first side of said first plate member, said first branched groove having a first end in communication with said inlet opening and a plurality branches each in communication with said first end, each of said plurality of branches having a second end opposite to said first end, said first branched groove thereby transporting therethrough said cooling medium from said first end to each of said second ends;
    a second plate member of a metal provided on said first side of said first plate member;
    a plurality of apertures provided on said second plate member respectively in correspondence to said second ends of said branches, each of said apertures being isolated from each other and allowing a passage of said cooling medium therethrough;
    a third plate member of a metal provided on said second plate member at a side of said second plate member opposite to a side facing said first plate member, said third plate member having an outlet opening of said cooling medium; and
    a second branched groove provided on said third plate member at a side thereof facing said second plate member, said second branched groove having a third end in communication with said outlet opening and a plurality branches each in communication with said third end, each of said plurality of branches having a fourth end opposite to said third end, said second branched groove thereby transporting therethrough said cooling medium from said plurality of fourth ends to said third end;
    said plurality of fourth ends of said second branched groove corresponding to said plurality of apertures, respectively.

According to the present invention, a cooling device having a very high efficiency of cooling is obtained. Particularly, the problem of decrease of the thermal conductivity in the conventional cooling devices, in which the heat conduction path is interrupted by a continuous slit, is successfully avoided by providing the passage of the cooling medium to the second plate member in the form of the isolated apertures. Thereby, an efficient heat conduction becomes possible from a front edge part of the second plate member, to which the majority of the heat of the laser diode is conducted, to the rest of the second plate member. Further, the problem of mechanical deformation of the plate members at the continuous slit is effectively eliminated, by forming the apertures in plate of the continuous slit. It should be noted that each aperture is defined by a rib bridging across the front edge part of the second plate member and the rest of the second plate member. Further, none of the plate members includes a large continuous opening for the channel of the cooling medium, and the mechanical deformation of the plate members is minimized even when the first through third plate members are stacked and pressed with each other for diffusion welding. As the first through third plate members engage with each other in intimate contact, except for the part forming the grooves, an excellent heat conduction is secured between the first through third plate members, and the layered body, in which the first through third plate members are thermally interconnected with each other, acts as a whole as a thermally integral body internally cooled by the cooling medium. Thereby, the thermal resistance of the cooling device is reduced significantly. As the efficiency of cooling is thus very high in the cooling device of the present invention, it is not necessary to form the grooves in the form of micro-channels. The grooves can be formed by an ordinary chemical etching process, and the fabrication cost of the cooling device can be reduced significantly.

Another object of the present invention is to provide an optical source, comprising:
  a cooling device; and
  a laser diode array provided on said cooling device, said cooling device, comprising:
    a layered body of plate members stacked with each other and adapted for thermal contact with an object to be cooled;
  said layered body comprising:
    a first plate member of a metal, said first plate member having an inlet opening of a cooling medium;
    a first branched groove provided on a first side of said first plate member, said first branched groove having a first end in communication with said inlet opening and a plurality branches each in communication with said first end, each of said plurality of branches having a second end opposite to said first end, said first branched groove thereby transporting therethrough said cooling medium from said first end to each of said second ends;

a second plate member of a metal provided on said first side of said first plate member;

a plurality of apertures provided on said second plate member respectively in correspondence to said second ends of said branches, each of said apertures being isolated from each other and allowing a passage of said cooling medium therethrough;

a third plate member of a metal provided on said second plate member at a side of said second plate member opposite to a side facing said first plate member, said third plate member having an outlet opening for said cooling medium; and a second branched groove provided on said third plate member at a side thereof facing said second plate member, said second branched groove having a third end in communication with said outlet opening and a plurality branches each in communication with said third end, each of said plurality of branches having a fourth end.opposite to said third end, said second branched groove thereby transporting therethrough said cooling medium from said plurality of fourth ends to said third end;

said plurality of fourth ends of said second branched groove corresponding to said plurality of apertures, respectively;

said laser diode array being mounted on said third plate member along said fourth ends of said second branched groove.

Another object of the present invention is to provide a planar optical source, comprising:

a plurality of linear optical sources stacked upon each other, each of said linear optical sources comprising:
a cooling device; and a laser diode array provided on said cooling device, said cooling device, comprising:
a layered body of plate members stacked with each other and adapted for thermal contact with an object to be cooled;

said layered body comprising:
a first plate member of a metal, said first plate member having an inlet opening of a cooling medium;

a first branched groove provided on a first side of said first plate member, said first branched groove having a first end in communication with said inlet opening and a plurality branches each in communication with said first end, each of said plurality of branches having a second end opposite to said first end, said first branched groove thereby transporting therethrough said cooling medium from said first end to each of said second ends;

a second plate member of a metal provided on said first side of said first plate member;

a plurality of apertures provided on said second plate member respectively in correspondence to said second ends of said branches, each of said apertures being isolated from each other and allowing a passage of said cooling medium therethrough;

a third plate member of a metal provided on said second plate member at a side of said second plate member opposite to a side facing said first plate member, said third plate member having an outlet opening of said cooling medium; and a second branched groove provided on said third plate member at a side thereof facing said second plate member, said second branched groove having a third end in communication with said outlet opening and a plurality branches each in communication with said third end, each of said plurality of branches having a fourth end opposite to said third end, said second branched groove thereby transporting therethrough said cooling medium from said plurality of fourth ends to said third end;

said plurality of fourth ends of said second branched groove corresponding to said plurality of apertures, respectively;

said laser diode array being mounted on said third plate member along said fourth ends of said second branched groove.

Another object of the present invention is to provide an optical source, comprising:

a base having an inlet-side passage and an outlet-side passage for a cooling medium; and a plurality of planar optical sources provided detachably on said base along said inlet-side passage and outlet-side passage of said cooling medium, each of said planar optical sources comprising a plurality of linear optical sources stacked with each other, each of said linear optical sources comprising:
a cooling device; and a laser diode array provided on said cooling device, said cooling device, comprising:
a layered body of plate members stacked upon each other and adapted for thermal contact with an object to be cooled;

said layered body comprising:
a first plate member of a metal, said first plate member having an inlet opening of a cooling medium;

a first branched groove provided on a first side of said first plate member, said first branched groove having a first end in communication with said inlet opening and a plurality branches each in communication with said first end, each of said plurality of branches having a second end opposite to said first end, said first branched groove thereby transporting therethrough said cooling medium from said first end to each of said second ends;

a second plate member of a metal provided on said first side of said first plate member;

a plurality of apertures provided on said second plate member respectively in correspondence to said second ends of said branches, each of said apertures being isolated from each other and allowing a passage of said cooling medium therethrough;

a third plate member of a metal provided on said second plate member at a side of said second plate member opposite to a side facing said first plate member, said third plate member having an outlet opening of said cooling medium; and a second branched groove provided on said third plate member at a side thereof facing said second plate member, said second branched groove having a third end in communication with said outlet opening and a plurality branches each in communication with said third end, each of said plurality of branches having a fourth end opposite to said third end, said second branched groove thereby transporting therethrough said cooling medium from said plurality of fourth ends to said third end;

said plurality of fourth ends of said second branched groove corresponding to said plurality of apertures, respectively;

said laser diode array being mounted on said third plate member along said fourth ends of said second branched groove;

wherein said base is formed with a plurality of outlet-side openings and a plurality inlet-side openings in correspondence to said plurality of planar optical sources such that each of said outlet-side openings communicates with said inlet-side passage and such that each of said inlet-side openings communicates with said outlet-side passage;

each of said plurality of planar optical sources being mounted on said base such that said inlet opening of said cooling device communicates with said outlet-side opening on said base and such that said outlet opening of said cooling device communicates with said inlet-side opening.

According to the present invention, a high-power linear optical source that uses a laser diode array is obtained, wherein the laser diode array used in the high-power optical source is operable even when a severe heating is caused therein, due to the reliable, efficient cooling device that is used in combination with the laser diode array. By stacking the high-power optical source a plurality of times, a powerful planar optical source is constructed. As each of the planar optical sources uses the cooling device formed of stacking of metal plates, the planar laser diode, in which a number of layer diode arrays are serially connected, shows a reduced serial resistance. By mounting such planar optical sources on a common base, it is possible to construct a powerful two-dimensional array of laser diodes.

Another object of the present invention is to provide a method of manufacturing a cooling device, said cooling device comprising a plurality of metal plates stacked upon each other to form a layered body, each of said metal plates being cooled, in said layered body, by a cooling medium, said method comprising the steps of:

forming a groove in each of said metal plates as a passage for said cooling medium, by a chemical etching process that uses a resist pattern.

According to the present invention, the metal plates forming the cooling device is formed with the passage for cooling medium by way of an ordinary chemical etching process. Thereby, the cost of the cooling device is reduced significantly. Particularly, as a result of use of the chemical etching process, a number of metal plates are processed simultaneously, and the cooling device of the present invention is suitable for mass production, contrary to the conventional cooling device, in which the metal plates are processed one by one by a laserbeam machining process.

Another object of the present invention is to provide a method of manufacturing a cooling device, comprising a layered body adapted for thermal contact with an object to be cooled, said layered body comprising: a first plate member of a metal, said first plate member having an inlet opening for a cooling medium; a first branched groove provided on a first side of said first plate member, said first branched groove having a first end in communication with said inlet opening and a plurality branches each in communication with said first end, each of said plurality of branches having a second end opposite to said first end, said first branched groove thereby transporting therethrough cooling medium from said first end to each of said second ends; a second plate member of a metal provided on said first side of said first plate member; a plurality of apertures provided on said second plate member respectively in correspondence to said second ends of said branches, each of said apertures being isolated from each other and allowing passage of said cooling medium therethrough; a third plate member of a metal provided on said second plate member at a side of said second plate member opposite to a side facing said first plate member, said third plate member having an outlet opening for said cooling medium; and a second branched groove provided on said third plate member at a side thereof facing said second plate member, said second branched groove having a third end in communication with said outlet opening and a plurality branches each in communication with said third end, each of said plurality of branches having a fourth end opposite to said third end, said second branched groove thereby transporting therethrough said cooling medium from said plurality of fourth ends to said third end; said plurality of fourth ends of said second branched groove corresponding to said plurality of apertures, respectively; said method comprising the steps of:

stacking a first metal sheet, a second metal sheet and a third metal sheet consecutively, said first metal sheet including therein a plurality of said first plate members in a row and column formation, said second metal sheet including therein a plurality of said second plate members in a row and column formation, said third metal sheet including therein a plurality of said third plate members in a row and column formation, to form a metal sheet stack;

said step of stacking being conducted such that each of said apertures of a second plate member included in said second metal sheet aligns with a corresponding second end of said first groove of a first plate member included in said first metal sheet, and such that each of said apertures of a second plate member included in said second metal sheet aligns with a corresponding second end of said second groove of a third plate member included in said first metal sheet; and cutting said metal sheet stack to form a plurality of said layered bodies each forming said cooling device.

According to the present invention, the cooling devices are mass-produced with a low cost.

Another object of the present invention is to provide a linear optical source, comprising:

a cooling device formed of a layered body of metal plate members stacked each other, said layered body including a first coolant passage to which a cooling medium is supplied, a second coolant passage from which said cooling medium is discharged, and a third coolant passage interconnecting said first and second coolant passages;

a light emitting array provided on said cooling device, said light emitting array having a first electrode of a first polarity and connected to said cooling device and a second electrode of a second, opposite polarity;

a conductor plate provided on a top surface of said cooling device in electrical insulation therefrom, said conductor plate having an opening exposing said first and second coolant passages of said layered body;

an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages.

Another object of the present invention is to provide a planar optical source, comprising a plurality of linear optical sources stacked upon each other, each of said linear optical sources comprising:

a cooling device formed of a layered body of metal plate members stacked upon each other, said layered body including a first coolant passage to which a cooling medium is supplied, a second coolant passage from which said cooling medium is discharged, and a third coolant passage interconnecting said first and second coolant passages;

a light emitting array provided on said cooling device, said light emitting array having a first electrode of a first polarity and connected to said cooling device and a second electrode of a second, opposite polarity;

a conductor plate provided on a top surface of said cooling device in electrical insulation therefrom, said conductor plate having an opening exposing said first and second coolant passages of said layered body;

an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages;

said plurality of linear optical sources being stacked such that a first coolant passage of a linear optical source is aligned with a first coolant passage of an adjacent linear optical source and such that a second coolant passage of a linear optical source is aligned with a second coolant passage of an adjacent linear optical source.

Another object of the present invention is to provide a method of manufacturing a linear optical source, said linear optical source comprising: a cooling device formed of a layered body of metal plate members stacked with each other, said layered body including a first coolant passage to which a cooling medium is supplied, a second coolant passage from which said cooling medium is discharged, and a third coolant passage interconnecting said first and second coolant passages; a light emitting array provided on said cooling device, said light emitting array having a first electrode of a first polarity and connected to said cooling device and a second electrode of a second, opposite polarity; a conductor plate provided on a top surface of said cooling device in electrical insulation therefrom, said conductor plate having an opening exposing said first and second coolant passages of said layered body; an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages, said method comprising the steps of:

providing a double-sided thermoset adhesive film on said top surface of said cooling device in conformity with s shape of said conductor plate; and adhering said conductor plate on said double-sided thermoset adhesive film.

Another object of the present invention is to provide a method of fabricating a planar optical source, said planar optical source comprising: a plurality of linear optical sources stacked upon each other, each of said linear optical sources comprising: a cooling device formed of a layered body of metal plate members stacked upon each other, said layered body including a first coolant passage to which a cooling medium is supplied, a second coolant passage from which said cooling medium is discharged, and a third coolant passage interconnecting said first and second coolant passages; a light emitting array provided on said cooling device, said light emitting array having a first electrode of a first polarity and connected to said cooling device and a second electrode of a second, opposite polarity; a conductor plate provided on a top surface of said cooling device in electrical insulation therefrom, said conductor plate having an opening exposing said first and second coolant passages of said layered body; an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages; said plurality of linear optical sources being stacked such that a first coolant passage of a linear optical source is aligned with a first coolant passage of an adjacent linear optical source and such that a second coolant passage of a linear optical source is aligned with a second coolant passage of an adjacent linear optical source; said method comprising, in each of said plurality of linear optical sources, the steps of:

providing a double-sided thermoset adhesive film on said top surface of said cooling device in conformity with s shape of said conductor plate; and adhering said conductor plate on said double-sided thermoset adhesive film.

Another object of the present invention is to provide a method of manufacturing a planar optical source, said planar optical source comprising: a plurality of linear optical sources stacked upon each other, each of said linear optical sources comprising: a cooling device formed of a layered body of metal plate members stacked upon each other, said layered body including a first coolant passage to which a cooling medium is supplied, a second coolant passage from which said cooling medium is discharged, and a third coolant passage interconnecting said first and second coolant passages; and a light emitting array provided on said cooling device, said light emitting array having a first electrode of a first polarity connected to said cooling device and a second electrode of a second, opposite polarity; a conductor plate provided on a top surface of said cooling device in electrical insulation therefrom, said conductor plate having an opening exposing said first and second coolant passages of said layered body; an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages; said plurality of linear optical sources being stacked such that a first coolant passage of a linear optical source is aligned with a first coolant passage of an adjacent linear optical source and such that a second coolant passage of a linear optical source is aligned with a second coolant passage of an adjacent linear optical source; a spacer being disposed between a first linear optical source and a second linear optical source provided right upon said first linear optical source, such that a bottom surface of said spacer engages with said conductor plate on said first linear optical source intimately and a top surface of said spacer engages with a bottom surface of said cooling device of said second linear optical source intimately, said spacer comprising a conductive spacer plate and an elastic spacer member provided on said conductive spacer plate, said conductive spacer plate having a third opening in alignment with said first coolant passages of said first and second linear optical sources and a fourth opening in alignment with said second coolant passages of said first and second linear optical sources, said conductive spacer plate carrying a depression in which said elastic spacer member is seated; said method comprising, in each of said plurality of linear optical sources, the step of:

forming said conductor plate and said spacer conductor plate by a chemical etching process that uses a resist pattern.

According to the present invention, a planar optical source or a linear optical source suitable for constructing a planar optical source is obtained with a reduced cost and also with a reduced serial resistance. By providing the elastic body in such a manner that the elastic body is fitted into the opening surrounding the first and second coolant passages, the deformation of the elastic body by the pressure of the cooling medium is minimized even when the number of stacks is increased, and the problem of leakage of the cooling medium is successfully eliminated.

Other objects and further features of the present invention will become apparent from the following detailed description when read in conjunction with the attached drawings.

BRIEF DESCRIPTION OF THE DRAWINGS

FIGS. 4A–4C are views showing the construction of a cooling device according to a first embodiment of the present invention in an exploded manner and FIG. 4D is an oblique view of the device;

FIGS. 24A and 24B are views showing a further modification of the thirteenth embodiment;

FIGS. 34A and 34B are views showing a further modification of the seventeenth embodiment;

DETAILED DESCRIPTION OF THE PREFERRED EMBODIMENTS

[Principle]

Figure 1:
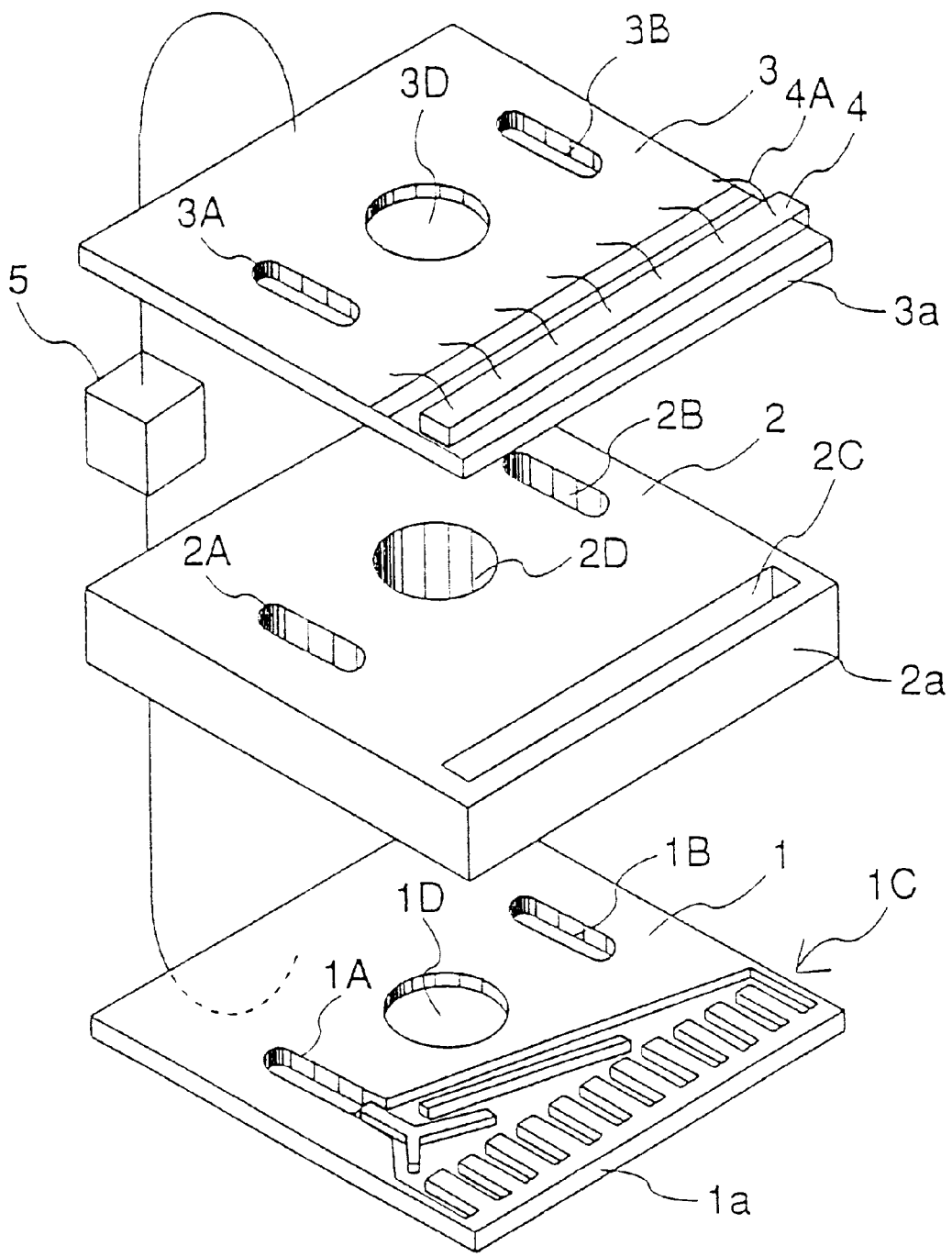
FIG. 1 is a view showing the construction of a conventional cooling device for cooling a laser diode array.
Figure 2A:
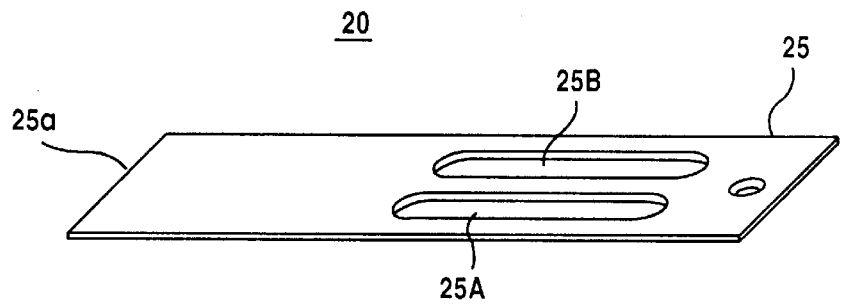
FIGS. 2A–2E are views showing the construction of another conventional cooling device.
Figure 2B:
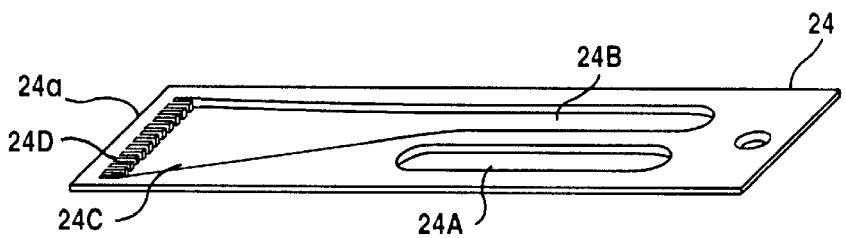
Figure 2C:
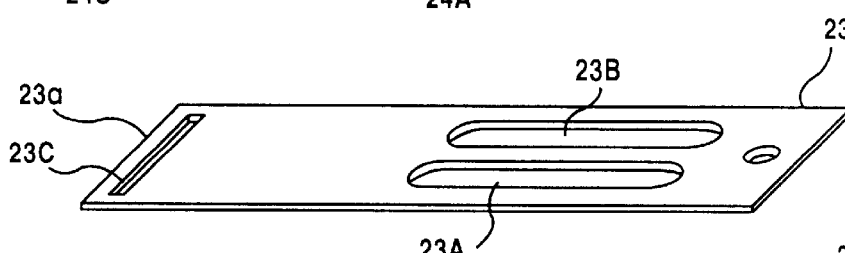
Figure 2D:
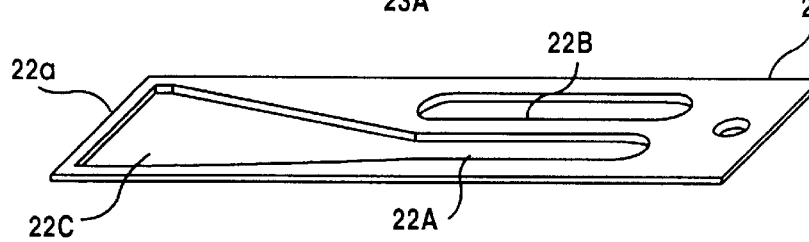
Figure 2E:
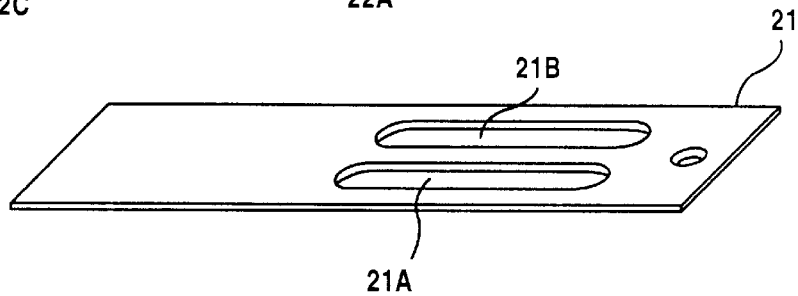
Figure 3:
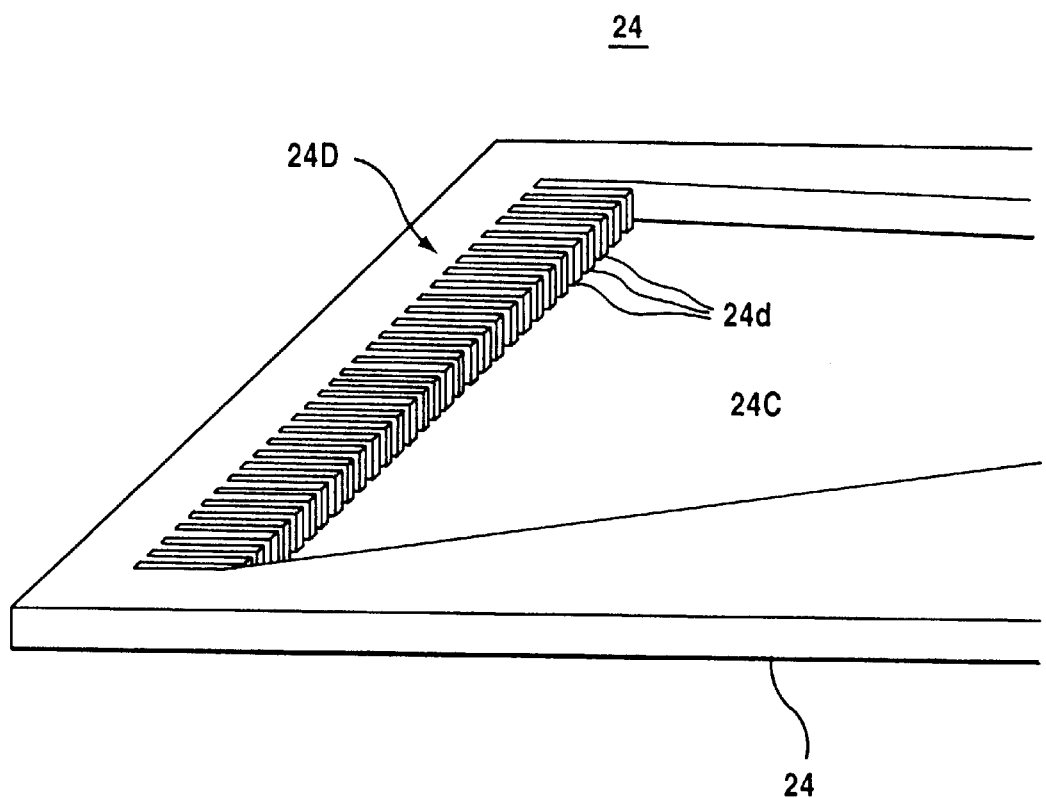
FIG. 3 is a view showing a part of the cooling device of FIGS. 2A–2E in an enlarged scale.

First, the principle of the present invention will be explained.

As noted already, the present invention provides a cooling device formed of a layered body of plate members, wherein the layered body includes: a first plate member of a metal formed with an inlet opening for introducing a cooling medium; a first branched groove provided on a first side of the first plate member such that the first branched groove has a first end in communication with the inlet opening and a plurality branches each in communication with the foregoing first end, each of the plurality of branches having a second, opposite end and the first branched groove thereby transporting therethrough the cooling medium from the first end to each of the second ends; a second plate member of a metal provided on the foregoing first side of the first plate member; a plurality of apertures provided in the second plate member respectively in correspondence to the second ends of the foregoing branches such that each of the apertures is isolated from other apertures and allowing a passage of said cooling medium therethrough; a third plate member of a metal provided on the second plate member at a side opposite to the side of the second plate member facing the first plate member and having an outlet opening for discharging the cooling medium; and a second branched groove provided on the third plate member at a side thereof facing the second plate member such that the second branched groove has a third end in communication with the outlet opening and a plurality branches each in communication with the foregoing third end and having a fourth end opposite to the third end, the second branched groove thereby transporting the cooling medium therethrough from the plurality of fourth ends to the third end; wherein the plurality of fourth ends of the second branched groove correspond to the plurality of apertures, respectively. The layered body forming the cooling device may include, in addition to the first, second and third metal plate members, additional plate members.

Thus, in the present invention, the plate members, particularly the first and third plate members are formed with a branched groove pattern as a passage of the cooling medium, and the cooling device thus including the passage of the cooling medium therein shows a very high efficiency of cooling. Particularly, the cooling device achieves an efficient heat transport from the front edge part of the second plate member to the rest of the layered body including the remaining part of the second plate member, by providing the passage of the cooling medium in the form of isolated apertures rather than in the form of a continuous slot, as is practiced in the conventional cooling device. In the conventional cooling device, such a continuous slot interrupts the heat transportation path from the front edge part of the second plate member as noted already. In the case of the present invention, the heat, conducted to the front edge part of the second plate member from a heat source such as a laser diode array through the third plate member, readily escapes to the remaining part of the second plate member via the bridging ribs that define the apertures.

Further, it should be noted that the plate members are engaged with each other intimately at the ridges that define a groove at both lateral sides of the groove. Thereby, the heat is transported readily from one plate member to the adjacent plate member through the ridges. Further, the heat is conducted within the same plate member efficiently along the ridges. Thereby, the cooling device formed of the metal plate members acts as a thermally integral body, and the thermal resistance of the cooling device having such a structure is effectively minimized.

When the cooling device, thus formed of a stacking of metal plate members, is used to form a planar optical source by stacking the cooling devices upon each other in a state that each cooling device carries a laser diode array, the serial resistance of the laser diode array is reduced substantially.

In addition, it should be noted that the cooling device of the present invention is mechanically rigid and stable due to the fact that the ridges defining the grooves in a plate member are engaged intimately to an adjacent plate member. Thereby, the problem of formation of a large void in the layered structure as in the case of the cooling device of FIGS. 2A–2E, in which the opening 22C or 23C forms such a void, is successfully avoided. As the layered body forming the cooling device is mechanically stable, the grooves formed inside the layered body as the passage of the cooling medium are immune to the problem of collapsing, even in the case the metal plate members are tightly stacked. In relation to this, the present invention is also advantageous for eliminating the problem of deformation of the apertures in the second plate member due to the formation of the ribs that define the apertures. Thus, the cooling device of the present invention allows a tightening of the layered body without causing the problem of collapse of the cooling medium path in the layered body, and the problem of leakage of the cooling medium, which is pertinent to the conventional cooling devices due to the insufficient tightening of the plate members, is successfully eliminated.

Another advantageous point of the present invention is that, because of the significantly reduced thermal resistance of the cooling device, there is no longer a need of formation of expensive micro-channels, which typically require a photolithographic process of a semiconductor substrate or a laser beam machining. The grooves are merely formed by a conventional chemical etching process. Thereby the fabrication cost of the cooling device is significantly reduced. Further, in relation to the relatively large cross sectional area of the grooves in the cooling device of the present invention, the maintenance of the cooling device is substantially facilitated.

In the event it is desired to increase the efficiency of cooling of the cooling device further, it is possible to induce a turbulent flow in the cooling medium flowing through the grooves in the cooling device. Such a turbulent flow may be induced by changing the pitch of the grooves or the apertures or by forming the grooves in a zig-zag form. Alternatively, the grooves may be formed with projections and depressions. Thereby, the decrease of efficiency of cooling, caused by avoiding the use of micro-channels, is effectively compensated for by the turbulent flow of the cooling medium.

In addition, it should be noted that the cooling device of the present invention allows a free designing of the patterns of the grooves, which are formed by a chemical etching process. This is a major advantage over the prior art in which the grooves are formed on a Si substrate by a wet etching process. Thus, it is possible to form the grooves such that a groove is branched into a plurality of branches and such that each of the plurality of branches is further branched into a plurality of sub-branches. By forming such branched grooves on the plate members, it is possible to supply the cooling medium stably and uniformly to the region in the vicinity of the laser diode array, via the branched grooves. Thus, the present invention successfully eliminates the problem of unreliable or non-uniform supply of the cooling medium, which occurs in the conventional cooling device of the type of FIGS. 2A–2E, that has the large opening 22C or 23c as a common cooling water passage.

In the present invention, it should further be noted that the first and the third plate members, as well as further additional plate members, may be formed of a common plate member carrying the same groove pattern. Thereby, the plate members are easily mass-produced and the cost of the cooling device is reduced substantially. Particularly, the cost of the cooling device is reduced significantly by forming the plate member simultaneously and in plural numbers. Further, by using the same metal for all of the plate members, the problem of electro-corrosion of the plate members is successfully avoided.

When applying the cooling device for cooling a laser diode array, it is advantageous to provide a rigid heat sink on the third plate member that forms the uppermost layer of layered cooling device, such that the heat sink has a thermal expansion coefficient close to the thermal expansion coefficient of a semiconductor substrate forming the laser diode array. By mounting the laser diode array on such a heat sink, it is possible to minimize the mechanical deformation of the laser diode array. Further, in order to avoid the bi-metal deformation of the heat sink, it is advantageous to provide a metal piece identical to the material forming the heat sink also on the first plate member with a symmetrical relationship to the heat sink.

In the present invention, it is possible to construct a planer optical source by stacking a number of linear optical sources each including a cooling device and a laser diode array provided thereon. Thereby, the serial resistance of the planar optical source thus formed is minimized by providing, in each of the linear optical sources, a conductor plate in electrical contact with a non-ground electrode of the laser diode array but with an electrically insulated state from the cooling device and by stacking the linear optical sources such that the conductor plate of an arbitrary selected first linear optical source engages intimately with a bottom of the cooling device of a second adjacent linear optical source right above the first linear optical source.

The conductor plate used in such a construction has to be formed with openings corresponding to the inlet and outlet openings of the cooling device, while it should be noted that the formation of such openings is achieved easily with a very low cost by a conventional chemical etching process that uses a resist pattern.

In the foregoing construction of the cooling device that uses the conductor plate, it is advantageous to form a depression in the conductor plate so as to surround the foregoing openings and provide a rubber sheet having corresponding openings on such a depression. By setting the thickness of the rubber sheet to be slightly larger than the depth of the depression, the rubber sheet tightly seals the openings when the linear optical sources are stacked with each other, and the problem of leakage of the cooling medium is successfully avoided. As the rubber sheet is held tightly in the depression, no substantial deformation occurs in the rubber sheet even when the pressure of the cooling medium is increased. The foregoing feature is applicable also when the linear optical sources are stacked upon intervening spacer plates.

Further, it should be noted that the assembling of the planar optical source by stacking the linear optical sources is substantially facilitated by using a guide structure. As the planar optical source thus formed has an advantageous feature in that the vertical separation between the adjacent linear optical sources is determined exactly. Thus, the planar optical source allows the use of a lens array in which a number of lens bars are integrated, for converting the optical beams produced by the laser diode array into parallel optical beams.

[First Embodiment]

FIGS. 4A–4C show the construction of a cooling device 30 of an optical source according to a first embodiment of the present invention in an exploded view, while FIG. 4D shows the assembled cooling device 30 in an oblique view.

Referring to FIGS. 4A–4C, the cooling device 30 is formed of a stacking of metal plate members 31–33 having a high thermal conductivity, typically about 1.5 W/cm·K or more. For example, the metal plate members 31–33 may be formed of Cu or a Cu-alloy. It will be seen that the plate members 31–33 are formed with inlet openings 31A, 32A and 33A for cooling water and outlet openings 31B, 32B and 33B for the cooling water, respectively.

Each of the plate members 31–33 has a thickness of typically 250 $\mu$m, wherein the plate member 31 carries, on a top surface thereof, a number of parallel grooves 31C along a front edge 31a thereof as a passage of the cooling water. In an example, the grooves 31C are formed with a pitch of 400–500 $\mu$m and each of the grooves 31C may have a width of about 300–350 $\mu$m and a depth of about 130 $\mu$m.

Each of the grooves 31C is defined laterally by ridges 31c (see the enlarged view of FIG. 5B), wherein the ridges 31c extend toward the cooling water inlet 31A. As a result, grooves 31D are formed as a continuation of the grooves 31C, wherein the grooves 31D are converged to each other toward the foregoing inlet 31A. Thus, the cooling water introduced at the inlet 31A is guided along the divergent grooves 31D and reach the grooves 31C adjacent to the foregoing front edge surface 31a.

The plate member 32 is stacked on the plate member 31 in a state indicated in FIG. 4D in which the openings 32A and 32B are aligned with the openings 31A and 31B of the first plate member respectively. Further, it should be noted that the plate member 32 further includes a plurality of apertures 32C along a front edge 32a thereof as a passage of the cooling water, wherein the apertures 32C are formed in correspondence to each of the grooves 31C on the plate member 31C. Through the apertures 32C, the cooling water in the grooves 31C reach the top side of the plate member 32.

On the top side of the plate member 32, the plate member 33 is provided as noted already, wherein it should be noted that the plate member 33 is a member identical to the plate member 31 expect that the member 33 is provided in a vertically turned-over state. Thus, the plate member 33 carries grooves similar to the grooves 31C and 31D on the bottom surface thereof. It should be noted that the grooves on the plate member 33 corresponding to the grooves 31D converge toward the outlet opening 33B, and thus, the cooling water that reaches the top side of the plate member 32 through the apertures 32C is guided to the outlet opening 33B along the grooves corresponding to the grooves 31C and 31D of the plate member 31.

Figure 5A:
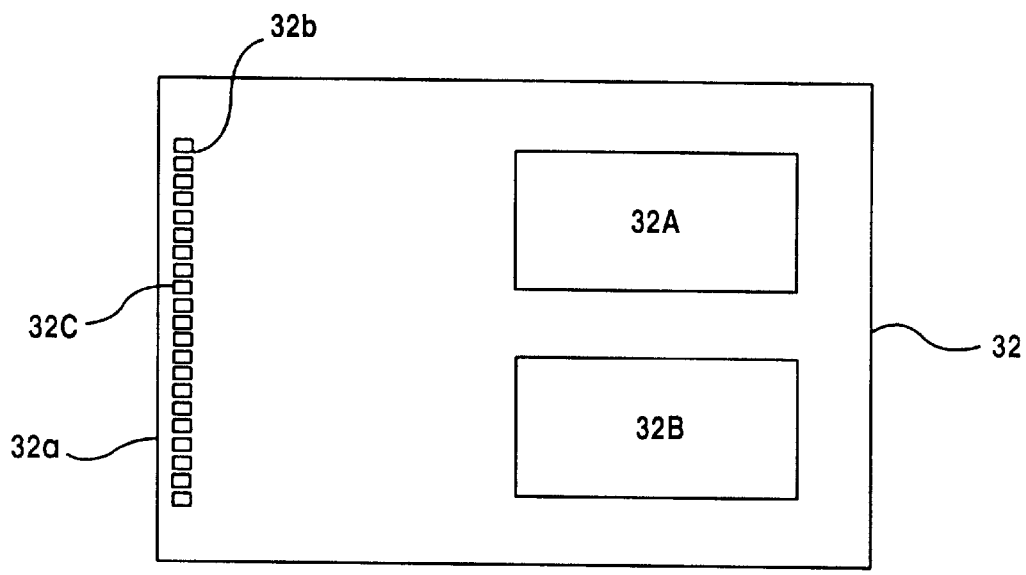
FIGS. 5A and 5B are views showing the construction of plate members used in the cooling device of the first embodiment.
Figure 5B:
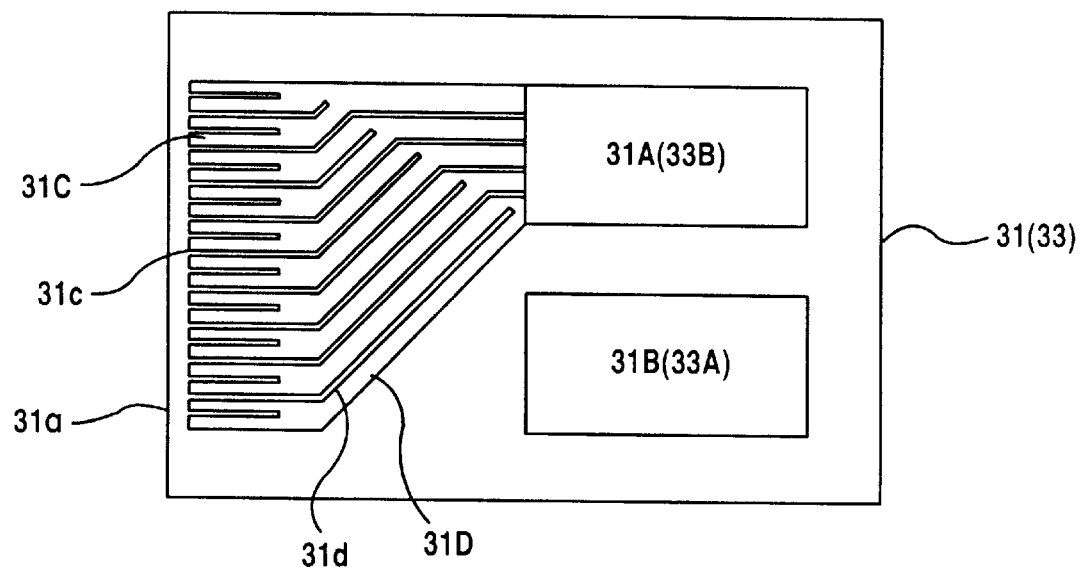

FIGS. 5A and 5B show the plate member 32 and 31 in a plan view.

Referring to FIG. 5A, it will be seen that each of the apertures 32C formed in the plate member 32 along the front edge 32a thereof is defined by bridging ribs 32b. In other words, the front edge region of the plate member 32 located at the side of the front edge 32a with respect to the apertures 32C, is connected mechanically as well as thermally to the part of the plate 32 located at the opposite side of the apertures 32C.

FIG. 5B shows the top surface of the plate member 31, wherein it should be noted that each of the parallel grooves 31C formed in the vicinity of the front edge 31a is defined by a pair of ridges 31c, wherein each of the ridges 31c may have a width of about 100–150 $\mu$m. Further, two of the grooves 31C merge into a single groove 31D, and the grooves 31D, which may have a similar construction and defined by a pair of ridges 31d, converge to the inlet opening 31A. As explained already, the grooves 31C and 31D of FIG.

5B, as well as the ridges 31c and 31d are formed also on the bottom surface of the plate member 33. Further, the construction FIG. 5B that forms the ridges 31c of the grooves 31D to continue further into the grooves 31C, is advantageous for avoiding excessive increase of the width of the groove 31C toward the groove 31D.

It should be noted that the openings 31A–33A, 31B–33B, apertures 32C and grooves 31C and 31D are easily formed by an ordinary chemical etching process that uses a resist pattern, without using an expensive facilities. On the other hand, the foregoing openings or grooves are difficult to form by a laser beam machining process used in the fabrication of the cooling device of FIGS. 2A–2E.

The plate members 31–33 are stacked and bonded to each other by a diffusion bonding process as will be described later, and the layered cooling device 30 is obtained as indicated in FIG. 4D, wherein it should be noted that the layered body forming the cooling device 30 includes therein passages of cooling water in the form of the grooves 1C and 1D. Further, the plate member 33 at the top part of the cooling device 30 carries a laser diode array 34 in which a plurality of edge-emission type laser diodes are integrated, along the front edge 33a thereof. In the layered body forming the cooling device 30, it should be noted that the plate member 32 engages both mechanically and thermally with the plate member 31 thereunder, via the ridges 31c and 31d that define the grooves 31C or 31D on the top surface of the plate member 31. Similarly, the plate member 32 engages mechanically and thermally with the plate member 33 thereabove via the similar ridges defining the similar grooves on the bottom surface of the plate member 33.

Thus, in the cooling device 30, the heat generated by the laser diode array 34 is conducted through the plate member 33 toward the inlet opening 33A or outlet opening 33B. Simultaneously, the heat is conducted to the adjacent plate member 32 via the ridges defining the grooves on the plate member 33. The heat that thus reaches the plate member 32 is then conducted to the inlet opening 32A or outlet opening 32B through the plate member 32 similarly to the plate member 33, wherein it should be noted that the construction of the present embodiment realizes an extremely efficient heat transfer from the front edge region of the plate member 32 including the front edge 32a to the rest of the plate member 32 in which the openings 32A and 32B are formed, via the bridging ribs 32c that define the apertures 32C. It should be noted that most of the heat produced by the laser diode array 34 is conducted to the foregoing front edge region of the plate member 32 via the front edge region of the plate member 33.

The heat that thus reaches the plate member 32 is then conducted to the plate member 31 via the ridges 31c or 31d defining the grooves 31C or 31D, wherein the heat that thus reaches the plate member 31 is then conducted therethrough to the inlet opening 31A or outlet opening 31B efficiently. Thereby, the conduction of heat occurs in the plate member 31 or 33 particularly efficiently along the ridges defining the grooves. Thus, the cooling device 30 is formed to have a very small thermal resistance, without forming a microchannel structure for the grooves 31C.

Thus, the layered body of the cooling device 30 forms a thermally integral body and the heat generated by the laser diode array 34 is conducted through the cooling device 30 three-dimensionally and removed by the cooling water in the cooling water running through the cooling device 30 three-dimensionally along the water passages.

Further, the layered cooling device 30 in which the plate members 31–33 are mechanically engaged with each other by the ridges 31c or 31d, is substantially free from a large void corresponding to the large opening 22C or 24C shown in FIGS. 2A–2E. It should be noted that the width of the grooves in the plate members of the present embodiment is in the order of 100–200 μm at best. Thus, the cooling device 30 is substantially free from the problem of collapsing of the water passage even when the plate members 31–33 are urged tightly with each other. As the plate members 31–33 can be urged tightly without causing the problem of collapsing of the wager passages, the cooling device 30 of the present embodiment is substantially free from the problem of water leakage. In relation to this feature, it should be noted that the bridging ribs 32c defining the apertures 32C in the plate member 32 not only contribute to the heat conduction but also resist the mechanical deformation of the front edge region of the plate member 32.

As the same plate member can be used for the plate member 31 and the plate member 33, the cost of the cooling device 30 can be reduced further.

[Second Embodiment]

Figures 6A, 6B, 6C, 6D, 6E, 6F, 6G, 6H:
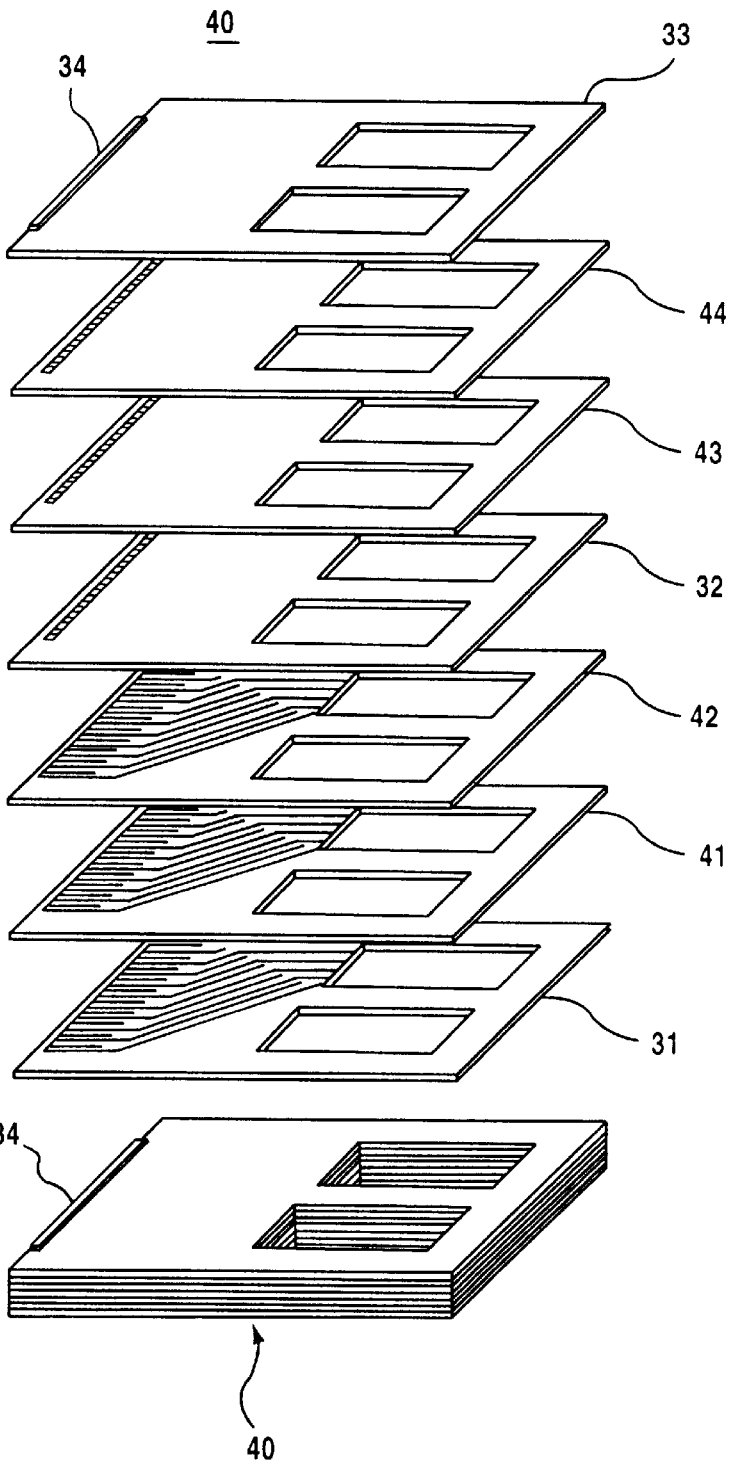
FIGS. 6A–6H are views showing the construction of a cooling device according to a second embodiment of the present invention in an exploded manner.

FIGS. 6A–6G are views showing the construction of a cooling device 40 of an optical source according to a second embodiment of the present invention, while FIG. 6H is an oblique view showing the cooling device 40 including the optical source in an assembled state. In FIGS. 6A–6H, those parts corresponding to the parts described previously are designated by the same reference numerals and the description thereof will be omitted.

Referring to FIGS. 6A–6G, the present embodiment uses additional plate members 41 and 42, both made of Cu or Cu-alloy, such as a CuMo alloy, between the plate member 31 and the plate member 32. Further, additional plate members 43 and 44, both made of Cu or Cu-alloy, are provided between the plate members 32 and 33. Otherwise, the cooling device 40 has a construction similar to that of the cooling device 30 of FIGS. 4A–4D.

Figure 7A:
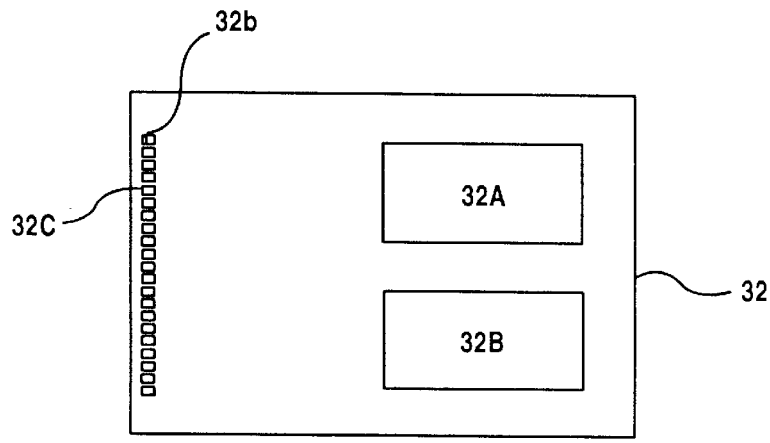
FIGS. 7A–7C are views showing the construction of plate members forming the cooling device of the second embodiment.
Figure 7B:
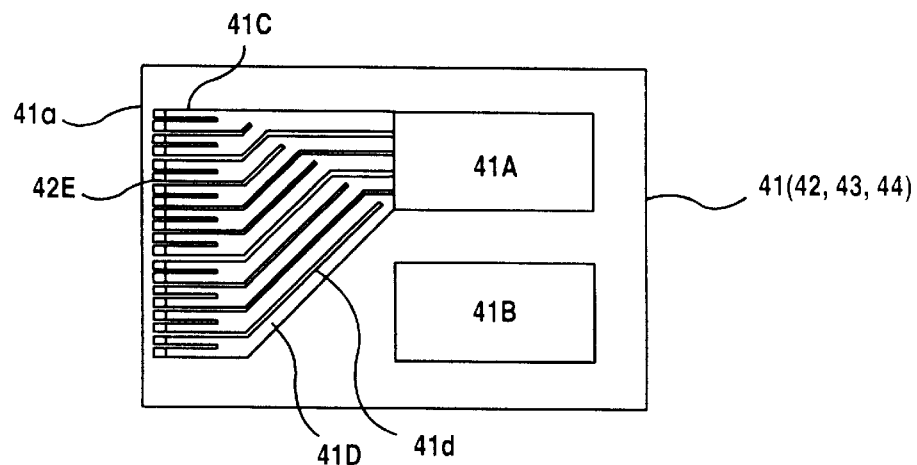
Figure 7C:
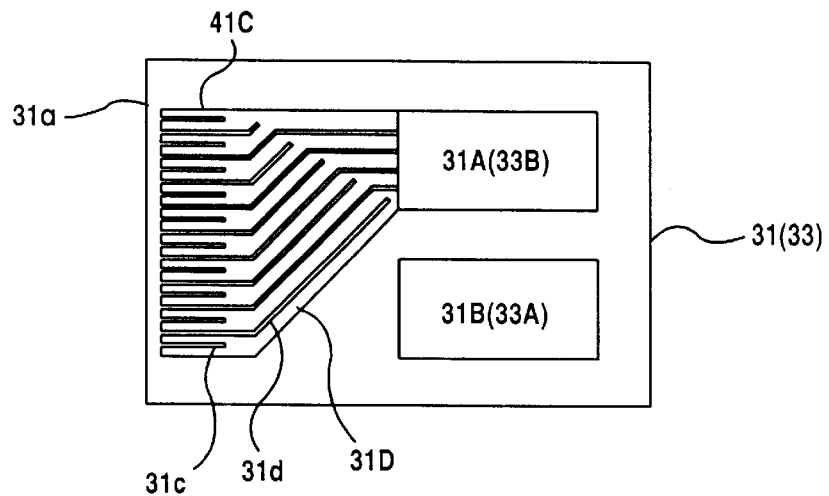

FIGS. 7A–7C show the plate members forming the cooling device 40 in detail, wherein FIG. 7A shows the same plate member 32 described previously with reference to FIG. 5A. Further, FIG. 7C shows the same plate member 31 or 33 described with reference to FIG. 5B.

On the other hand, FIG. 7B shows the construction of the plate members 41–44 shown in FIGS. 6B and 6C or FIGS. 6E and 6F, wherein the plate members 41–44 have the same construction. Thus, only the plate member 41 is described hereinafter with reference to FIG. 7B and the description of the plate members 42–44 will be omitted.

Referring to FIG. 7B, the plate member 41 is formed with a cooling water inlet 41A and a cooling water outlet 41B, respectively, in correspondence to the cooling water inlet 31A and the cooling water inlet 31B of the plate member 31. Further, grooves 41D extend from the cooling water inlet 41A with size and shape identical to those of the grooves 31D on the plate member 31. Each of the grooves 41D is defined by a pair of ridges 41d and continues to a groove 41C defined by a pair of ridges 41c. The grooves 41C have respective sizes and shapes identical to those of the grooves 31C on the plate member 31. Further, the plate member 41 is formed with a plurality of apertures 41E along a front edge 41a thereof in correspondence to the grooves 41C, respectively.

In the layered body of FIG. 6H forming the cooling device 40, the plate member 41 is stacked on the plate member 31, and the plate member 42, identical to the plate member 41, is stacked further on the plate member 41. On the plate member 42, the plate member 32 is stacked, and the plate member 43, which is a plate member identical in construction to the plate member 41, is stacked on the plate member 32 in a turned over state. Further, the plate member 44, identical in construction to the plate member 43, is stacked on the plate member 43 also in a turned over state. Further, the plate member 33 is stacked on the plate member 44 similarly to the previous embodiment.

In the cooling device 40 of the present embodiment, the cooling water is supplied not only to the plate member 31 but also to the plate members 41 and 42, wherein the cooling water thus supplied to the cooling device 40 is discharged not only from the plate member 33 but also from the plate members 43 and 44. Thus, the amount of the cooling water running through the cooling device 40 is increased in the present embodiment. Further, the area of contact of the cooling device 40 to the cooling water is also increased. Thereby, the efficiency of cooling is improved substantially. In the cooling device 40, the plate members 41–44 engage with the plate members 31–33 at the ridges 41c or 41d defining the grooves 41C or 41D or similar corresponding ridges, and the layered body forming the cooling device 40 forms a thermally integral body having a large heat capacity.

Similarly to the cooling device 30 described previously, the cooling device 40 is free from a large void in the layered structure thereof, and the problem of collapse of the grooves forming the cooling water passage in the layered body does not occur even when the plate members are tightly urged for preventing leakage of the cooling water.

By forming the cooling device 40 by using a single metal, the problem of electro-corrosion of the metal, which occurs when metal plates of different compositions are contacted, is successfully avoided. The grooves on the plate members 41–44 can be formed easily with a low cost by a chemical etching process, similarly to the plate members 31–33.

In the cooling device 40, it should be noted that the plate members 41 and 42 may be omitted without problem. Alternatively, the plate members 43 and 44 may be omitted.

[Third Embodiment]

In the cooling device 30 or 40 described heretofore, it should be noted that the grooves are formed by a chemical etching process, and thus, no micro-channels are formed. This means that the cooling device 30 or 40 allows formation of a boundary layer in the cooling water along the wall of the grooves. When such a boundary layer is formed, the efficiency of heat exchange at the groove wall tends to deteriorate.

In the cooling device 30 or 40, such a deterioration of the efficiency of heat exchange is successfully overcome by constructing the layered body of the cooling device such that the plate members forming the cooling device contact each other intimately at the ridges of the grooves. The layered body of the cooling device 30 or 40 forms a thermally integral body as noted before. In the present embodiment, the formation of the boundary layer is suppressed by improving the form of the grooves, without using the micro-channel structure. As a result, the cooling device of the present embodiment has a further improved cooling efficiency.

Figure 8A:
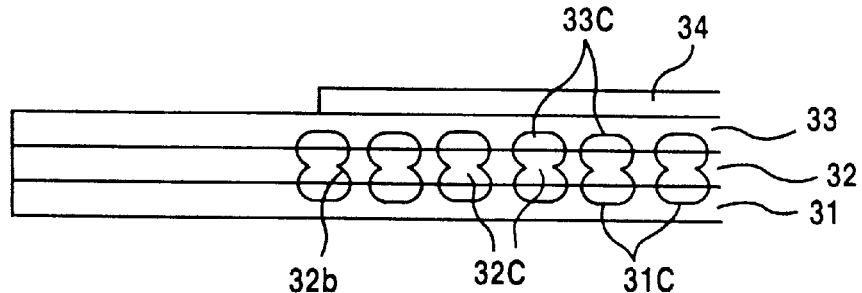
FIGS. 8A–8C are views showing various modifications of a cooling device according to a third embodiment of the present invention.

FIG. 8A shows the cross-section of the cooling device 30 taken along the row of apertures 32C.

Referring to FIG. 8A, it should be noted that the apertures 32C, each having a size generally equal to the width of the grooves 31C, are formed in the plate member 32 in correspondence to the grooves 31C on the plate member 31, with a pitch identical to the pitch of the grooves 31C. Further, the plate member 33 is formed with the grooves 31C in correspondence to the apertures 32C of the plate members 32 with a size generally equal to the size of the apertures 32C and with a pitch equal to the pitch of the apertures 32C.

In such a construction, the flow of the cooling water is determined uniquely by the grooves and the apertures and there is no stagnation of the cooling water in the passage thereof. In other words, the cooling water flows uniformly through the cooling device 30 when the construction of FIG. 8A is used in the device 30. In the construction of FIG. 8A, it should be noted that the apertures 32C, formed by a chemical etching process proceeding from both sides of the plate member, include sharp projections on the side walls of the bridging ribs 32b, while such sharp projections cause a turbulence in the cooling water flowing through the apertures 32C. Thereby, the formation of the boundary layer in the apertures is effectively suppressed.

Figure 8B:
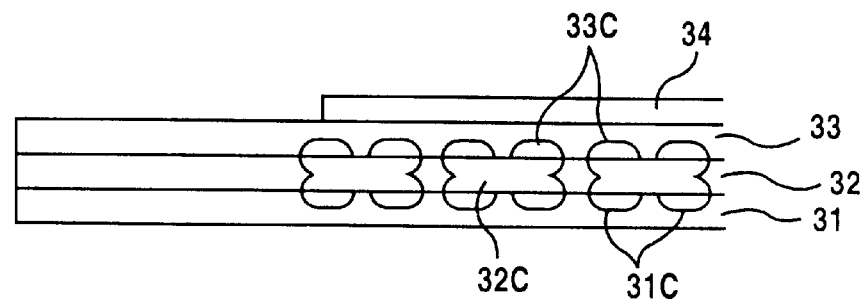

In the construction of FIG. 8B, a pair of adjacent apertures 32C in the construction of FIG. 8A are formed in continuation, and as a result, the cooling water supplied from a groove 31C corresponding to the aperture 32C and the cooling water supplied from an adjacent groove 31C and corresponding also to the aperture 32C are mixed in the aperture 32C. The cooling water thus mixed in the aperture 32C is then divided into a pair of flows corresponding to a pair of grooves 33C corresponding to the aperture 32C. Thereby, the cooling water is supplied uniformly in the longitudinal direction of the laser diode array 34, without causing stagnation. The construction of FIG. 8B causes a turbulent flow in the cooling water each time when the cooling water is mixed and divided in the apertures 32C. Thereby, the problem of decrease of the cooling efficiency due to the formation of boundary layer in the grooves 33C is effectively eliminated.

Figure 8C:
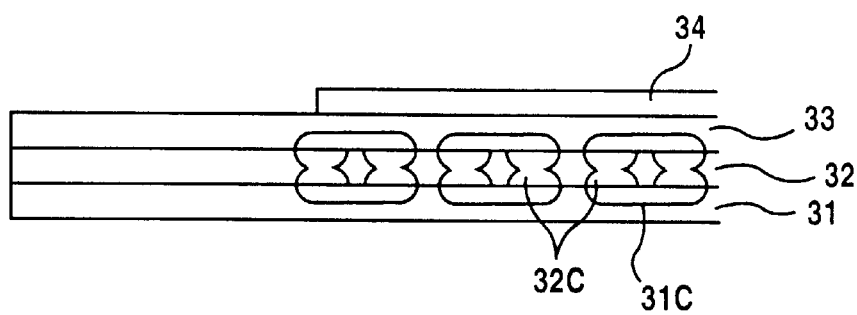

In the construction of FIG. 8C, a single flow of the cooling water from a single groove 31C is divided into a pair of flows by a pair of apertures 32C in the plate member 32, while the foregoing two flows are merged again in a single groove 33C of the plate member 33. In the construction, too, the laser diode array is cooled uniformly in the longitudinal direction thereof. Further, the construction of FIG. 8C induces a turbulent flow in the cooling water similarly to the construction of FIG. 8B and the problem of decrease of cooling efficiency by the formation of the boundary layer is effectively eliminated.

Figure 9A:
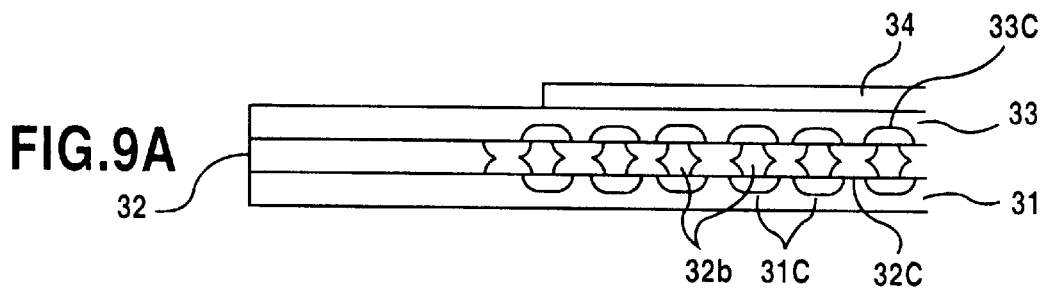
FIGS. 9A–9C are views showing further modifications of the cooling device of the third embodiment.

FIG. 9A shows another construction for inducing a turbulent flow in the cooling water.

Referring to FIG. 9A, each of the apertures 32 in the plate member 32 is displaced with respect to a corresponding groove 31C in the plate member 31 in the elongating direction of the laser diode array 34 by half pitch. Further, each of the grooves 33C in the plate member 33 is displaced with respect to a corresponding aperture 32C in the plate member 32 similarly. As a result, the cooling water in a groove 31C is divided right and left when entering into a pair of adjacent apertures 32C by the bridging rib 32b separating the foregoing adjacent apertures 32C. Thereby, a turbulent flow is induced in the cooling water, while the turbulent cooling water flow thus formed is enhanced further when the cooling water flow is again divided when entering to corresponding groove pairs 33C in the plate member 33.

Figure 9B:
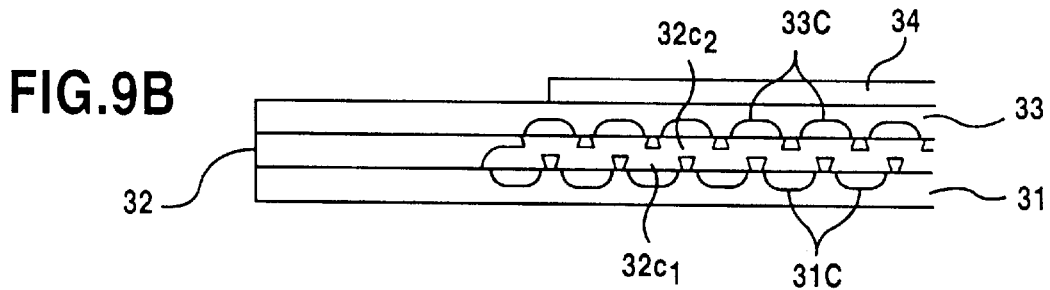
Figure 9C:
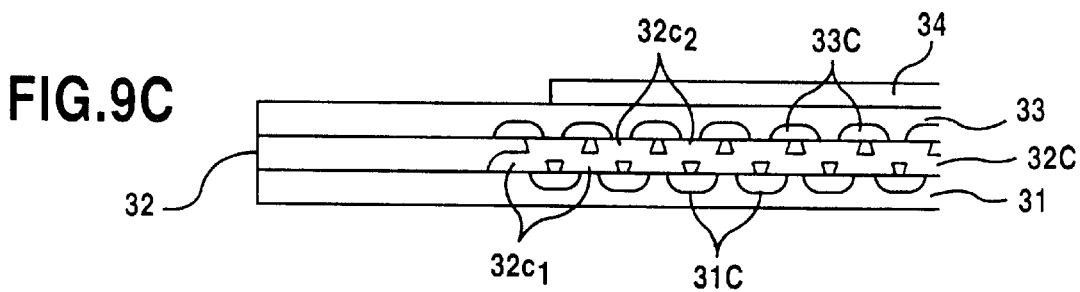

FIGS. 9B and 9C show the constructions that achieve a similar effect.

In the construction of FIG. 9B, the apertures 32C of FIG. 9A are each formed of a lower part $32C_1$ and an upper part $32C_2$ communicating with each other, wherein the apertures 32C form a continuous elongating opening extending in the elongating direction of the laser diode array 34. Thereby, the lower part $32C_1$ is aligned to a corresponding groove 31C of the plate member 31, while the upper part $32C_2$ is aligned to a corresponding groove 33C in the plate member 33. As a result, a groove 31C in the plate member 31 and a corresponding groove 33C in the plate member 33 are displaced by half pitch in the elongating direction of the laser diode array 34. In such a construction, the cooling liquid entered into the lower part $32C_1$ of an aperture 32C experiences a formation of turbulence when passing through a narrowed region to the upper part $32C_2$.

In the construction of FIG. 9C, it should be noted that the elongate continuous opening 32C of FIG. 9B is formed such that each of the lower parts $32C_1$ is displaced by half pitch with respect to a corresponding groove 31C in the elongating direction of the laser diode array 34C and such that each of the upper parts $32C_2$ is similarly displaced by half pitch with respect to a corresponding groove 33C. In the construction of FIG. 9C, the formation of the turbulence is further enhanced and an efficient cooling becomes possible without using a micro-channel. Particularly, the construction of FIG. 9C allows a substantial increase of contact area between the cooling water and the plate member 31 or 33.

[Fourth Embodiment]

Figure 10:
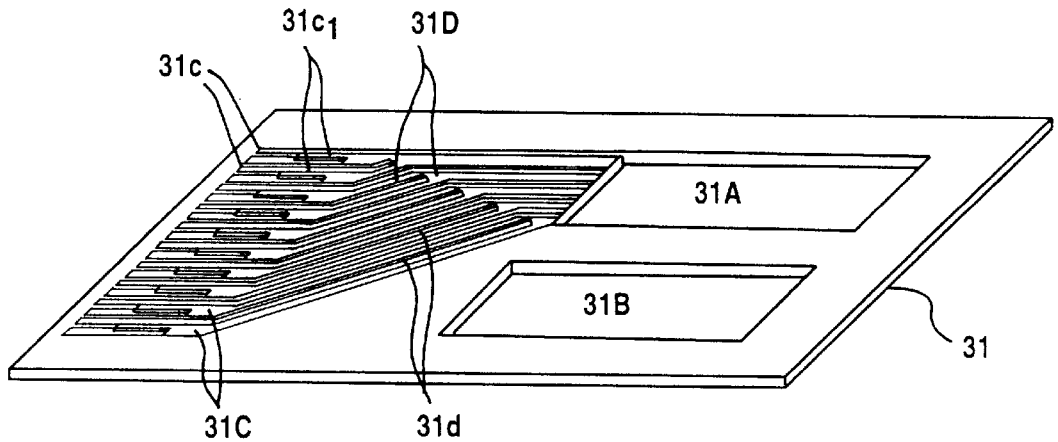
FIG. 10 is a view showing the construction of a plate member used in a cooling device according to a fourth embodiment of the present invention.

FIG. 10 shows the construction of the plate member 31 or 33 according to a fourth embodiment of the present invention, wherein only the plate member 31 will be described hereinafter as the plate member 33 is substantially identical to the plate member 31 except that the plate member 33 is used in a turned over state.

Referring to FIG. 10, some of the ridges 31c defining a groove 31C on the plate member 31 includes a low-profile part $31c_1$ having a reduced height, wherein the ridge 31c formed with the low-profile part $31c_1$ and the ridge 31c in which no such a low-profile part $31c_1$ is formed, are repeated alternately on the plate member 31. By forming the low-profile part $31c_1$, the area of the plate member 31 contacting the cooling water is increased. While the low-profile part $31c_1$ on the plate member 31 does not make a contact to the plate member 32 and thus does not provide a mechanical support to the plate member 32, the rigidity of the cooling device reduces little in the cooling device of the present embodiment in view of the fact that the ridge 31c including the low-profile part $31c_1$ is formed only alternately to the ridge 31c in which no such a low-profile part $31c_1$ is formed. Thus, the cooling device 30 or 40 formed by using the plate member 31 is immune to the problem of mechanical deformation even when the plate members are urged firmly.

Figure 11A:
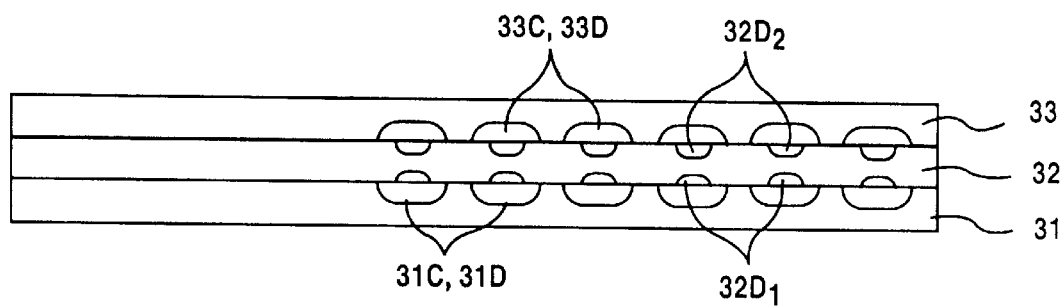
FIGS. 11A and 11B are views showing various modifications of the cooling device of the fourth embodiment.
Figure 11B:
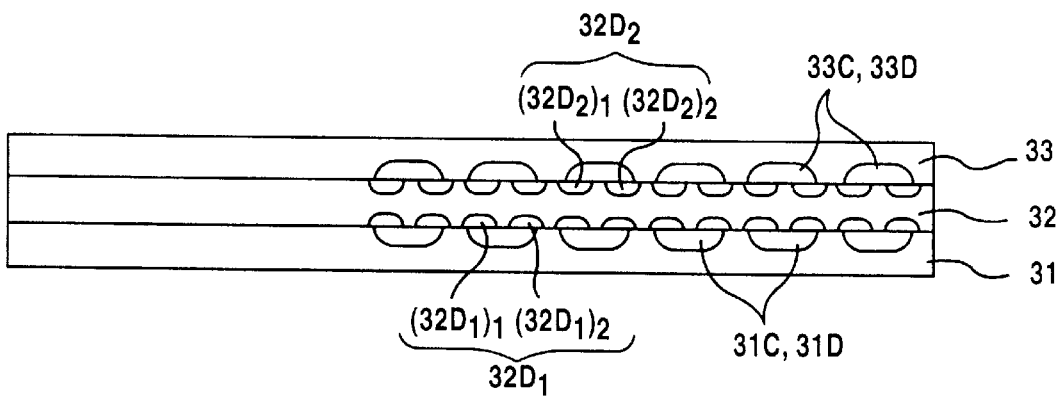

In order to increase the contact area of the cooling device 30 or 40 to the cooling water, the present embodiment further forms a shallow groove $32D_1$ on the bottom surface of the plate member 32 in correspondence to the grooves 31C and 31D of the plate member 31, as indicated in FIG. 11A. Similarly, a shallow groove $32D_2$ is formed on the top surface of the plate member 32 in correspondence to the grooves 33C and 33D on the plate member 33. Further, the foregoing grooves $32D_1$ and $32D_2$ may be divided into shallow grooves $(32D_1)_1$ and $(32D_1)_2$ or shallow grooves $(32D_2)_1$ and $(32D_2)_2$, as indicated in FIG. 11B.

[Fifth Embodiment]

Next, the fabrication process of the plate members used in the first through fourth embodiment will be described as a fifth embodiment of the present invention.

In the preceding embodiments of the present invention, the plate members 31 and 33 are formed of the same material. Further, the additional plate members 41–44 are all formed of the same material.

Figure 12A:
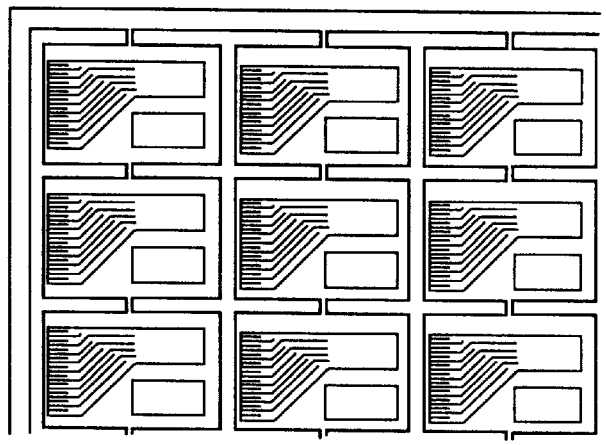
FIGS. 12A–12C are views showing the manufacturing process of a cooling device according to a fifth embodiment of the present invention.
Figure 12B:
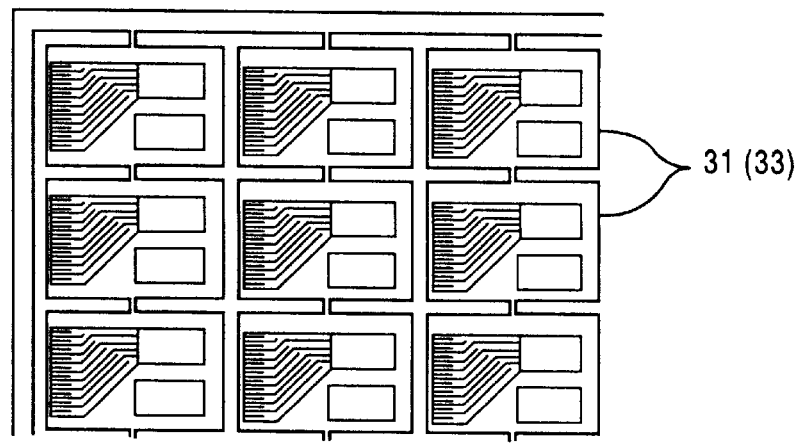

Thus, in the present invention, a single sheet of Cu or a Cu-alloy is provided with a mask pattern in the step of FIG. 12A, and the plate member 31 or 33 is formed with a large number in a chemical etching process conducted in the step of FIG. 12B. In FIG. 12B, the plate members 31 are formed in a mechanically interconnected state by a bridging part and arranged in a row and column formation. It should be noted that the masking process and the etching process used in the present embodiment are well established in the art of lead frame production. By changing the mask pattern, the plate member 32 can be formed also with a very large number. When forming the grooves, the chemical etching process is controlled such that the grooves formed as a result of the etching has a depth exceeding one-half the thickness of the plate member. When forming the apertures or openings such as the apertures 32C or the openings 31A and 31B, the chemical etching process is applied from both sides of the plate member.

Thus, the plate members 31–33 including the grooves, apertures and the openings are mass-produced. Similarly, the plate members 41–44 are mass-produced.

Figure 12C:
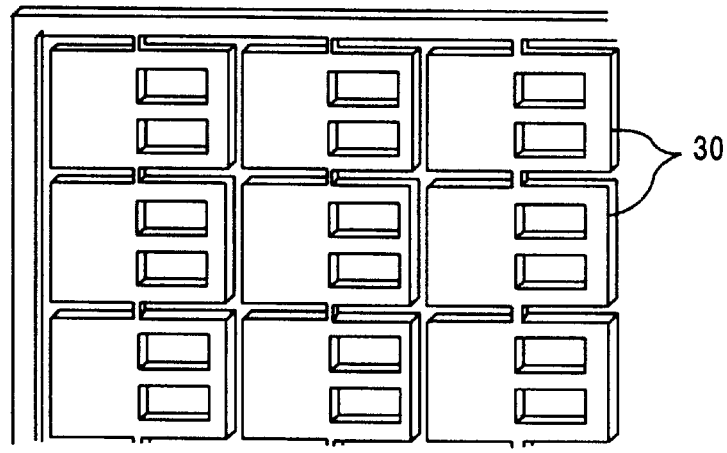

The metal sheets thus formed and including therein the plate members 31–33 and 41–44 in the mechanically interconnected state are stacked upon each other, as indicated in FIG. 12C, and are subjected to a diffusion bonding process in an inert atmosphere while urging the metal sheets firmly with each other. After the diffusion bonding process, each of the cooling devices 30 or 40 thus formed are disconnected by cutting the bridging parts.

[Sixth Embodiment]

Next, the manufacturing process of a linear optical source 50 according to a sixth embodiment of the present invention will be described with reference to FIGS. 13A and 13B, wherein those parts corresponding to the parts described previously are designated by the same reference numerals and the description thereof will be omitted.

Figure 13A:
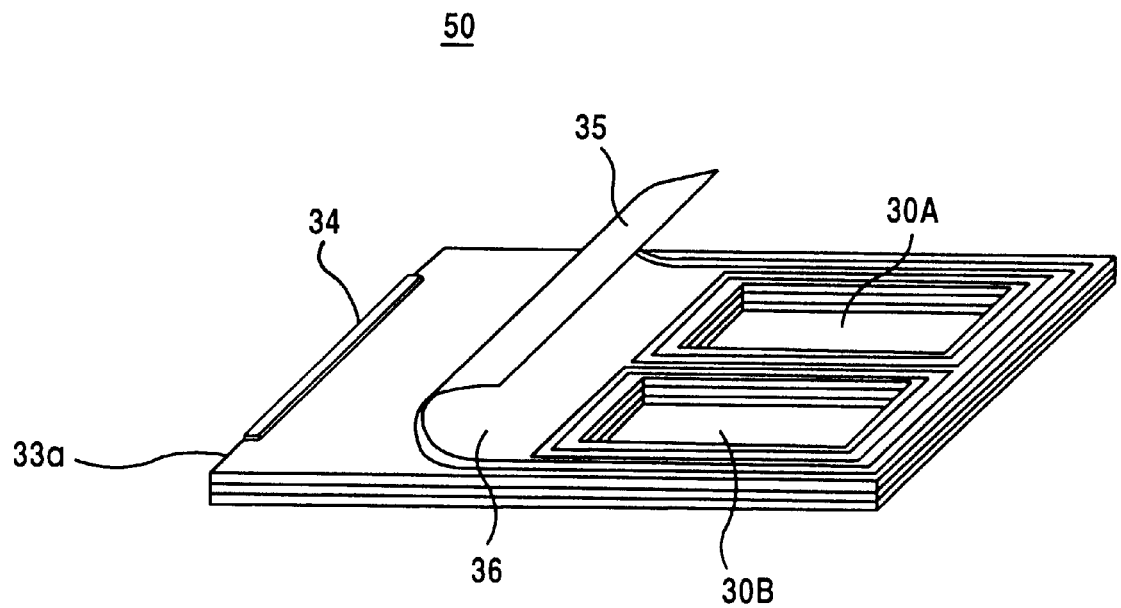
FIGS. 13A and 13B are views showing the construction of an optical source according to a sixth embodiment of the present invention.

Referring to FIG. 13A, the laser diode array 34 is mounted on the top surface of the plate member 33 along the front edge 33a thereof, after the cooling device 30 is formed by stacking the plate members 31–33, wherein the laser diode array 34 is mounted by soldering the electrode provided on a bottom surface of the semiconductor substrate, which forms a part of the laser diode array 34, by using a solder of an In alloy or a PbSn alloy. Further, an insulating sheet 35 of polyimide or a fluoroplastic resin is provided on the plate member 33. In the illustrated example, the insulating sheet 35 is formed with openings corresponding to the cooling water inlet 30A and the outlet 30B and carries thereon a metal film 36 formed thereon by a metallization process. Of course, a suitable barrier metal may be formed on the plate member 33 covered by Au, prior to the soldering of the laser diode array 34.

Figure 13B:
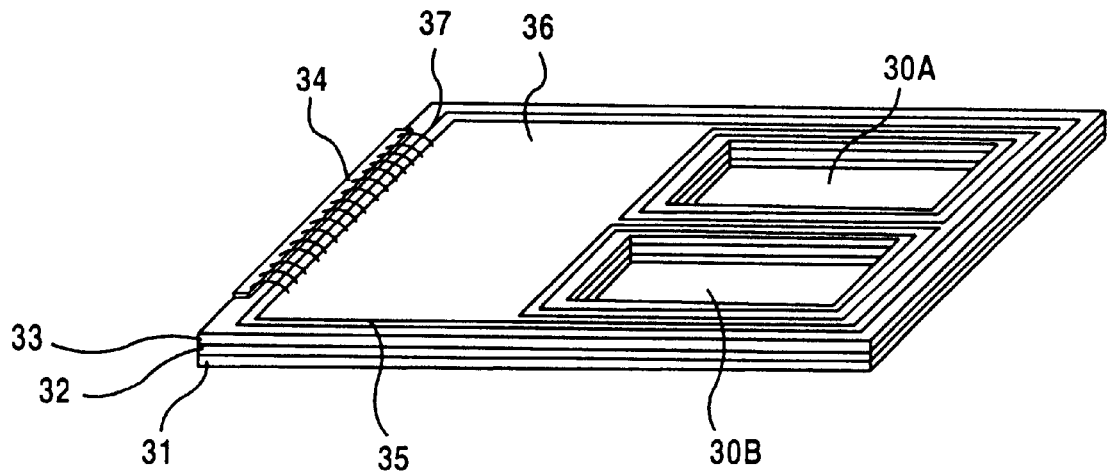

Further, each of the laser diodes forming the laser diode array 34 is connected to the metal film 36 electrically by way of a bonding wire 37, which may be formed of Au, as indicated in FIG. 13B. According to such a construction, all of the laser diodes forming the laser diode array 34 are driven simultaneously by a drive current supplied from a common current source to the metal film 36. Further, a wiring pattern may be formed on the insulating sheet 35 in place of the metal film 36. It is also possible to use an insulating dielectric film of $SiO_2$, SiON or AlN in place of the insulating sheet 35. Such a dielectric film may be formed by a CVD process or sputtering process. Further, an Au foil or similar conductive foil may be used in place of the bonding wire 37.

[Seventh Embodiment]

Figure 14A:
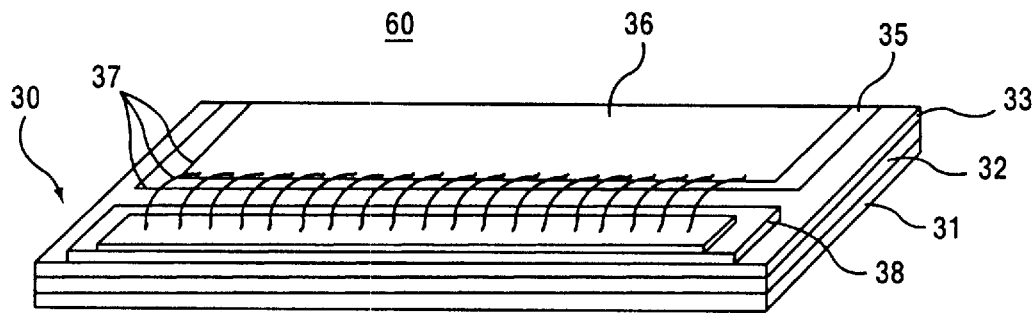
FIGS. 14A and 14B are views showing the construction of an optical source according to a seventh embodiment of the present invention.

FIG. 14A shows the construction of a linear optical source 60 according to a seventh embodiment of the present invention, wherein those parts corresponding to the parts described previously are designated by the same reference numerals and the description thereof will be omitted.

Referring to FIG. 14A, the optical source 60 uses heat sink 38 between the plate member 33 forming the uppermost layer of the layered cooling device 30 and the laser diode array 34, wherein the heat sink 38 is formed of a metal having a thermal expansion coefficient similar to the thermal expansion coefficient of GaAs that forms the laser diode array 34. For example, the heat sink 38 may be formed of CuW or CuMo. By using the heat sink 38, it is possible to reduce the mechanical stress applied to the laser diode array 34.

Figure 14B:
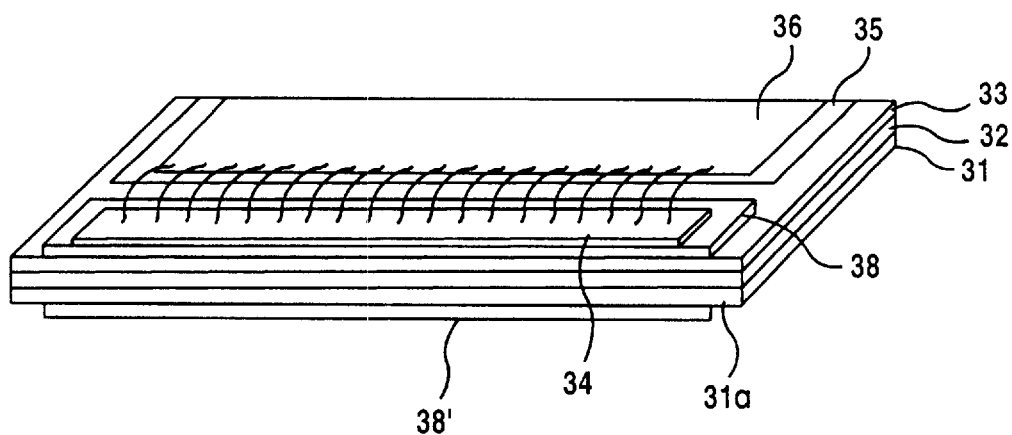

FIG. 14B shows a modification of the construction of FIG. 14A.

Referring to FIG. 14B, the optical source includes, in addition to the foregoing heat sink 38, another heat sink 38' of the same material and the same size and shape on the bottom surface of the plate member 31 along the front edge 31a thereof, such that the relationship between the heat sink 38 and the heat sink 38' is symmetrical. By forming the heat sink 38', the bi-metal deformation of the plate member 33, caused by the difference in thermal expansion between the heat sink 38 and the plate member 33, is effectively suppressed by the compensating action of the heat sink 38'.

[Eighth Embodiment]

Figure 15A:
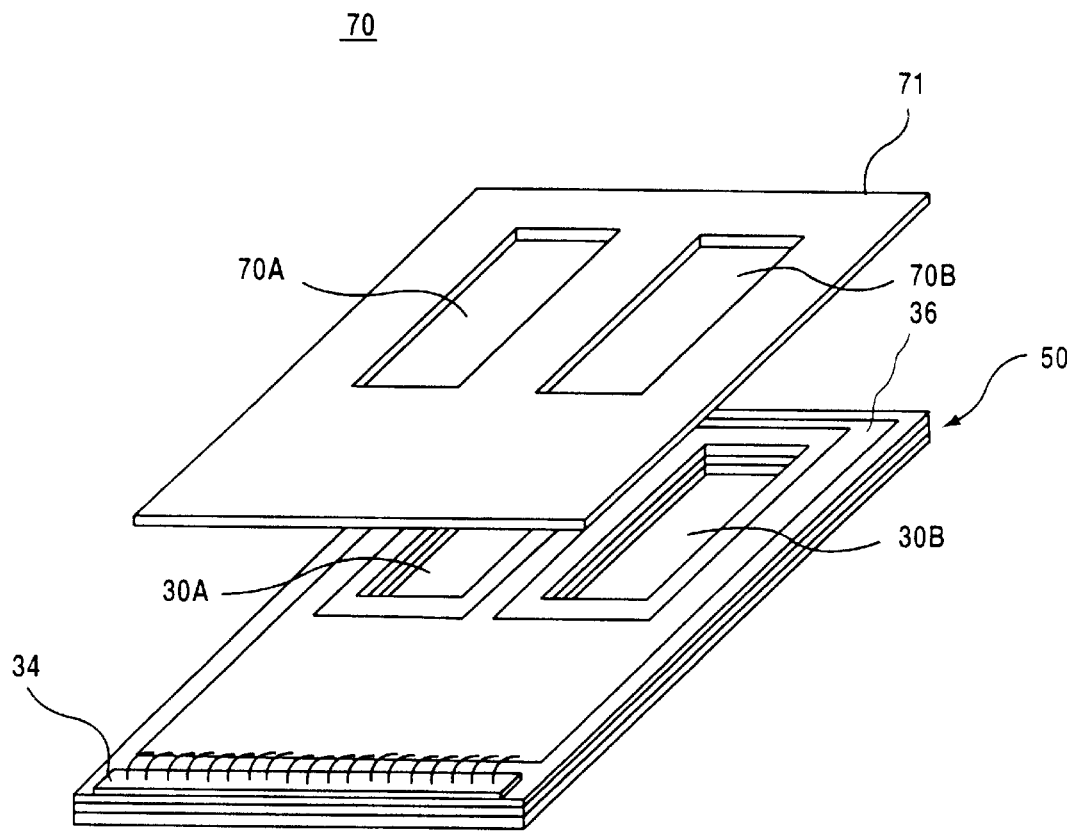
FIGS. 15A and 15B are views showing the construction of a planar optical source according to an eighth embodiment of the present invention.
Figure 15B:
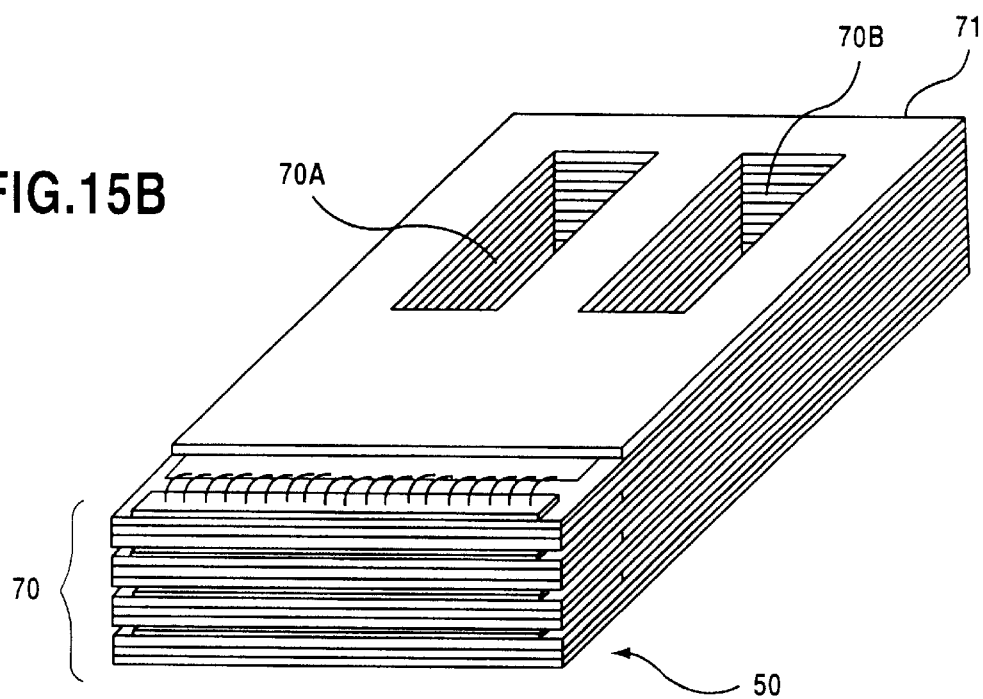

FIGS. 15A and 15B show the construction of a planar optical source 70 according to an eighth embodiment of the present invention.

Referring to FIGS. 15A and 15B, the planar optical source 70 is formed by stacking the linear optical source 50 of FIG. 13B a plurality of times in the same orientation, with a metal seal member 71 interposed between a linear optical source 50 and an adjacent linear optical source 50.

The seal member 71 has a size and shape corresponding to the metal film 36 and is formed with openings 70A and 70B, respectively, corresponding to the cooling water inlet 30A and outlet 30B. In the planar optical source 70 of such a construction, the cooling water inlets 30A of the stacked linear optical sources 50 are aligned. Similarly, the cooling water outlets 30B of the stacked linear optical sources 50 are aligned. Thus, the cooling water supplied to the inlet 70A is distributed to each of the linear optical sources 50. Further, the cooling water discharged from each of the linear optical sources 50 are collected to the outlet opening 70B.

In the planar optical source 70 thus constructed, the laser diode arrays 34 are stacked repeatedly in correspondence to the stacking of the optical sources 50, and a powerful two-dimensional array of laser diodes is formed.

In the planar optical source 70, it should be noted that the metal seal member 71 engages mechanically as well as electrically with the metal film 36 of the underlying linear optical source 50 and simultaneously with the bottom surface of the plate member 31, which forms the lowermost layer of the cooling device 30 of the linear optical source 50, which linear optical source 50 locating immediately above the metal seal member 71. As a result of such a construction, a laser diode of a linear optical source 50 is connected in series to a laser diode of the optical source 50 is located immediately thereabove. Thereby, the problem of increased resistance caused in the conventional planar optical source is successfully eliminated in the present invention by using the metal seal member 71 for the mechanical as well as electrical interconnection between the stacked linear optical sources 50. Further, the seal member 71 acts also as a spacer that provides an optimum spacing between the laser diode array of an optical source 50 and the cooling device 30 of an adjacent optical source 50 immediately thereabove.

Figure 16:
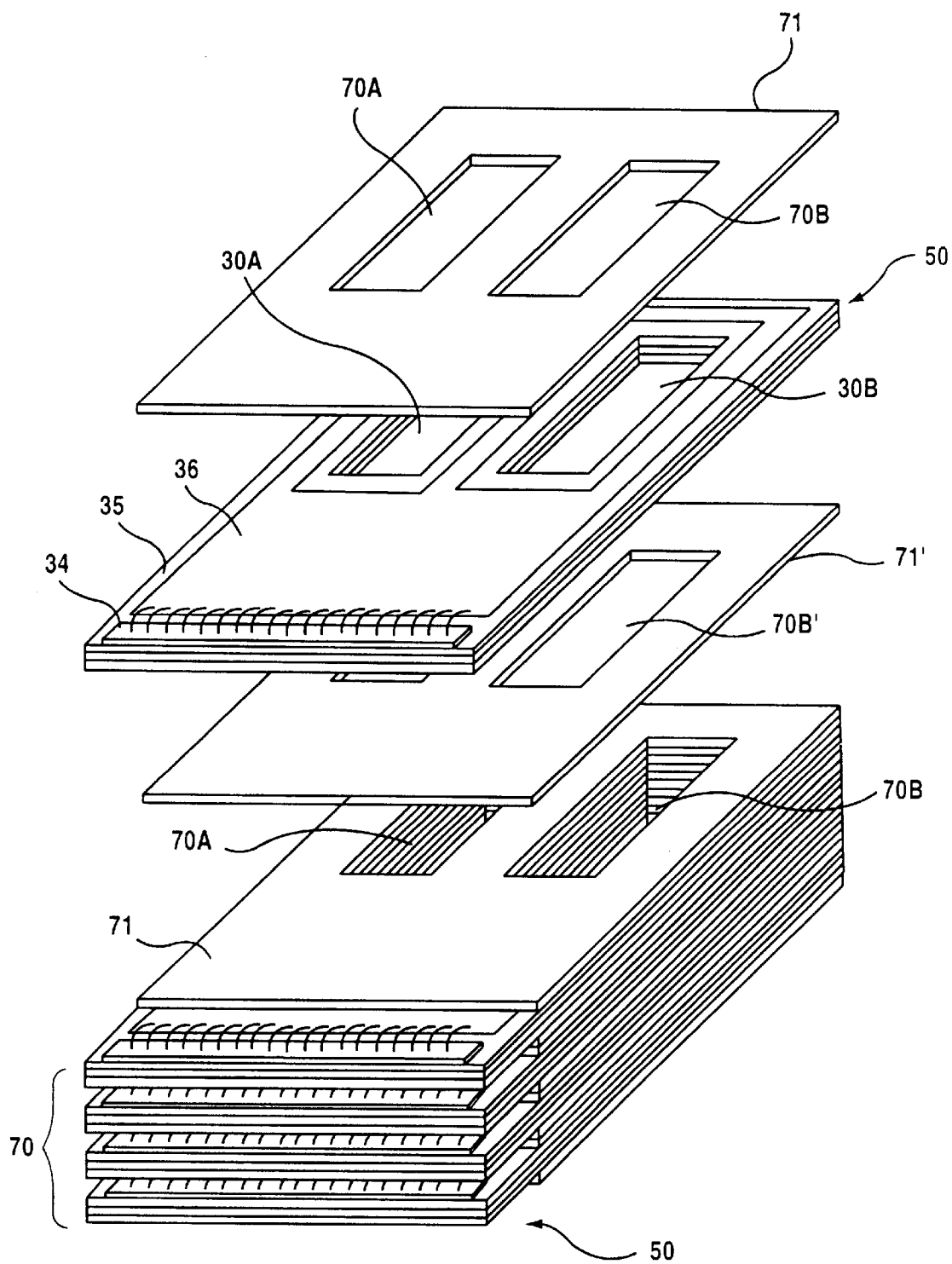
FIG. 16 is a view showing a modification of the planar optical source of the eighth embodiment.

FIG. 16 shows a modification of the planar optical source 70 of FIGS. 15A and 15B.

In the construction of FIG. 16, another metal plate 71' is provided, in addition to the foregoing metal seal 71, between an optical source 50 and another optical source 50 located immediately underneath, as an additional spacer. The metal plate 71' has a size and shape identical to those of the metal seal member 71 and thus includes openings 70A' and 70B', respectively, in correspondence to the openings 70A and 70B.

In the present embodiment, too, it is desired to form the plate members 31–33 and 71 as well as 71' by the same material for avoiding the electro-corrosion.

[Ninth Embodiment]

Figure 17B:
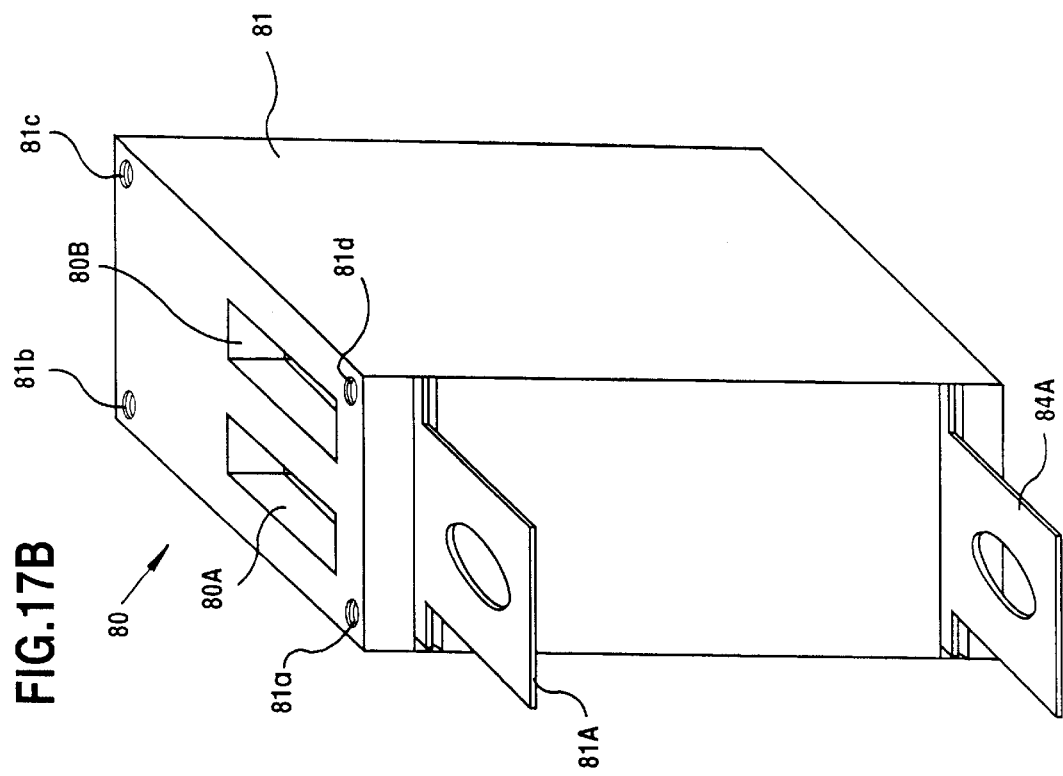
FIGS. 17A and 17B are views showing the construction of a planar optical source according to a ninth embodiment of the present invention.
Figure 17A:
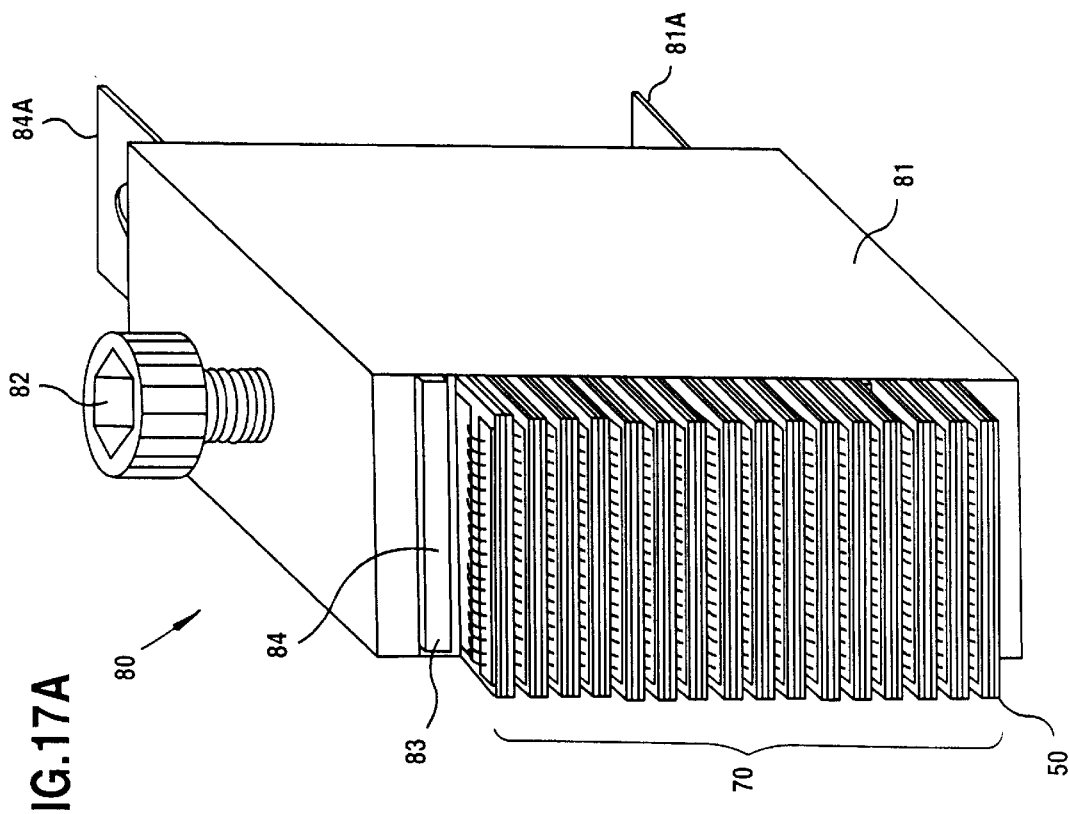

FIGS. 17A and 17B show the construction of a planar optical source 80 according to a ninth embodiment of the present invention, wherein FIG. 17A shows a front side and a top surface in an oblique view while FIG. 17B shows a rear side and a bottom surface also in an oblique view. In FIGS. 17A and 17B, those parts corresponding to the parts described previously are designated by the same reference numerals and the description thereof will be omitted.

Referring to FIGS. 17A and 17B, the planar optical source 80 includes the planar optical source 70, in which the linear optical sources 50 are stacked as explained previously, and a case 81, wherein the planar optical source 70 is accommodated in the case 81. In the case 81, the planar optical source 70 is urged by a press plate 83 covered by an insulating coating, by tightening a screw 82. Further, a metal electrode plate 84 is interposed between the uppermost optical source 50 and the insulating press plate 83, wherein the electrode plate 84 is formed at a rear end thereof with a terminal 84A. Further, a terminal 81A is formed behind the case 81.

As will be understood from the rear view of FIG. 17B, the case 81 is formed, on a bottom surface thereof, with a cooling water inlet 80A and a cooling water outlet 80B. Further, the inner side walls of the case 81 are covered by an insulating coating similarly to the foregoing press plate 83. Further, the case 81 carries, on a bottom surface thereof, screw holes 81a–81d for accepting mounting screws.

Further, the bottom surface of the interior of the case 81 may be provided with a similar insulating coating. In this case, another electrode plate carrying a terminal similar to the terminal 81A may be interposed between the bottom of the planar optical source 70 and the foregoing insulated bottom surface of the case 81.

[Tenth Embodiment]

Figure 18:
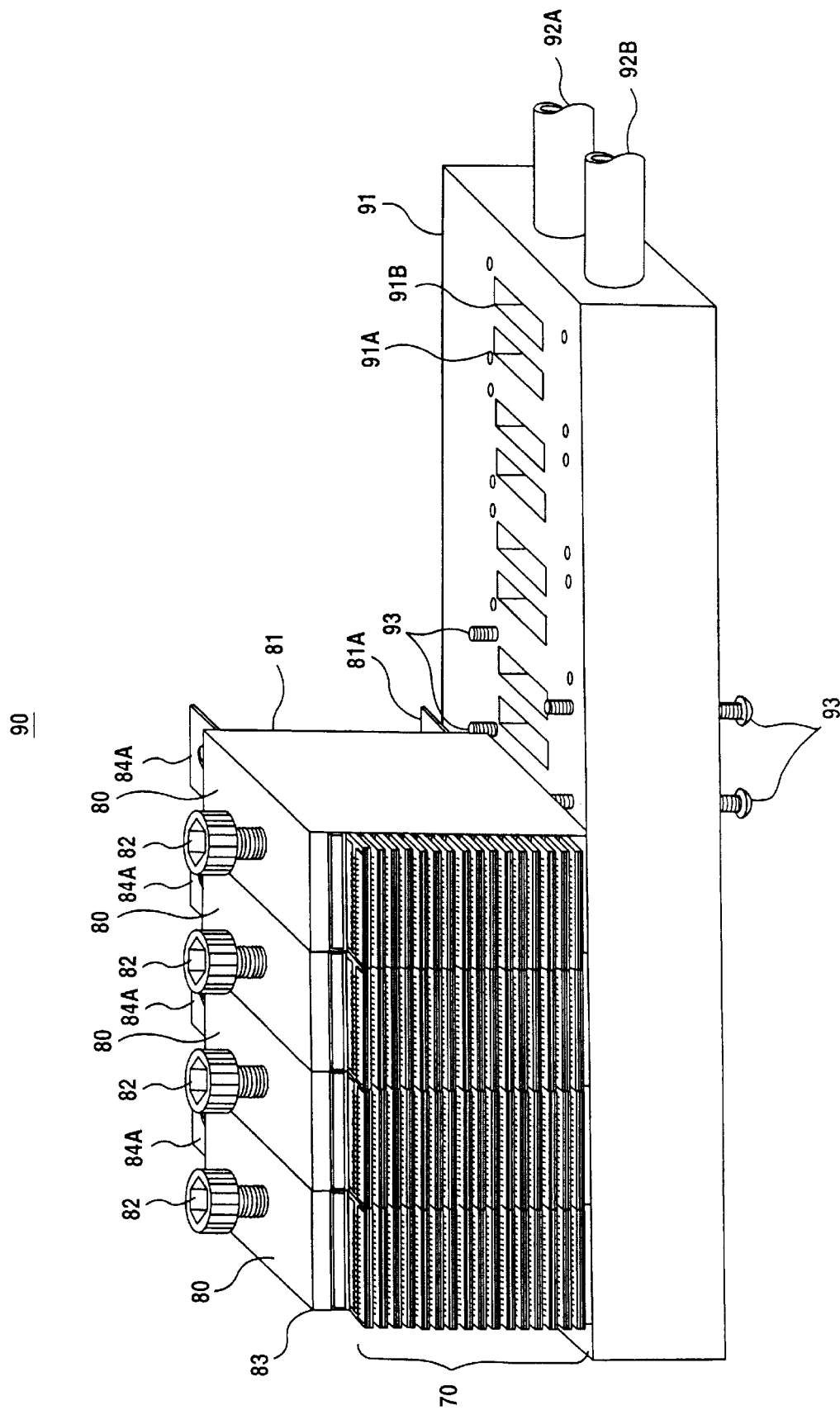
FIG. 18 is a view showing the construction of a planar optical source according to a tenth embodiment of the present invention.

FIG. 18 shows the construction of a planar optical source 90 according to a tenth embodiment of the present invention.

Referring to FIG. 18, the planar optical source 90 is formed by mounting a number of planar optical sources each having a construction of the optical source 80, on a common manifold or a base 91 in a state that the planar optical sources 80 are aligned adjacent with each other.

Referring to FIG. 18, the base 91 is formed with a passage of cooling water in communication with an inlet conduit 92A and a passage of cooling water in communication with an outlet conduit 92B, wherein a number of water outlets 91A are formed on the base 91 in communication with the foregoing inlet conduit 92A and in correspondence to the water inlet 80A of each of the planar optical sources 80 that are mounted on the base 91. Further, the base 90 is formed with water inlets 91B in communication with the water outlet conduit 92B and in correspondence to the water outlet 80B of each of the planar optical sources 80 that are mounted on the base 91. The planar optical sources 80 are thereby mounted on the base 91 in alignment with the openings 91A and 91B, as noted above, by screws 93 that fit into the corresponding screw holes 80a–80d.

As explained previously, the grooves in the linear optical sources 50, which form the fundamental element of the planar optical source 90, is immune to severe deformation even when the plate members 31–33 are pressed to each other tightly. Thus, the planar optical source 90 is free from the problem of collapsing of the water passage therein even when the screws 82 are tightened firmly.

[Eleventh Embodiment]

Figure 19A:
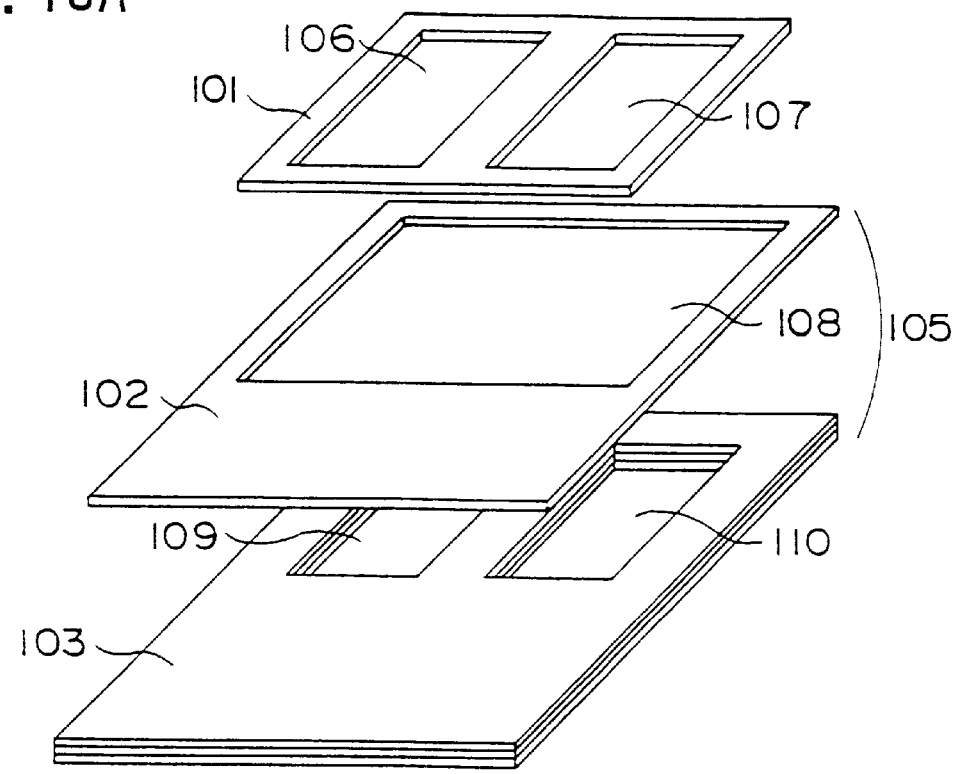
FIGS. 19A and 19B are views showing the construction of a planar optical source according to an eleventh embodiment of the present invention.
Figure 19B:
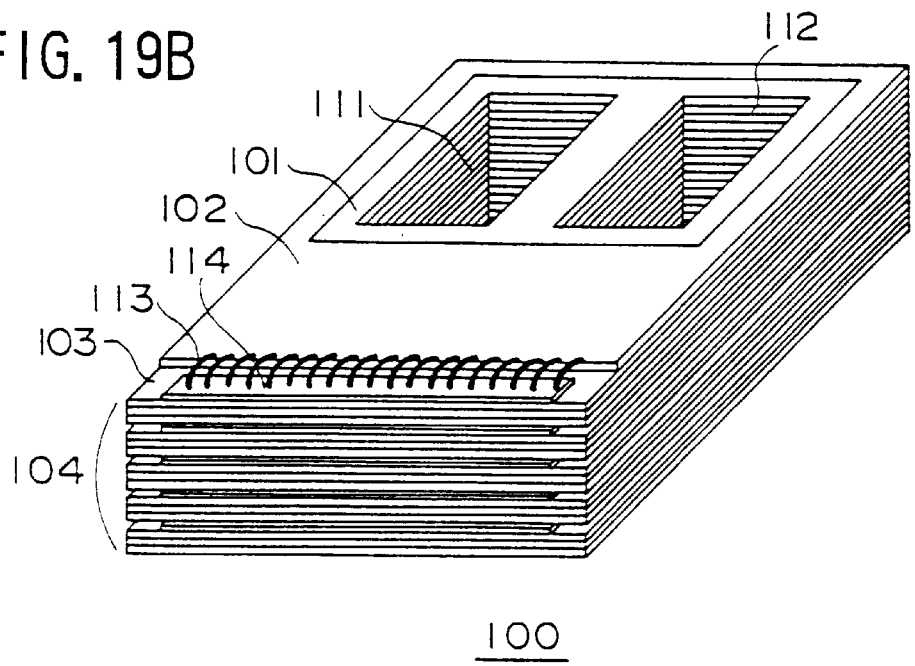

FIG. 19A shows the construction of an optical source 105 according to an eleventh embodiment of the present invention, while FIG. 19B shows the construction of a planar optical source 100 formed by stacking the optical sources 105 of FIG. 19A.

Referring to FIG. 19A, the optical source 105 is constructed on a cooling device 103, which may be any of the cooling devices 30–70 explained previously, wherein the cooling device 103 is covered by a metal sheet 102 formed with an opening 108 that exposes a part of the cooling device 103 in which passages 109 and 110 are formed in correspondence respectively to the cooling water inlet 30A and the cooling water outlet 30B. The metal sheet 102 is adhered to the top surface of the cooling device 103 by an insulating adhesive layer, not illustrated, and the metal sheet 102, thus provided, is connected electrically to a drive electrode (not shown) of a laser diode array 114 corresponding to the laser diode array 34 and provided on the cooling device 103 along a front edge thereof, by an Au bonding wire 113 or an Au foil. See FIG. 19B. The laser diode array 114 carries a bottom ground electrode not illustrated, and the bottom ground electrode is contacted to the cooling device 103 when the laser diode array 114 is mounted to the cooling device 103.

Further, the optical source 105 of FIG. 19A includes an insulating rubber sheet 101 in the foregoing opening 108, wherein the insulating rubber sheet 101 is formed with openings 106 and 107 in correspondence to the cooling water passages 109 and 110. The rubber sheet 101 has a thickness slightly larger than the thickness of the foregoing metal sheet 102, typically by a difference of 50–100 $\mu$m. Thereby, the rubber sheet 101 effectively suppresses, when the planar optical source 100 is assembled by stacking the optical sources 105 to form a layered body 104, the leakage of water in the cooling water passage 109 or 110 from the interface between the cooling device 103 and the metal sheet 102. In the stacked state of FIG. 19B, the rubber sheet 101 in any of the optical sources 105 is squeezed and the top surface of the rubber sheet 101 coincides the top surface of the metal sheet 102. Thus, the rubber sheet 101 interrupts the leak path of water.

In relation to the fact that the rubber sheet 101 forms a flush surface with the metal sheet 102, it should be noted that the planar optical source of FIG. 19B maintains the advantageous feature of the pitch of stacking of the linear optical sources 105 being maintained exactly. Further, it should be noted that the rubber sheet 101 seating in the opening 108 of the metal sheet 102 experiences little deformation even when the pressure inside the cooling water passage 109 or 110 is raised. Thus, the rubber sheet 101 provides a highly reliable sealing effect.

In the assembled state of the planar laser diode 100, it should be noted that the metal sheet 102 of an optical source 105 makes a contact with the cooling device 103 of the optical source 105 immediately thereabove. In this manner, the stacked linear optical sources 105 are connected in series via the metal sheet 102. As the metal sheet 102 achieves an intimate contact with the cooling device 103 immediately thereabove, the serial resistance of the planar optical source 100 is reduced and the reliability of contact is improved. As will be explained later, the metal sheet 102 having the opening 108 can be formed easily by a chemical etching process with a low cost. In view of eliminating the problem of electro-corrosion, it is preferable to form the metal sheet 102 by the same material, such as Cu or a Cu-alloy, that forms the cooling device 103.

[Twelfth Embodiment]

Figure 20C:
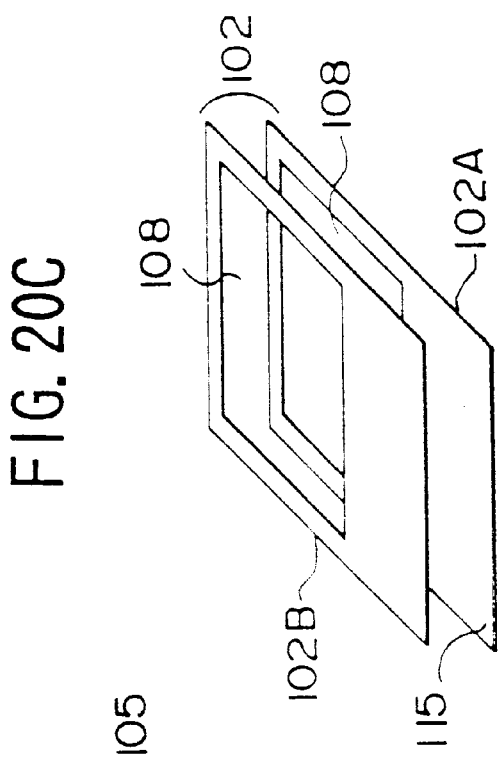
FIGS. 20A–20C are views showing the construction of a planar optical source according to a twelfth embodiment of the present invention.
Figure 20A:
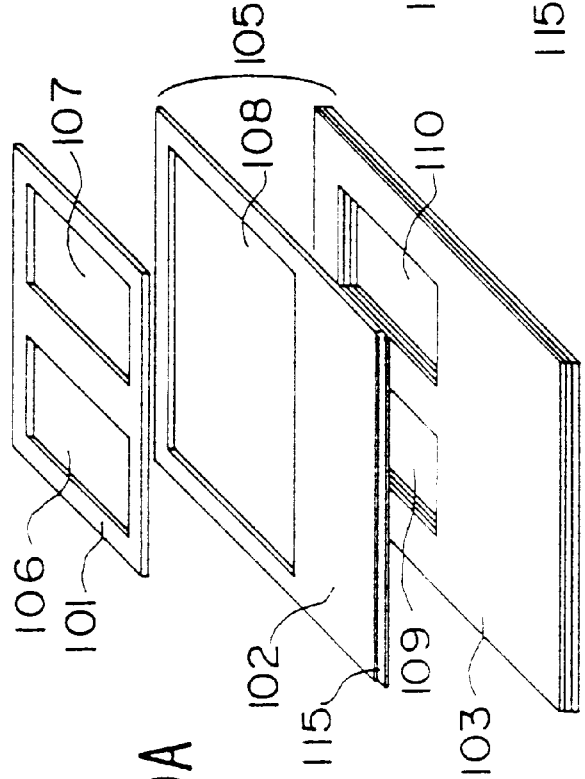
Figure 20B:
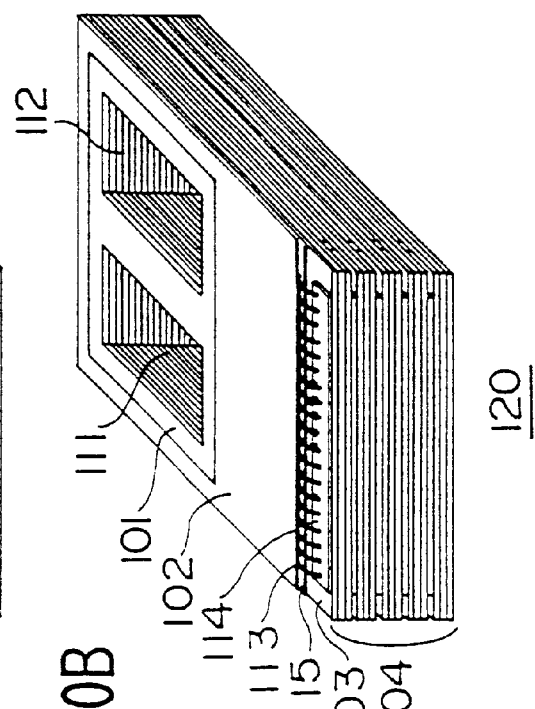

FIG. 20A shows the construction of a linear optical source according to a twelfth embodiment of the present invention, while FIG. 20B shows the construction of a planar optical source 120 formed by stacking the linear optical source of FIG. 20A a plurality of times. In FIGS. 20A and 20B, those parts corresponding to the parts described previously are designated by the same reference numerals and the description thereof will be omitted.

Referring to FIGS. 20A and 20B, the metal sheet 102 is formed with a stepped region 115 along the front edge thereof, and the interconnection between the laser diode array 114 and the metal sheet 102 by the bonding wires 113 is achieved by connecting the bonding wires 113 to the stepped region 115. Thereby, the risk that the bonding wire 113 contacting accidentally to the cooling device 103 of the optical source 105 located immediately thereabove is eliminated. Thereby, the reliability of the planar optical source is improved.

FIG. 20C shows a modification of the linear optical source of FIG. 20A.

Referring to FIG. 20C, the metal sheet 102 carrying the stepped region 115 is formed by a lower metal sheet 102A formed with the opening 108 and the upper metal sheet 102B also formed with the opening 108, wherein the upper metal sheet 102B has a size smaller than that of the lower sheet 102A such that a stepped region corresponding to the stepped region is formed at the front edge when the upper and lower sheets 102A and 102B are stacked upon each other. The construction of FIG. 20C is advantageous in the point that the process of machining for forming the stepped region 115 can be omitted.

[Thirteenth Embodiment]

Figure 21A:
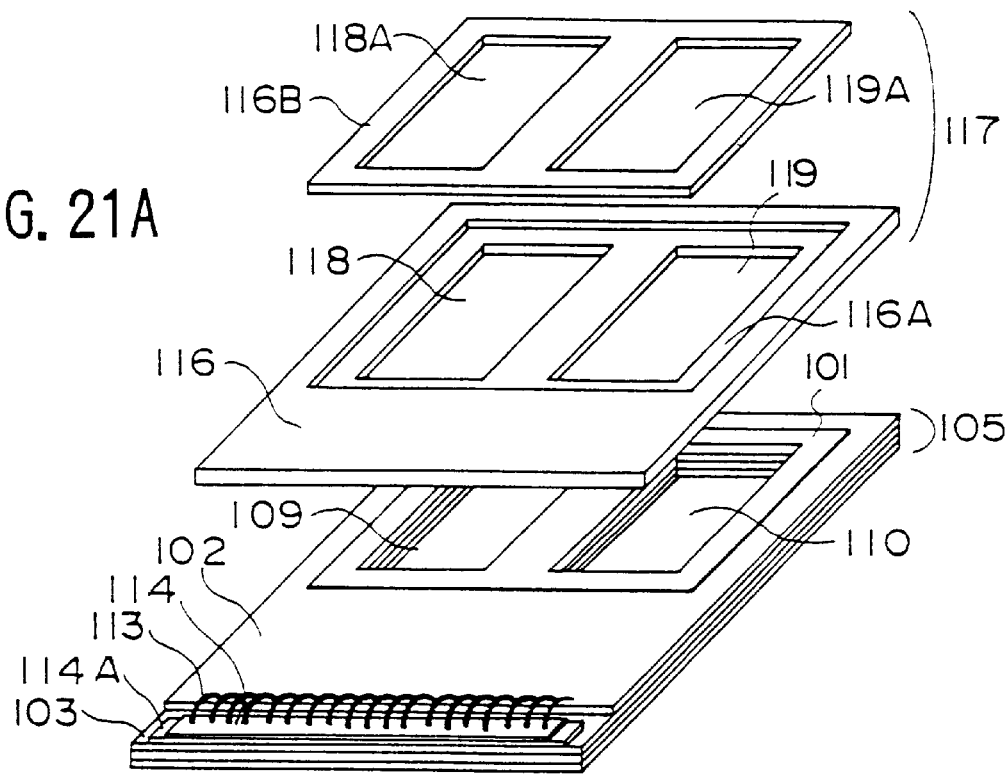
FIGS. 21A and 21B are views showing the construction of a planar optical source according to a thirteenth embodiment of the present invention.
Figure 21B:
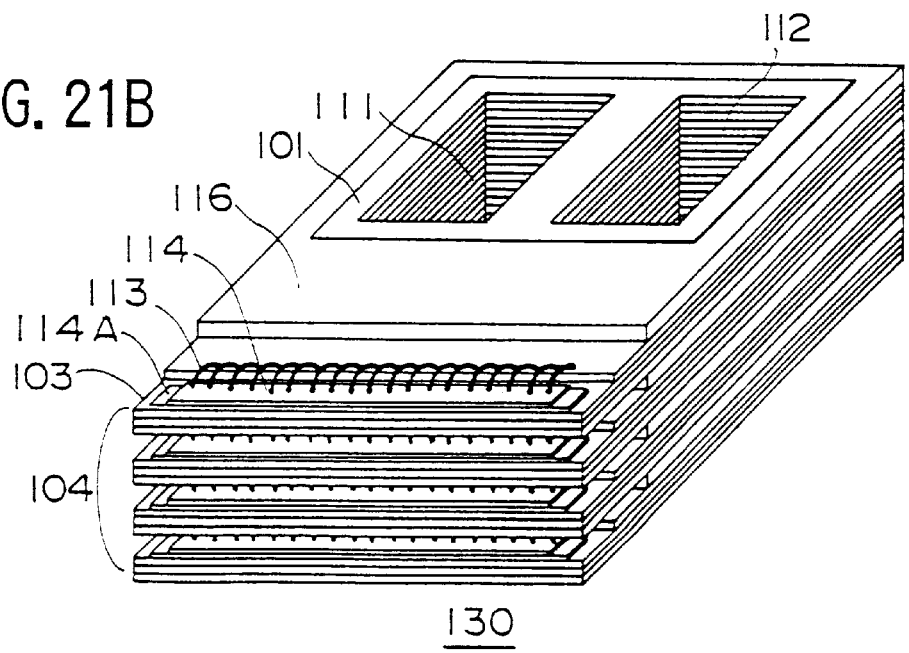

FIG. 21A shows the construction of the optical source according to a thirteenth embodiment of th represent invention, while FIG. 21B shows the construction of a planar optical source 130 formed by stacking the linear optical source of FIG. 21A a plurality of times. In FIGS. 21A and 21B, those parts corresponding to the parts described previously are designated by the same reference numerals and the description thereof will be omitted.

Referring to FIG. 21A, the present embodiment uses a metal spacer member 116 formed with openings 118 and 119, respectively, in correspondence to the cooling water passages 109 and 110, such that the metal spacer member 116 is provided on the linear optical source 105 of FIG. 19A. Thus, in the planar optical source 130 of FIG. 21B, a number of the linear optical sources 105 of FIG. 19A are stacked repeatedly, with a metal spacer member 116 interposed between adjacent linear optical sources 105.

It should be noted that the metal spacer member 116 is formed with a depression 116A including the openings 118 and 119, and an insulating rubber sheet 116B having openings 118A and 118B corresponding respectively to the openings 118 and 119, are seated on the foregoing depression 116A. The insulating rubber sheet 116B may be formed of the same material used for the rubber sheet 110. Thereby, the metal spacer member 116 and the rubber sheet 116B form together a spacer member 117.

In the stacked state of FIG. 21B, it should be noted that the metal spacer member 116 is urged toward the metal sheet 102 underneath, and an intimate contact occurs between the spacer member 116 and the metal sheet 102. Further, the spacer member 117 is urged also to the bottom surface of the upper cooling device 103 thereabove, and an intimate contact occurs between the spacer member 116 and the cooling device 113. Thus, a reliable, low resistance electrical contact is formed between the metal sheet 102 and the cooling device 103 of the optical source 105 which is provided on the metal sheet 102. It should be noted that the metal sheet 102 is connected electrically to the laser diode array 114.

In the planar optical source of FIG. 21B, it becomes possible to set the pitch of the optical beams repeated in the thickness direction of the planar optical source, by interposing the spacer member 117 between adjacent linear optical sources 105. As the separation between the optical beams can be increased in the planar optical source 130 of the present embodiment, it becomes possible to provide a sub-mount 114A between the cooling device 103 and the laser diode array 114. The sub-mount 114A is formed of a material having a thermal expansion coefficient similar to the thermal expansion coefficient of the laser diode array 114 and reduces the thermal stress applied to the laser diode array 114. As the rubber sheet 116B is seated in the depression 116A formed on the metal spacer member 116, the rubber sheet 116B is maintained free from deformation even when the pressure of the cooling water in the passage 118 or 119 is increased. Thereby, the problem of water leakage is effectively eliminated.

Figure 22A:
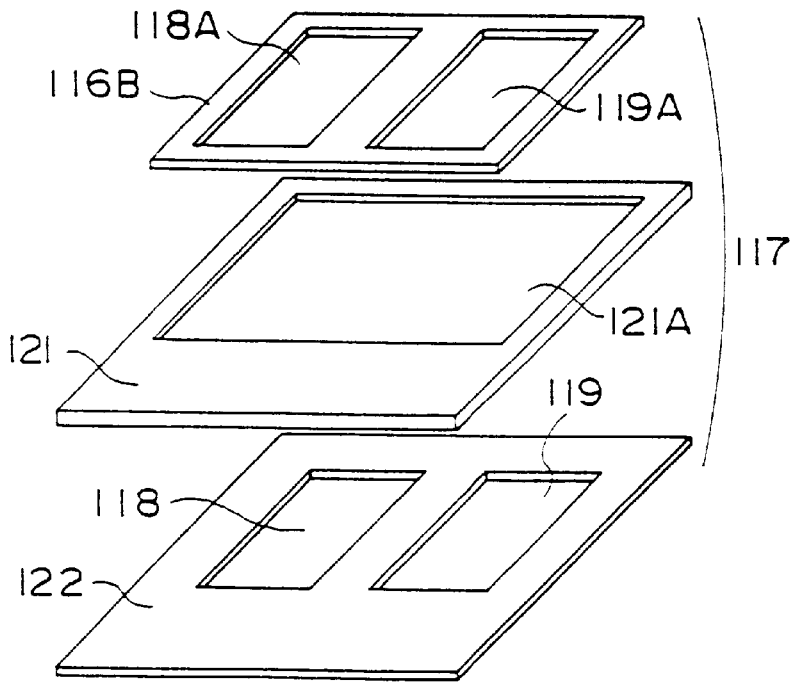
FIGS. 22A and 22B are views showing the details of the planar optical source of the thirteenth embodiment.
Figure 22B:
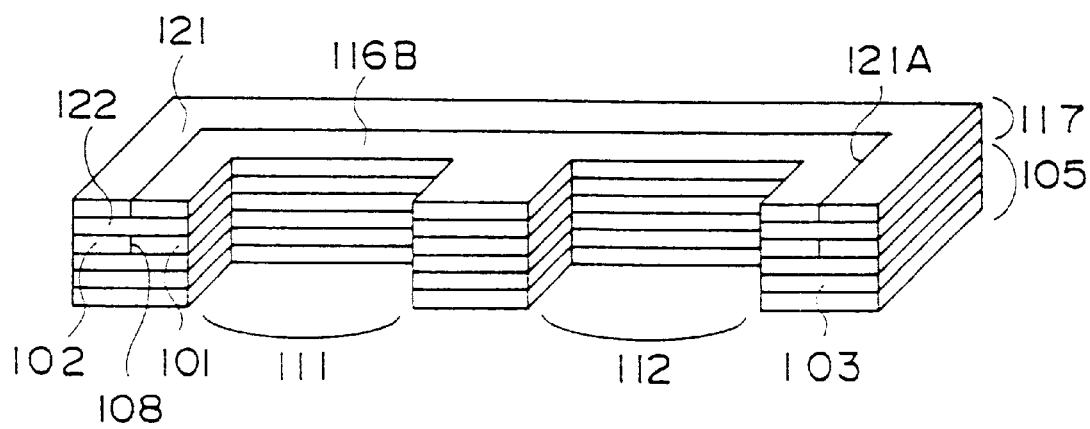

FIG. 22A shows a modification of the spacer member 117, while FIG. 22B shows a part of the layered structure that uses the spacer member 117 of FIG. 22A in detail.

Referring to FIG. 22A, the present embodiment forms the foregoing metal spacer member 116 from a lower metal sheet 122 formed with the foregoing openings 118 and 119 and an upper metal sheet 121 formed with an opening 121A corresponding to the depression 116A of FIG. 21A, and the rubber sheet 116B is fitted into the opening 121A.

By forming the metal spacer member 116 from the lower metal sheet 122 and the upper metal sheet 121', as explained above, the machining process for forming the depression 116A in the embodiment of FIG. 21A can be eliminated and the cost of the optical =source is reduced. The metal sheet 121 and the metal sheet 122 are both formed easily and with a low cost by using a chemical etching process that uses a conventional resist mask.

Referring to FIG. 22B, it should be noted that the metal sheet 102 makes a contact with the cooling device 103 intimately, and the rubber sheet 101 is held inside the opening 108. Further, the metal sheet 122 makes a contact with the foregoing metal sheet 102 intimately, and the metal sheet 121 is provided further thereon with an intimate contact thereto. Further, a rubber sheet 116B is held inside the opening 121A formed in the metal sheet 121. Thus, by stacking the metal sheets on a cooling device 103, a current path starting from the cooling device 103 and reaching an adjacent cooling device 103 immediately thereabove is established through the metal sheets 102, 122 and 121.

In such a construction, the rubber sheets 101 and 116B are held stably. Thus, the rubber sheets experience little mechanical deformation even when the water pressure inside the cooling water passages 111 and 112 is increased, and the problem of water leakage is effectively eliminated. As the rubber sheet 101 or 116B has a thickness slightly larger than the thickness of the metal sheet 102 or 121, any gap that may form a water leakage path is completely closed in the stacked state of FIG. 22B.

Figures 23A, 23B:
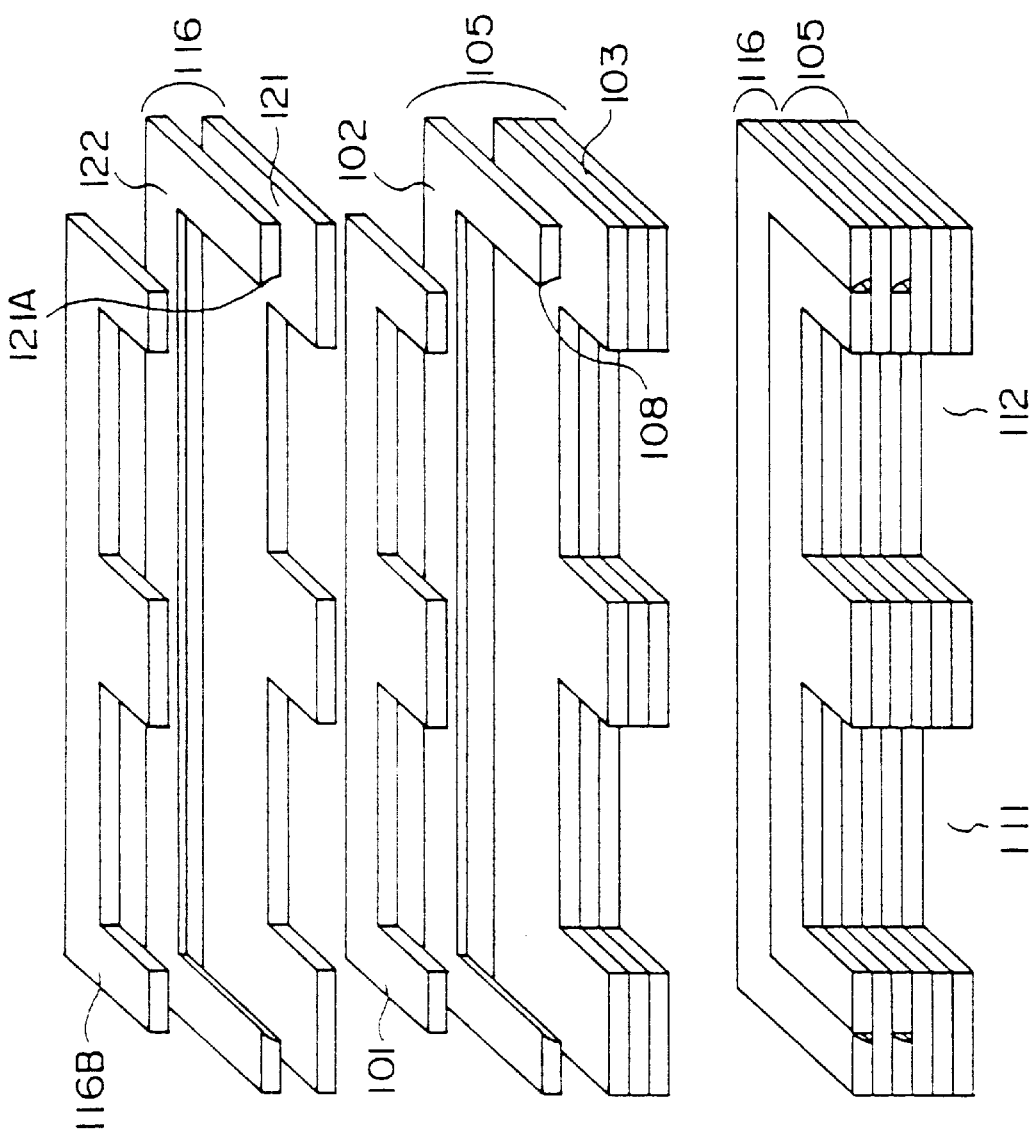
FIGS. 23A and 23B are views showing a modification of the thirteenth embodiment.

FIGS. 23A and 23B show a modification of the construction of FIG. 22B.

Referring to FIG. 23A, it should be noted that the opening 108 or 121A of the present modification has a side wall inclined such that the size of the opening decreases from the bottom side thereof to the top side thereof. As a result, the rubber sheet 101 does not protrude above the top surface of the metal sheet 102 when the metal sheet 102 is urged from an upward direction, and an intimate contact is guaranteed between the metal sheet 102 and the metal sheet 121 thereon. Such an inclined side wall is formed easily by a chemical etching process proceeding from one side or both sides of the metal sheet.

FIGS. 24A and 24B show another example of the construction of FIG. 23B.

Referring to FIG. 24A, the opening 108 or 121A of the present modification is defined by a side wall such that the side wall projects toward the interior of the opening generally at the center of the metal sheet in the thickness direction. By forming such a projection, the rubber sheet is positively secured in the opening 108 or 121A, and the process of assembling the layered structure shown in FIG. 24B is substantially facilitated. The side wall having such a projection is formed easily by a chemical etching process applied to a metal sheet.

[Fourteenth Embodiment]

Figure 25:
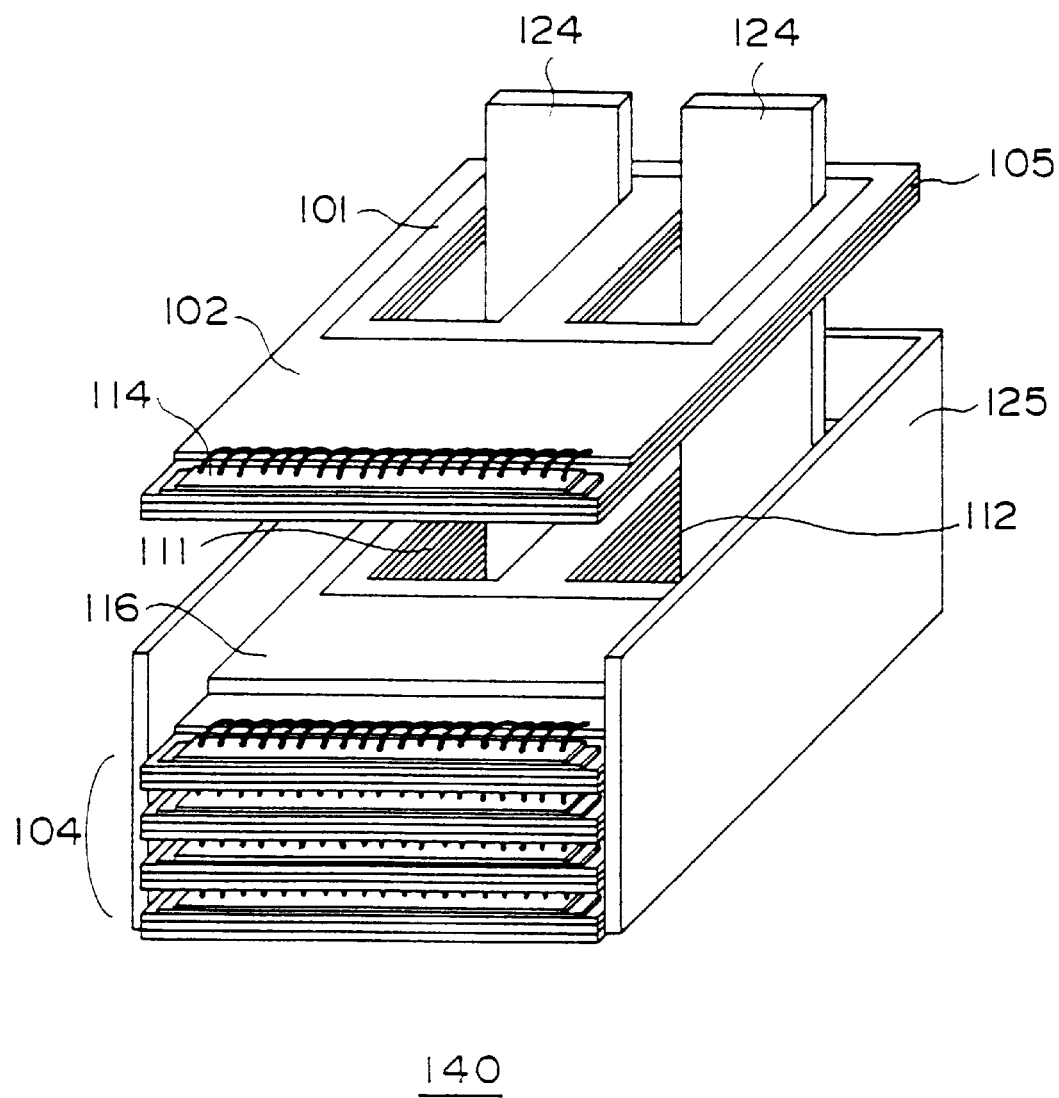
FIG. 25 is a view showing the construction of a planar optical source according to a fourteenth embodiment of the present invention.

FIG. 25 shows the assembling of a planar optical source 140 according to a fourteenth embodiment of the present invention, wherein those parts corresponding to the parts described previously are designated by the same reference numerals and the description thereof will be omitted.

In the present embodiment, a number of the linear optical sources 105, which may be any one of the linear optical sources described with reference to the eleventh through thirteenth embodiments, are assembled in a case 125 to form the optical source 140, wherein the optical source 140 may be any of the planar optical sources 100–130.

Referring to FIG. 25, the case 125 is formed with openings (not shown) corresponding to the cooling water passages 111 and 112, and a pair of guide rods 124 extend in the upward direction from the foregoing openings. Thereby, the stacking of the linear optical sources 105 is conducted in the case 125 by using the guide rods 124 as a guide, and the alignment of the linear optical sources 105 in the case 125 is achieved easily. Thus, the assembling of the planar optical source 140 is substantially facilitated.

It is preferable that the guide rods 124 are covered by an insulation coating, such as an oxide film, when formed as an integral body of the case 125. Thereby, it is desired that the guide rods 124 avoid contact with the front edge of the openings, which is close to the laser diode array 114, for facilitating the cooling of the laser diode array 114.

Figure 26:
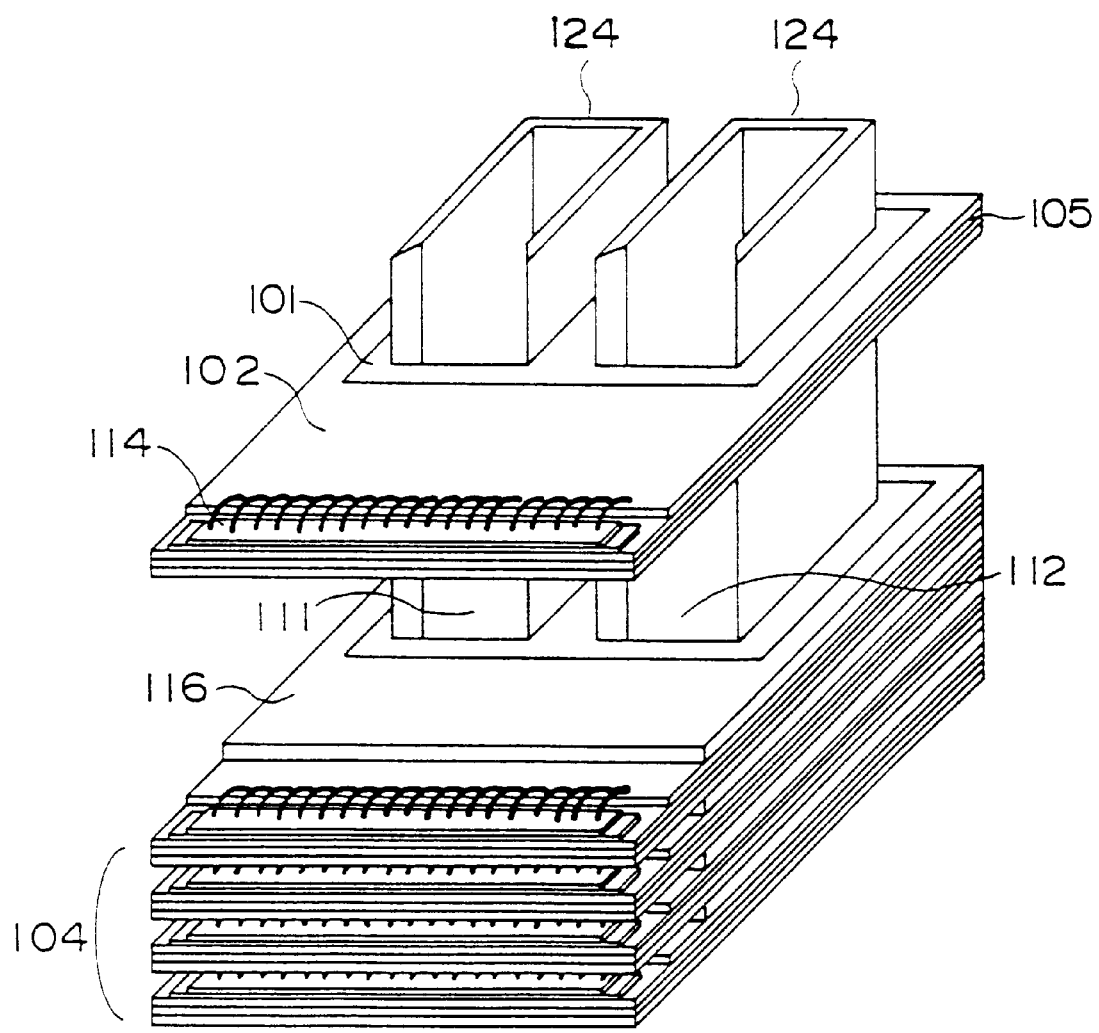
FIG. 26 is a view showing a modification of the fourteenth embodiment.

FIG. 26 shows a modification of the embodiment of FIG. 25, in which it should be noted that each of the guide rods 124 has a U-shaped cross-sectional form. In the construction of FIG. 26, each of the guide rods 124 engage three edges of the opening 111 or 112, excluding the front edge.

In any of the constructions of FIGS. 25 and 26, the guide rod 124 may be removed after the assembling of the planar optical source 140. In this case, it is not necessary to provide the insulating coating on the surface of the guide rods 124.

According to the present embodiment, in which the guide rods 124 are provided in the water passages, it is not necessary to form the linear optical sources 105 unnecessarily large merely for the purpose of securing a space for inserting the guide rods. Thereby, the cost of the linear optical sources 105, and hence the cost of the planar optical source 140, is reduced.

Figure 27:
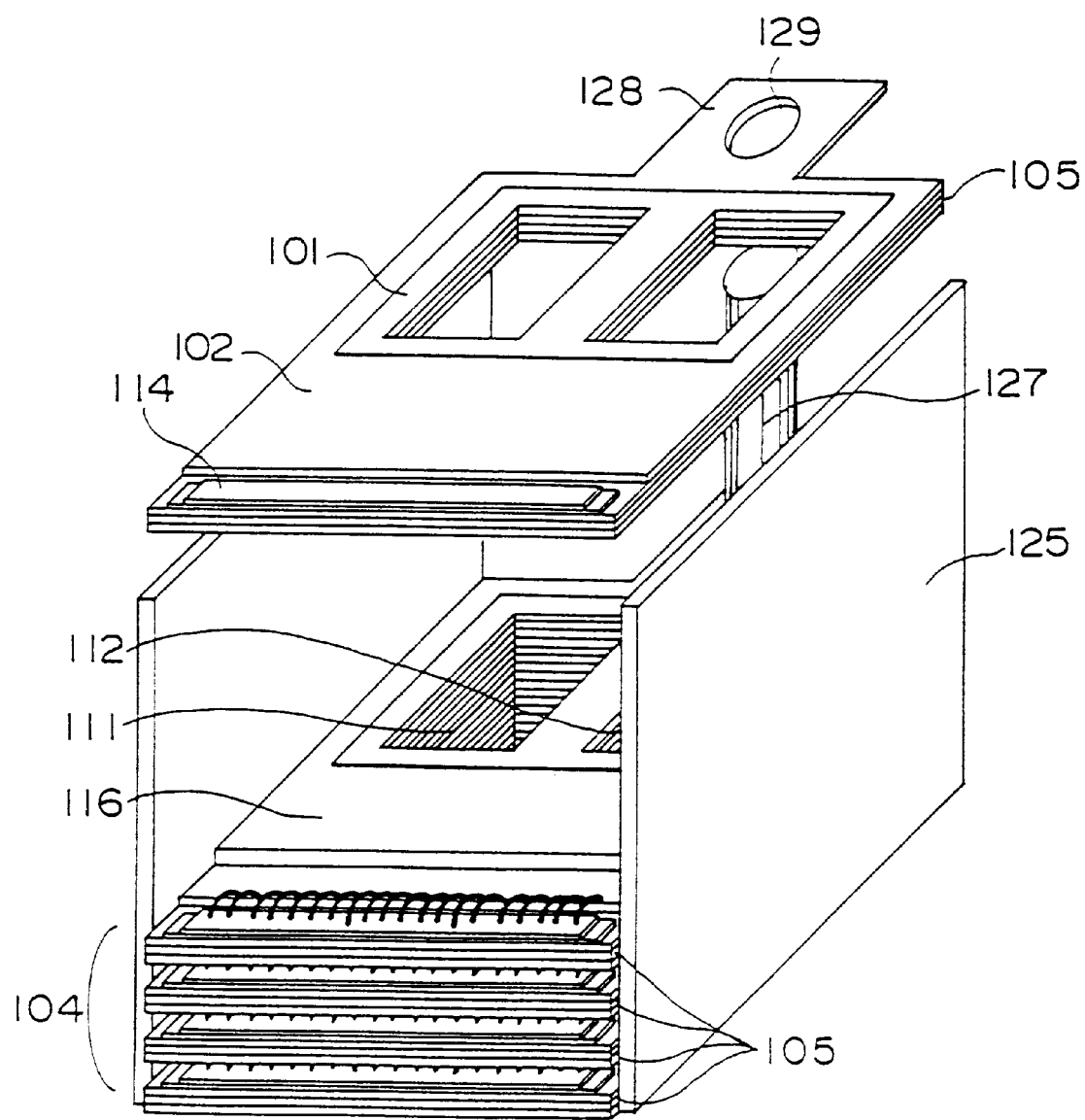
FIG. 27 is a view showing a further modification of the fourteenth embodiment.

FIG. 27 shows a further embodiment of assembling a planar optical source, wherein those parts corresponding to the parts described previously are designated by the same reference numerals and the description thereof will be omitted.

Referring to FIG. 27, the present embodiment forms a tongue 128 in each of the linear optical sources 105 such that the tongue 128 projects in the backward direction of the optical source 105. The tongue 128 is provided with an opening 129 for accepting a guide rod 127, and the linear optical sources 105 are stacked in the case 125 with a proper positioning given by an engagement between the foregoing opening 129 of the tongue 128 and the guide rod 127 and an engagement between the optical source 105 and the side walls of the case 125. According to the needs, the guide rod 127 may be provided in plural numbers.

According to the construction of FIG. 27, it should be noted that the guide rod 127 is formed outside the cooling water passages 111 and 112. Thereby, the problem of the cooling water flow being disturbed or resisted by the guide rod in the cooling water passages, is avoided. In the present embodiment, too, the guide rod 127 is preferably covered by an insulating coating. Alternatively, the guide rod 127 may be removed after the assembling of the planar optical source.

Figure 28:
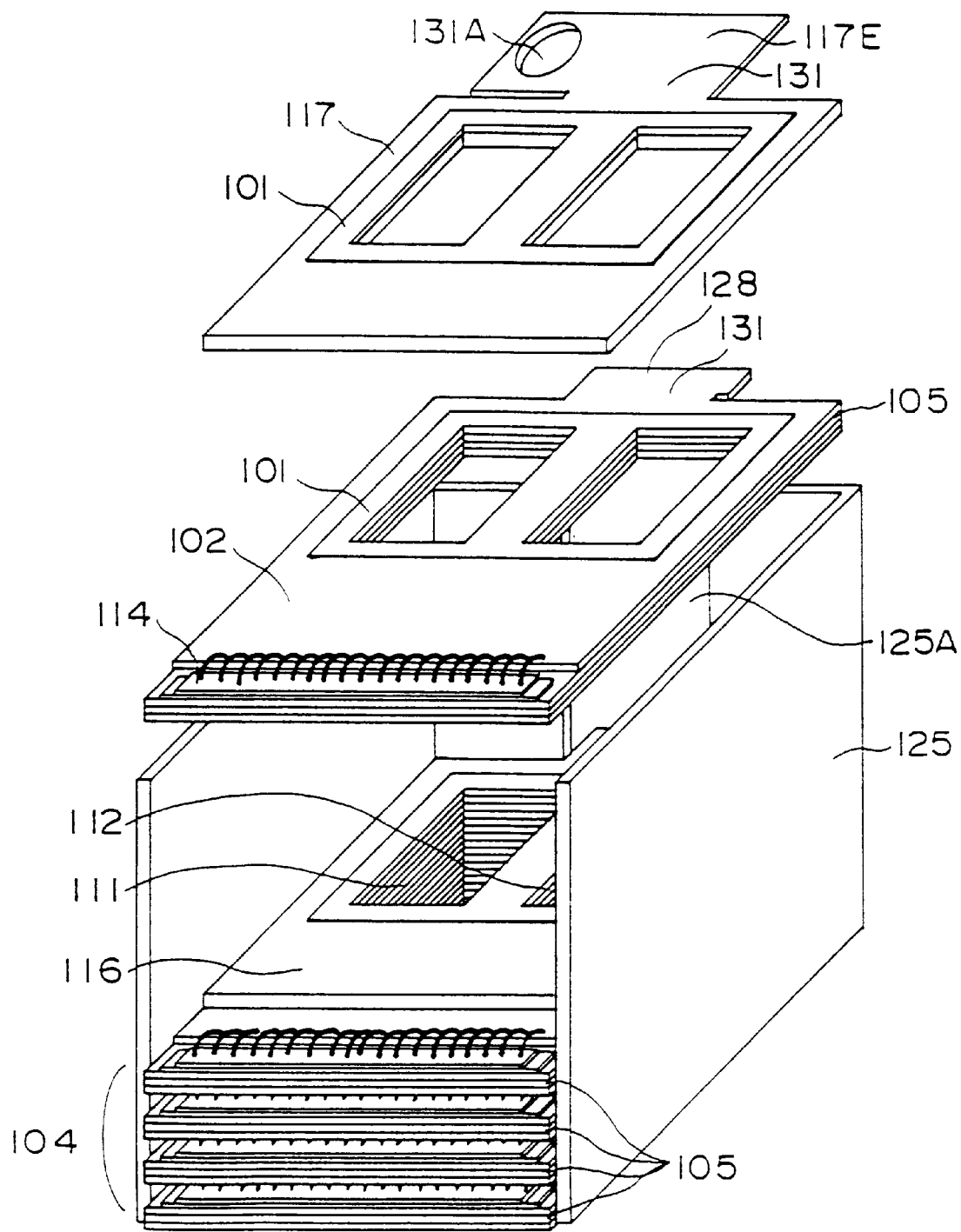
FIG. 28 is a view showing a further modification of the fourteenth embodiment.

FIG. 28 shows a further modification of the present embodiment.

Referring to FIG. 28, the present embodiment forms a cutout 125A having a constant width on a rear wall of the case 125 so that the cutout 125A extends vertically. Further, each of the linear optical sources 105 is formed with the tongue 128 extending in the backward direction similarly to the previous embodiment of FIG. 27, wherein the tongue 128 is now provided with a region 131 of a reduced width in correspondence to the foregoing cutout 125A, and the linear optical sources 105 are stacked in the case 125 such that the region 131 of the tongue 128 engages the cutout 125A.

In such a construction, the linear optical sources 105 are properly positioned in the lateral direction by the engagement with the side walls of the case 125 and further in the forward-backward direction by the engagement of the region 131 with the cutout 125A. In order to avoid an electrical short-circuit between the linear optical sources 105 through the case 125, the cutout 125A of the case 125 is covered by an insulating coating.

In the construction of FIG. 28, it should be noted further that each spacer 117 is formed with a similar tongue 117E, and the tongue 117E of the uppermost spacer 117 is provided with a screw hole 131A for connecting an electrode.

In the embodiment of FIG. 28, the guide rod in the previous embodiments can be eliminated and the number of parts of the planar optical source is reduced.

[Fifteenth Embodiment]

Figure 29:
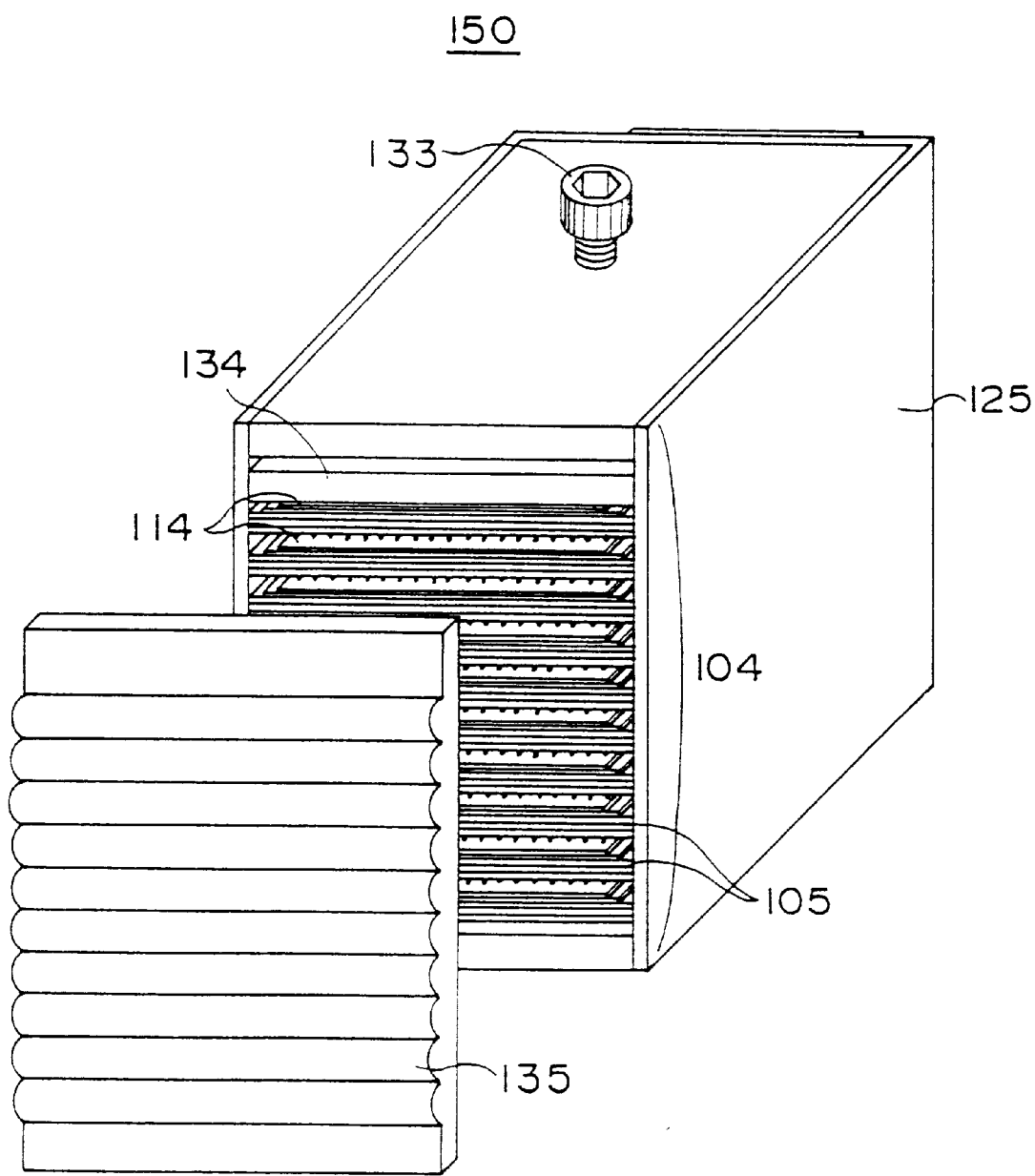
FIG. 29 is a view showing the construction of a planar optical source according to a fifteenth embodiment of the present invention.
Figure 30:
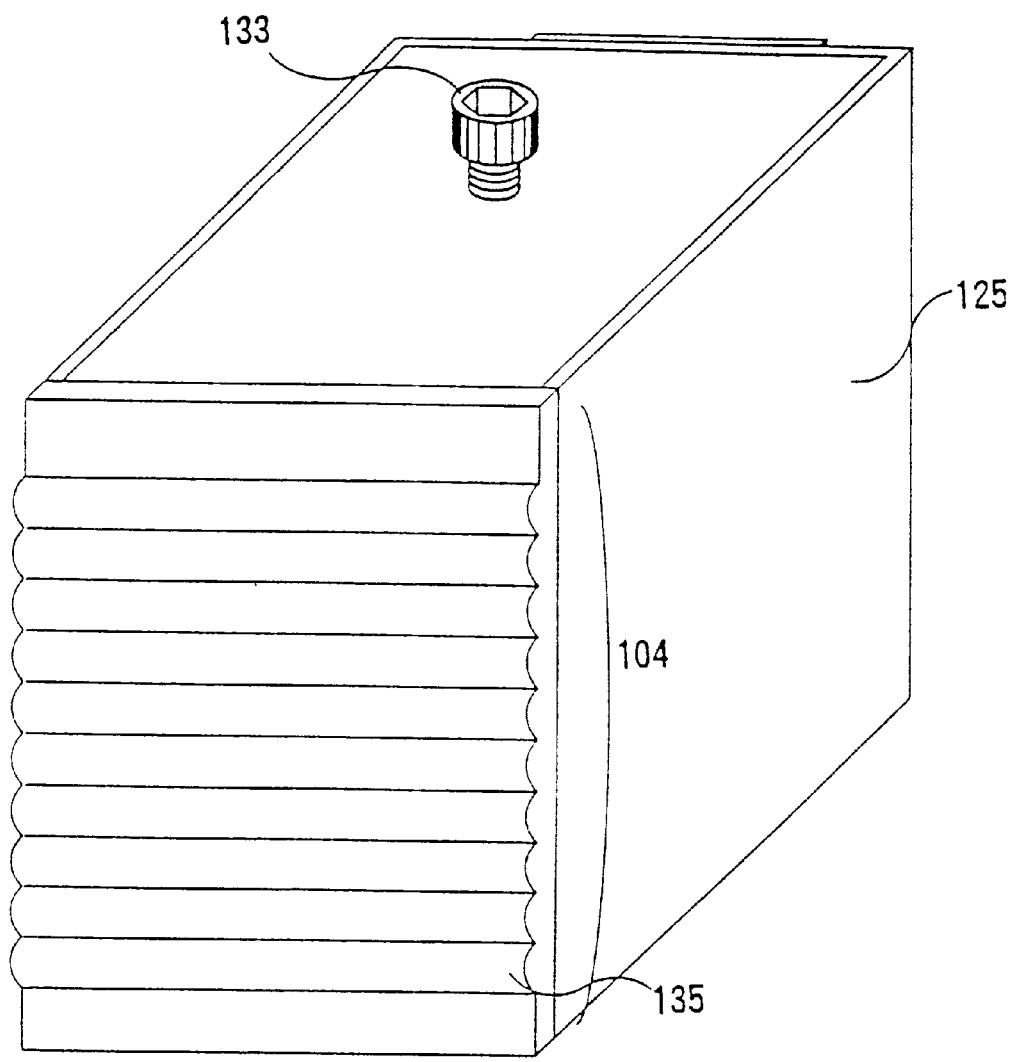
FIG. 30 is another view showing the planar optical source of the fifteenth embodiment.

FIGS. 29 and 30 show the construction of a planar optical source 150 according to a fifteenth embodiment of the present invention before and after the assembling respectively, wherein those parts corresponding to the parts described previously are designated by the same reference numerals and the description thereof will be omitted.

Referring to FIGS. 29 and 30, the planar optical source 150 carries an optical component 135 on a front side of the case 125, wherein the optical component 135 includes a plurality of cylindrical lenses or lens bars corresponding to the plurality of linear optical sources 105 stacked in the case 125. Each of the lens bars converts the optical beams emitted from the corresponding linear optical source 105 into respective, corresponding parallel optical beams. In the case 125, the stacked linear optical sources 105 are urged with respect to each other by a screw 133 at the top of the case 125 via a press plate 134.

By using any of the linear optical sources described heretofore as the foregoing linear optical source 105, the pitch of the optical beams in the stacking direction is determined precisely. Thus, the correspondence between the stacked linear optical sources 105 and the lens bars is maintained even when the integral optical component 135 is used. By using the integral optical component 135, the assembling of the planar optical source 150 of the present embodiment is facilitated substantially as compared with the case of providing a number of optical components respectively in correspondence to the stacked linear optical sources 105.

[Sixteenth Embodiment]

Figure 31A:
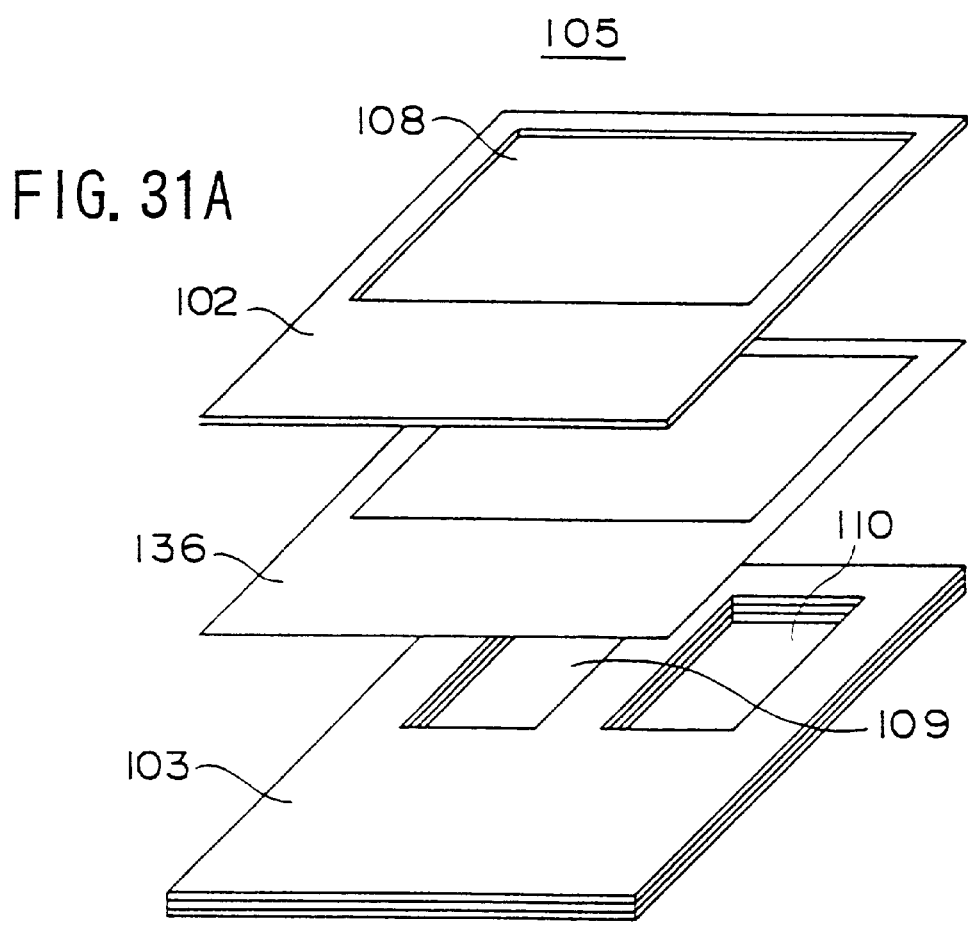
FIGS. 31A and 31B are views showing an assembling process of an optical source according to a sixteenth embodiment of the present invention.
Figure 31B:
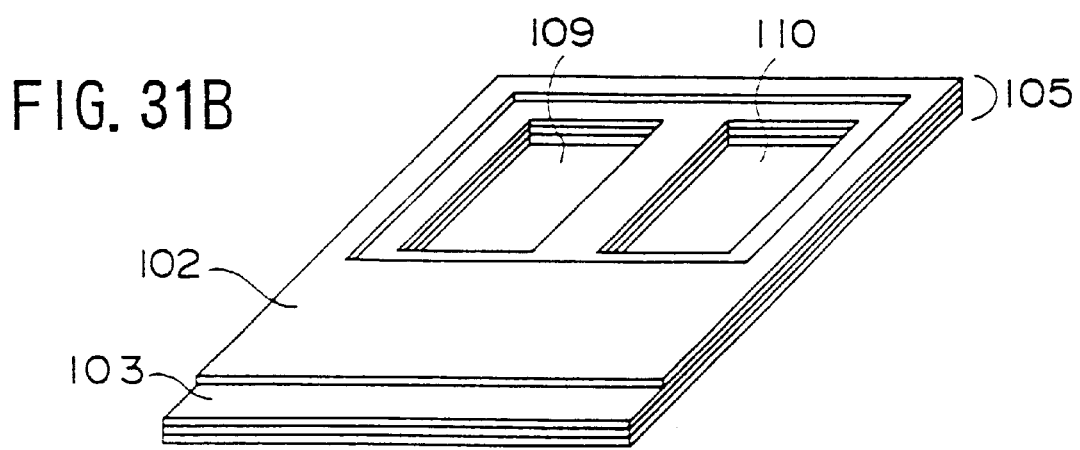

FIG. 31A shows the assembling of the linear optical source 105 according to a sixteenth embodiment of the present invention, while FIG. 31B shows the completed linear optical source 105. In FIGS. 31A and 31B, those parts corresponding to the parts described previously are designated by the same reference numerals and the description thereof will be omitted. The linear optical source 105 itself corresponds to the linear optical source 105 of FIG. 19A.

Referring to FIG. 31A, the cooling device 103 is provided with a double-sided thermoset insulation film 136 identical in size and shape to that of the metal sheet 102, prior to the stacking of the metal sheet on the cooling device 103, wherein the insulation film 136 is formed with an opening corresponding to the opening 108 of the metal sheet 102. See FIG. 31B. By heating the film 136, the film 136 shows an adherence and is cured finally. By interposing the insulation film 136, the metal sheet 102 is reliably insulated from the cooling device 103.

[Seventeenth Embodiment]

FIGS. 32A–32D show a manufacturing process of the linear optical source according to a seventeenth embodiment of the present invention, wherein those parts corresponding to the parts described previously are designated by the same reference numerals and the description thereof will be omitted.

Figure 32A:
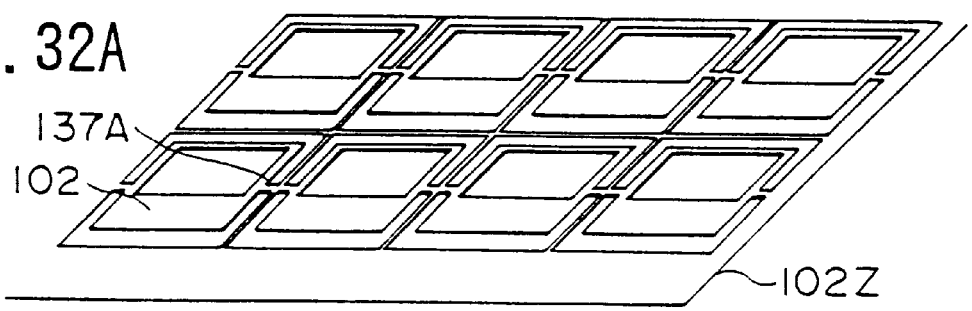
FIGS. 32A–32D are views showing an assembling process of an optical source according to a seventeenth embodiment of the present invention.

Referring to FIG. 32A, it should be noted that the metal sheets 102 are arranged in a row and column formation in a state that the metal sheets 102 are interconnected with each other by a bridging part 137A. The metal sheets 102 thus interconnected are further connected mechanically to a frame 102Z.

Figure 32B:
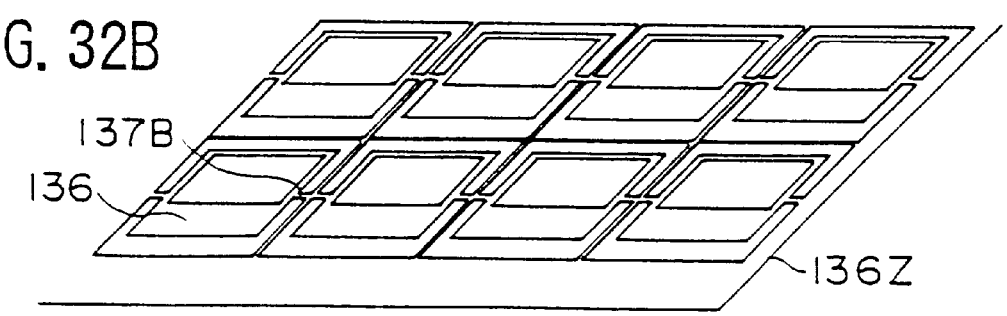

Similarly, the insulation films 136 are arranged in a row and column formation in a state that the films 136 are interconnected with each other by a bridging part 137B, as indicated in FIG. 32B. The insulation films 136 are further connected mechanically to a frame 136Z.

Further, the cooling devices 103 are arranged in a row and column formation in a state that the cooling devices 103 are interconnected with each other by a bridging part 137C. The cooling devices 103 are further connected mechanically to a frame 103Z. It should be noted that FIG. 32C corresponds to the state of FIG. 12C.

Figure 32C:
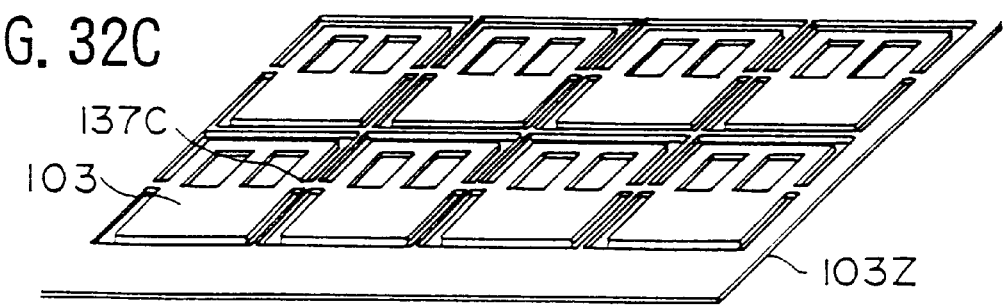
Figure 32D:
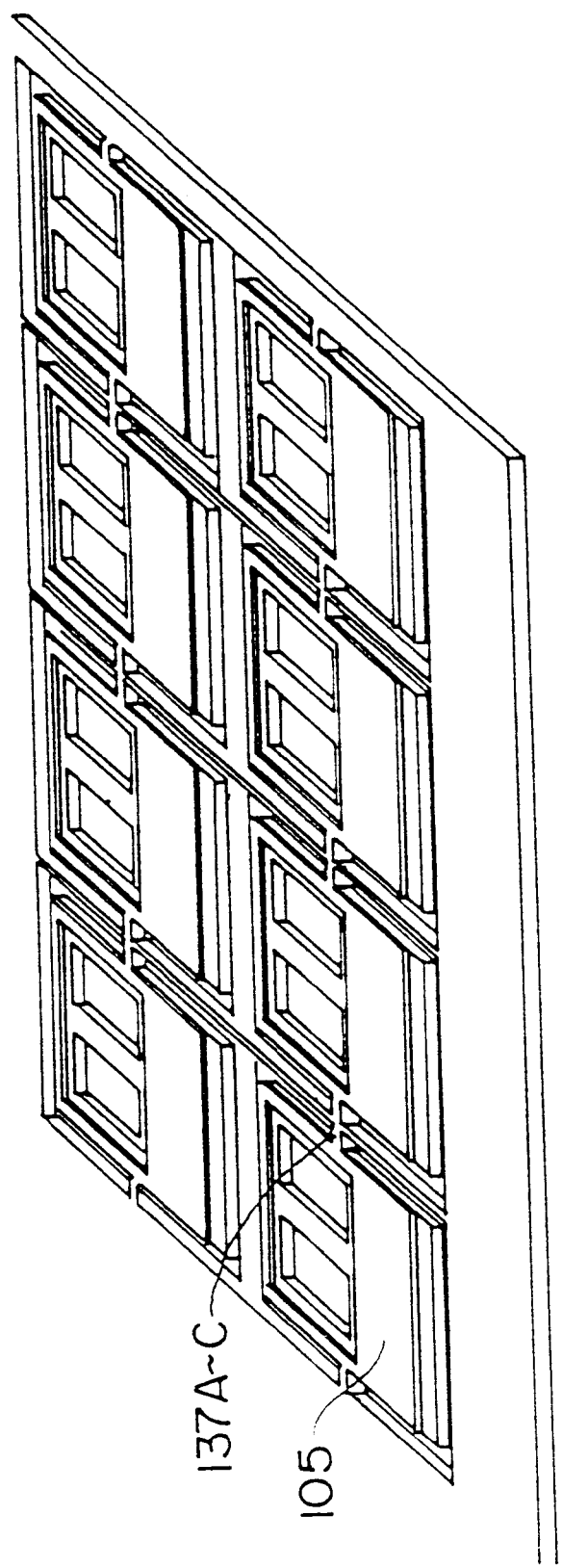

FIG. 32D shows the state in which the structures of FIGS. 32A–32C are stacked. By cutting the foregoing bridging parts 137A–137C simultaneously, a number of linear optical sources 105 each having the construction of FIG. 31B are obtained simultaneously.

Figure 33A:
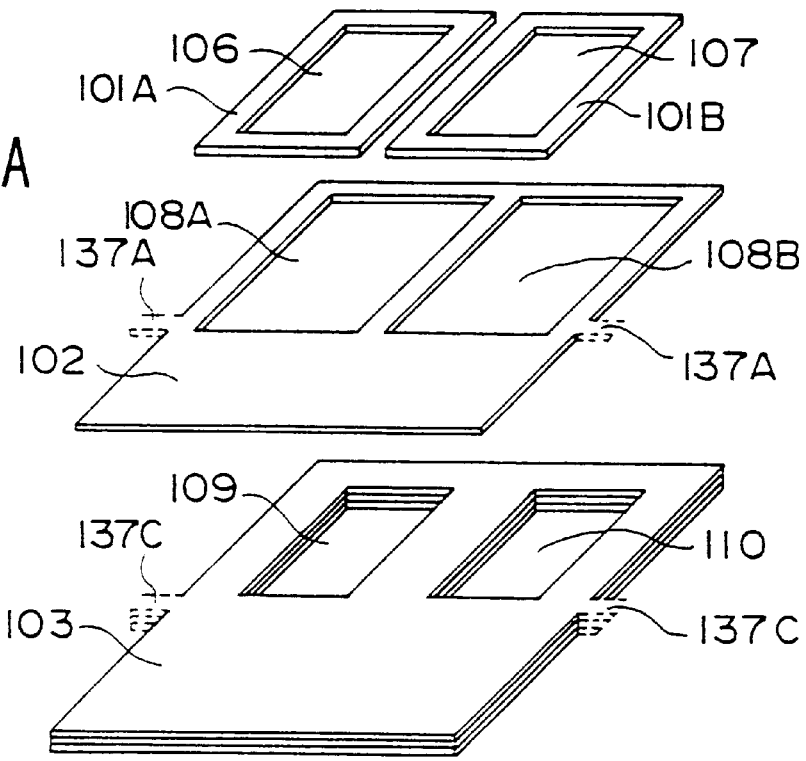
FIGS. 33A and 33B are views showing a modification of the seventeenth embodiment.
Figure 33B:
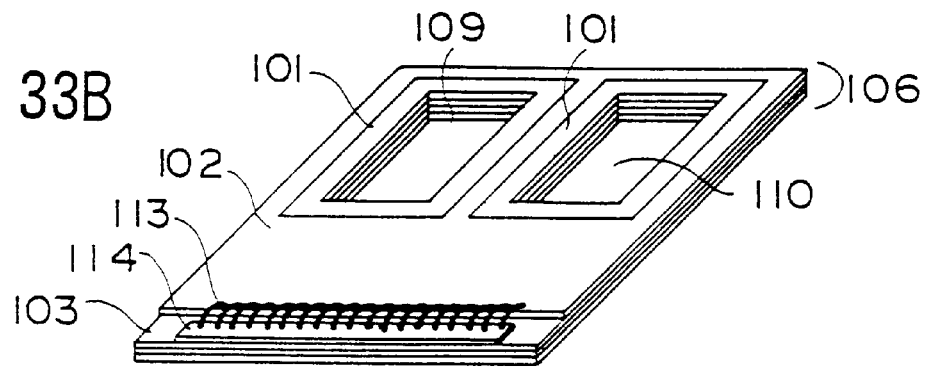

FIG. 33A shows a modification of the linear optical source 105 of FIG. 32D in an exploded view, while FIG. 33B shows the linear optical source of FIG. 33A in an assembled state. For the sake of simplicity, the adhesive film 136 is omitted in FIG. 33A.

Referring to FIG. 33A, the linear optical source of the present modification includes, in the metal sheet 102, a first opening 108A corresponding to the cooling water passage 109 and a second opening 108B corresponding to the cooling water passage 110, in place of the single opening 108, wherein the opening 108A is larger than the cooling water passage 109 and the opening 108B is larger than the cooling water passage 110. In correspondence to this, the rubber sheet 101 is divided into a first rubber sheet 101A having an opening 106 and a second rubber sheet 101B having an opening 107. In the construction of FIGS. 33A and 33B, the rubber sheets 101A and 101B are held firmly in the openings 108A and 108B. As a result, the deformation of the rubber sheets 101A and 101B is eliminated and hence the water leakage.

FIG. 34A shows another modification of the linear optical source 105 in an exploded view, while FIG. 34B shows the linear optical source 105 of FIG. 34A in an assembled state. For the sake of simplicity, the adhesive film 136 is omitted from illustration.

In the present embodiment, the width of the cooling device 103 is reduced while maintaining the same size for the cooling water passages 109 and 110 for reducing the cost of the cooling device 103.

Referring to FIG. 34A, it should be noted that the same rubber sheet 101 used in the embodiment of FIG. 19A is used also in the present embodiment, wherein the present embodiment divides the metal sheet 102 into a main part $102_1$ and a separate frame member $102_2$ in order to accommodate the rubber sheet 101 into the opening 108, which, in turn, is formed in the cooling device 103 of which width is reduced.

As long as the linear optical source is formed by the process indicated in FIGS. 32A–32C, the main part $102_1$ and the separate frame member $102_2$ are actually interconnected at the bridging part 137A and the stacking of the layers is achieved easily and efficiently, without increasing the number of manufacturing steps.

Figure 35A:
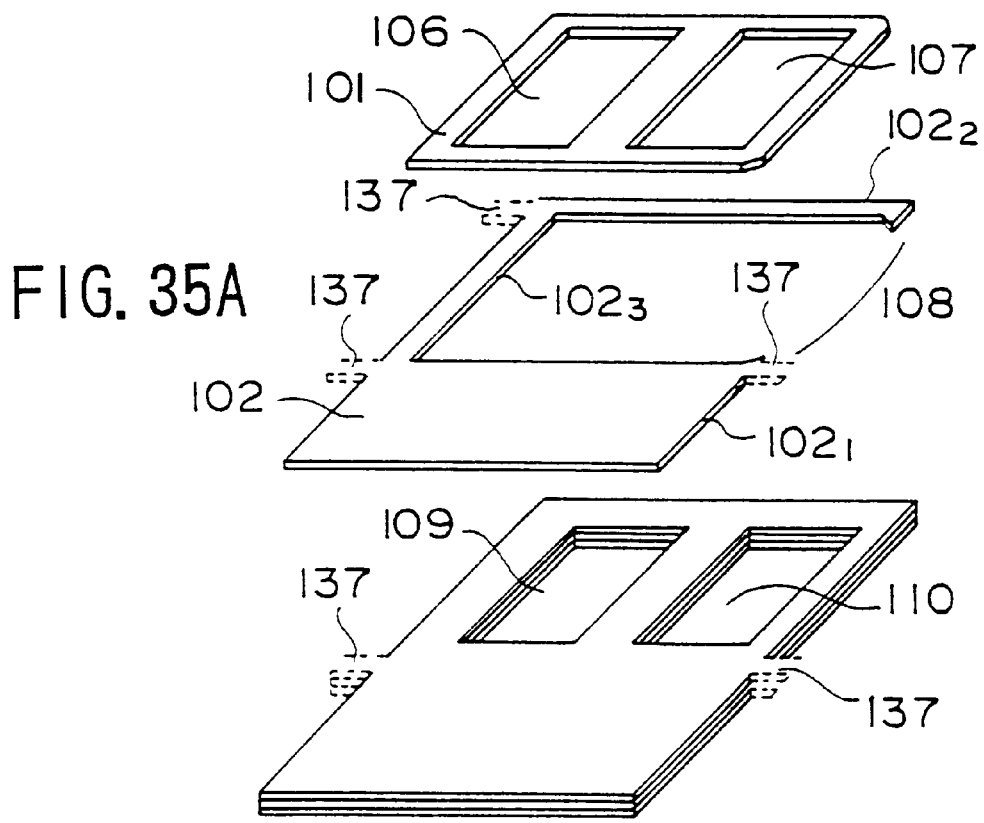
FIGS. 35A and 35B are views showing a further modification of the seventeenth embodiment.
Figure 35B:
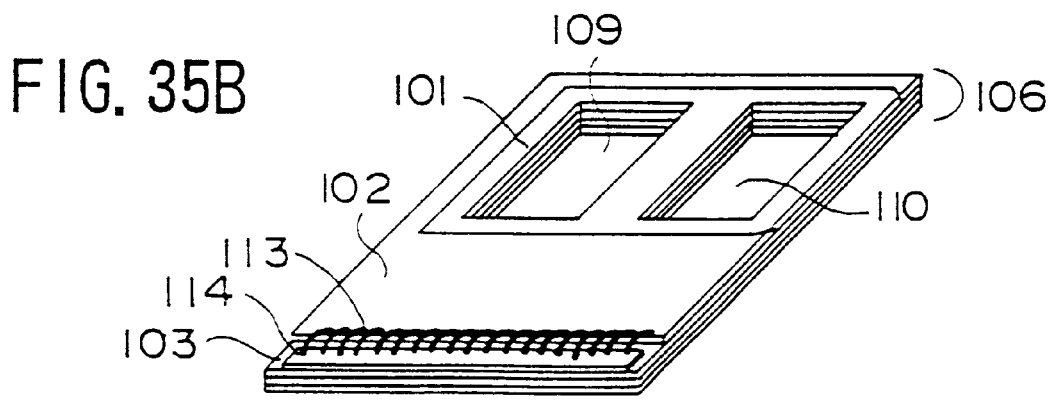

FIGS. 35A and 35B show an intermediate structure between the structure of FIGS. 19A and 19B and the structure of FIGS. 34A and 34B. In order to reinforce the rigidity of the metal sheet 102, the construction of the present modification uses a frame member $102_3$ only at the side of the inlet-side cooling water passage 109, in which the water pressure is expected to be higher than in the cooling water passage 110. As other aspects of the present embodiment are obvious from the preceding descriptions, further description thereof will be omitted.

[Eighteenth Embodiment]

FIGS. 36A–36D show the construction of a cooling device according to an eighteenth embodiment of the present invention, wherein the present embodiment is a modification of the first embodiment described with reference to FIGS. 5A and 5B. In FIGS. 36A–36D, those parts corresponding to the parts described heretofore are designated by the same reference numerals and the description thereof will be omitted.

Figure 36A:
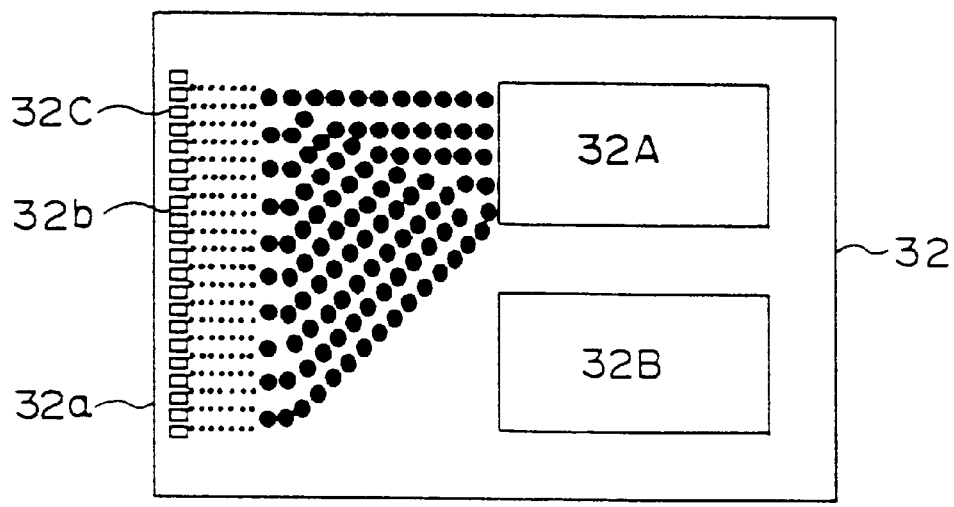
FIGS. 36A–36D are views showing the construction of a cooling device according to an eighteenth embodiment of the present invention.
Figure 37A:
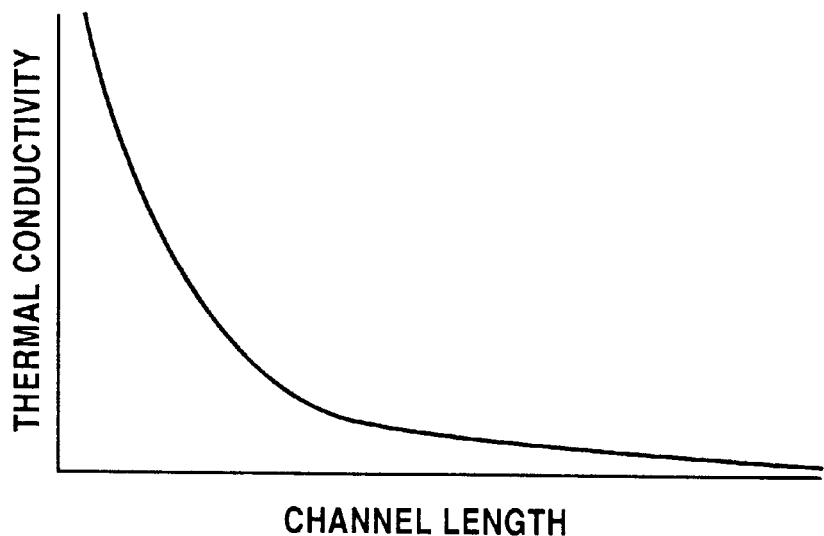
FIGS. 37A and 37B are view showing the effect of the eighteenth embodiment.
Figure 37B:
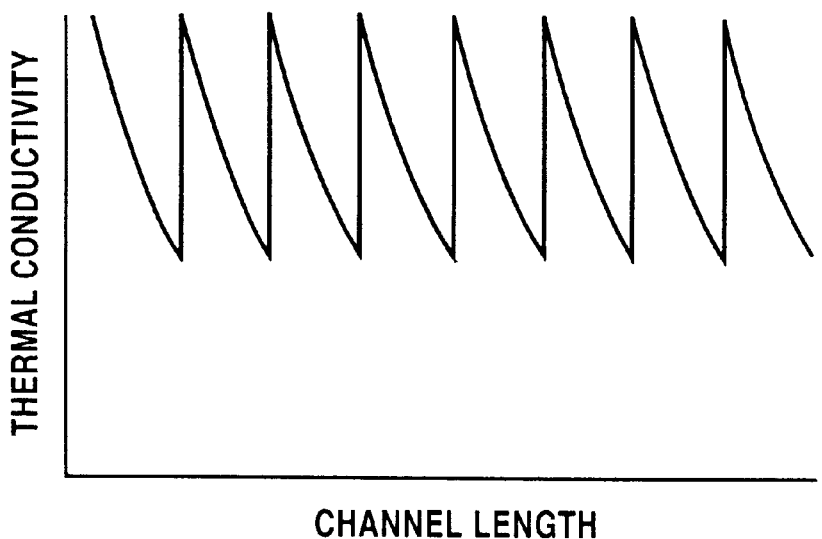

Referring to FIG. 36A, the plate member 32 is formed, on the side thereof facing the plate member 31 or on the side thereof facing the plate member 33, a number of depressions indicated by solid circles along the grooves 31C and 31D. By forming such depressions, the cooling water flowing through the grooves 31C or 31D experiences a formation of turbulent flow repeatedly. Thereby, the rapidly decreasing heat transfer rate shown in FIG. 37A for the case in which a laminar flow is formed in the grooves 31C and 31D, is reset to an initial state repeatedly in correspondence to each of the depressions as indicated in FIG. 37B. In FIGS. 37A and 37B, the horizontal axis represents the length of the cooling water path as measured along the grooves 31D. Upon resetting, the cooling water flow resumes the state immediately after the cooling water has entered the groove 31D.

It should be noted that such depressions are formed easily by applying a chemical etching process to the plate member 32 after the apertures 32C are formed. The shape of the depressions is not limited to be circular but may have any arbitrary shape, such as a triangular shape or a square shape.

Figure 36B:
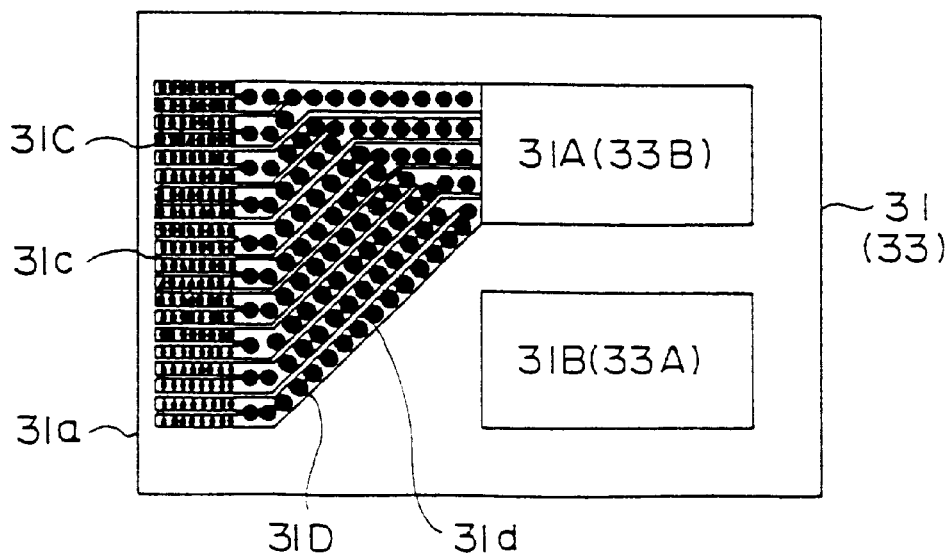
Figure 36C:
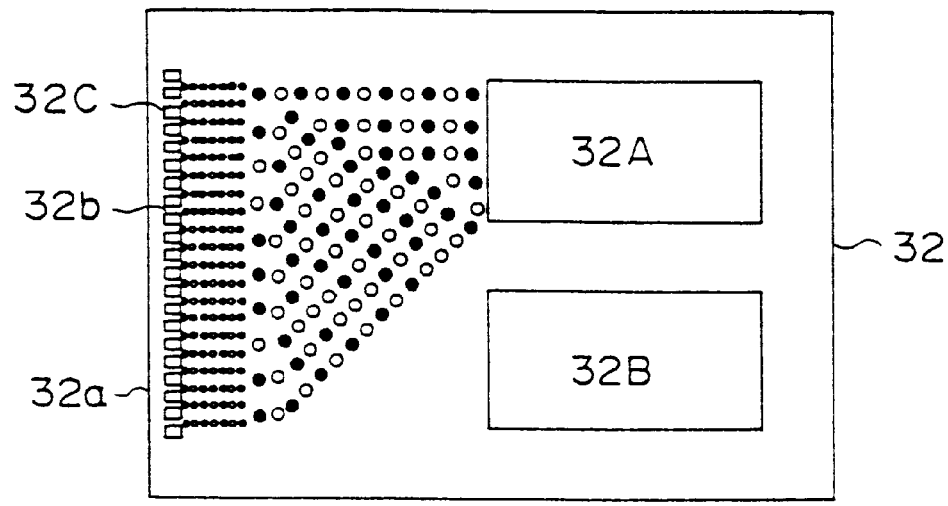

FIG. 36B shows the case in which the depressions are formed on the plate member 31 or 33 along the grooves 31C and 31D. Further, FIG. 36C shows the case in which depressions are formed at both sides of the intermediate plate member 32. In FIG. 36C, the solid circles represent the depressions formed on the top surface while the open circles represent the depressions formed on the bottom surface of the plate member 32.

As indicated in FIG. 36C, the solid circles and the open circles are formed alternately for avoiding the formation of penetrating holes. By configuring the depressions as indicated in FIG. 36C, the depressions, both on the top surface and bottom surface of the plate member 32, can be formed simultaneously to the apertures 35C that are also formed by applying a chemical etching process to the both surfaces of the plate member 32.

Figure 36D:
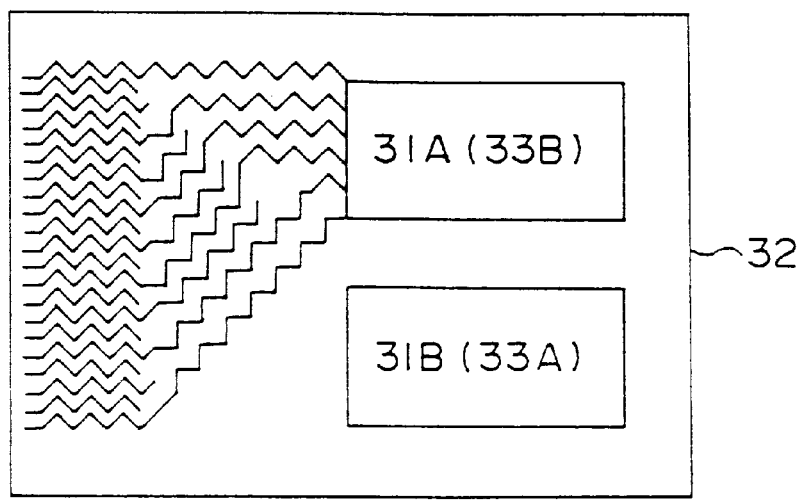

FIG. 36D shows an example of forming the grooves 31C and 31D in a zigzag form. By bending the flow of the cooling water sharply, a turbulent flow is induced each time the cooling water flow is bent. Thereby, an improvement of heat transfer rate is achieved similarly to the case of FIG. 37B. In FIG. 36D, the bending of the grooves is not limited to be the zigzag form but a sinusoidal form or arcuate form may also be used.

Further, the present invention is not limited to the embodiments described heretofore, but various variations and modifications may be made without departing from the scope of the invention.

What is claimed is:

1. A cooling device, comprising:
   a layered body of plate members stacked with each other and adapted for thermal contact with an object to be cooled;
   said layered body comprising:
   a first plate member of a metal, said first plate member having an inlet opening of a cooling medium;
   a first branched groove provided on a first side of said first plate member, said first branched groove having a first end in communication with said inlet opening and a plurality of branches each in communication with said first end, each of said plurality of branches having a second end opposite to said first end, said first branched groove thereby transporting therethrough said cooling medium from said first end to each of said second ends;
   a second plate member of a metal provided on said first side of said first plate member;
   a plurality of apertures provided on said second plate member respectively in correspondence to said second ends of said branches, each of said apertures being isolated from each other and allowing a passage of said cooling medium therethrough;
   a third plate member of a metal provided on said second plate member at a side of said second plate member opposite to a side facing said first plate member, said third plate member having an outlet opening of said cooling medium; and
   a second branched groove provided on said third plate member at a side thereof facing said second plate member, said second branched groove having a third end in communication with said outlet opening and a plurality of branches each in communication with said third end, each of said plurality of branches having a fourth end opposite to said third end, said second branched groove thereby transporting therethrough said cooling medium from said plurality of fourth ends to said third end;

said plurality of fourth ends of said second branched groove corresponding to said plurality of apertures, respectively.

2. A cooling device as claimed in claim 1, wherein each of said second and third plate members has an opening corresponding to said inlet opening of said first plate member, and wherein each of said second and third plate members has another opening corresponding to said outlet opening of said third plate member.

3. A cooling device as claimed in claim 1, further comprising, at least in one of a location between said first plate member and said second plate member and a location between said second plate member and said third plate member, additional plate members formed of a metal, each of said additional plate members having a first opening corresponding to said inlet opening and a second opening corresponding to said outlet opening, each of said additional plate members carrying, when provided between said first plate member and said second plate member, a branched groove having an end connected to said first opening and a plurality of branched ends, each of said additional plate members carrying, when provided between said second plate member and said third plate member, a branched groove having an end connected to said second opening and a plurality of branched ends; said additional plate further having an aperture in correspondence to each of said branched ends of said branched groove thereon.

4. A cooling device as claimed in claim 3, wherein said additional plate members have an identical construction, and wherein said additional plate members locating between said second and third plate members are disposed in a turned over state with respect to said additional plate members locating between said first and second plate members.

5. A cooling device as claimed in claim 3, wherein said branched groove on said additional plate member is defined by at least a pair of ridges, each of said ridges contacting thermally and mechanically to an adjacent plate member adjacent to said additional plate member.

6. A cooling device as claimed in claim 3, wherein each of said additional plate members is formed of a metal having a thermal conductivity coefficient of 1.5 W/cm·K or more.

7. A cooling device as claimed in claim 6, wherein said first through third plate members and said additional plate members are formed of an identical material.

8. A cooling device as claimed in claim 3, wherein each of said branches includes, in at least one of said additional plate members, a node in which said branch is divided further into a plurality of branches.

9. A cooling device as claimed in claim 3, wherein each of said first and second branched grooves and said branched grooves on said additional plate members is defined by at least a pair of ridges, said ridge engaging with an adjacent plate member thermally and mechanically.

10. A cooling device as claimed in claim 9, wherein at least one of said ridges includes a part that does not contact with said adjacent plate member.

11. A cooling device as claimed in claim 3, wherein said apertures are formed in said second plate member and further in said additional plate members with a pitch identical to a pitch of said branches on an adjacent plate member.

12. A cooling device as claimed in claim 3, wherein said apertures are formed in said second plate member and further in said additional plate members with a pitch equal to an integer multiple of a pitch of said branches on an adjacent plate member.

13. A cooling device as claimed in claim 3, wherein said apertures are formed in said second plate member and further in said additional plate members with a pitch equal to an integer multiple fraction of a pitch of said branches on an adjacent plate member.

14. A cooling device as claimed in claim 3, wherein said apertures are formed in said second plate member and further in said additional plate members such that an opening of an aperture on a top surface of said second plate member is displaced with respect to an opening of said aperture on a bottom surface of said second plate member by a half pitch of said apertures.

15. A cooling device as claimed in claim 3, wherein said branched grooves on said first and third plate members and in said additional plate members have an identical pattern.

16. A cooling device as claimed in claim 3, wherein said first branched groove has a depth exceeding one-half a thickness of said first plate member, said second branched groove has a depth exceeding one-half a thickness of said third plate member, and wherein each of said branched grooves on said additional plate members has a depth exceeding one-half a thickness of said additional plate member.

17. A cooling device as claimed in claim 1, wherein each of said first and second branched grooves is defined by at least a pair of ridges, said ridge engaging with an adjacent plate member thermally and mechanically.

18. A cooling device as claimed in claim 17, wherein at least one of said ridges includes a part that does not contact with said adjacent plate member.

19. A cooling device as claimed in claim 1, wherein each of said first through third plate members is formed of a metal having a thermal conductivity coefficient of 1.5 W/cm·K or more.

20. A cooling device as claimed in claim 1, wherein, each of said branches includes, in at least one of said first and third plate members, a node in which said branch is divided further into a plurality of branches.

21. A cooling device as claimed in claim 1, wherein said apertures are formed in said second plate member with a pitch identical to a pitch of said branches on an adjacent plate member.

22. A cooling device as claimed in claim 1, wherein said apertures are formed in said second plate member with a pitch equal to an integer multiple of a pitch of said branches on an adjacent plate member.

23. A cooling device as claimed in claim 1, wherein said apertures are formed in said second plate member with a pitch equal to an integer multiple fraction of a pitch of said branches on an adjacent plate member.

24. A cooling device as claimed in claim 1, wherein said apertures are formed in said second plate member such that an opening of an aperture on a top surface of said second plate member is displaced with respect to an opening of said aperture on a bottom surface of said second plate member by a half pitch of said apertures.

25. A cooling device as claimed in claim 1, wherein said branched grooves on said first and third plate members have an identical pattern.

26. A cooling device as claimed in claim 1, wherein said first through third plate members are formed of an identical material.

27. A cooling device as claimed in claim 1, wherein said third plate member is identical in size and shape to said first plate member, said third plate member being provided on said second plate member in a turned over state with respect to said first plate member.

28. A cooling device as claimed in claim 1, wherein said first branched groove has a depth exceeding one-half a thickness of said first plate member, and wherein said second branched groove has a depth exceeding one-half a thickness of said third plate member.

29. A cooling device as claimed in claim 1, wherein said second plate member carries, on at least one of top and bottom sides thereof to which an adjacent plate member makes a contact, an auxiliary branched groove having a shape corresponding to a branched groove provided on said adjacent plate member, said auxiliary branched groove on said second plate member and said branched groove on said adjacent plate member forming together a passage of cooling water.

30. A cooling device as claimed in claim 1, wherein said first plate member carries, on a first side thereof, projections and depressions along said first branched groove.

31. A cooling device as claimed in claim 1, wherein said second plate member carries, on a bottom surface thereof contacting said first plate member, projections and depressions along said first branched groove.

32. A cooling device as claimed in claim 1, wherein said second plate member carries, on a bottom surface thereof contacting said third plate member, projections and depressions along said second branched groove.

33. A cooling device as claimed in claim 1, wherein said third plate member carries, on a bottom surface thereof contacting said second plate member, projections and depressions along said second branched groove.

34. A cooling device as claimed in claim 1, wherein said branches forming said first branched groove have a zigzag shape.

35. A cooling device as claimed in claim 1, wherein said branches forming said second branched groove have a zigzag shape.

36. An optical source, comprising:
a cooling device; and
a laser diode array provided on said cooling device, said cooling device, comprising:
a layered body of plate members stacked upon each other and adapted for thermal contact with an object to be cooled;
said layered body comprising:
a first plate member of a metal, said first plate member having an inlet opening of a cooling medium;
a first branched groove provided on a first side of said first plate member, said first branched groove having a first end in communication with said inlet opening and a plurality of branches each in communication with said first end, each of said plurality of branches having a second end opposite to said first end, said first branched groove thereby transporting therethrough said cooling medium from said first end to each of said second ends;
a second plate member of a metal provided on said first side of said first plate member;
a plurality of apertures provided on said second plate member respectively in correspondence to said second ends of said branches, each of said apertures being isolated from each other and allowing a passage of said cooling medium therethrough;
a third plate member of a metal provided on said second plate member at a side of said second plate member opposite to a side facing said first plate member, said third plate member having an outlet opening of said cooling medium; and
a second branched groove provided on said third plate member at a side thereof facing said second plate member, said second branched groove having a third end in communication with said outlet opening and a plurality of branches each in communication with said third end, each of said plurality of branches having a fourth end opposite to said third end, said second branched groove thereby transporting therethrough said cooling medium from said plurality of fourth ends to said third end;
said plurality of fourth ends of said second branched groove corresponding to said plurality of apertures, respectively;
said laser diode array being mounted on said third plate member along said fourth ends of said second branched groove.

37. An optical source as claimed in claim 36, wherein said laser diode array makes a contact with said third plate member electrically and thermally.

38. An optical source as claimed in claim 36, wherein a conductive heat sink is interposed between said laser diode array and said third plate member.

39. An optical source as claimed in claim 38, wherein said heat sink has a thermal expansion coefficient closer to a thermal expansion coefficient of said laser diode array than a thermal expansion coefficient of said third plate member.

40. An optical source as claimed in claim 39, further comprising a compensating heat sink on a bottom surface opposite to said first side of said first plate member in a symmetrical relationship to said conductive heat sink.

41. A planar optical source, comprising:
a plurality of linear optical sources stacked upon each other, each of said linear optical sources comprising:
a cooling device; and
a laser diode array provided on said cooling device, said cooling device, comprising:
a layered body of plate members stacked upon each other and adapted for thermal contact with an object to be cooled;
said layered body comprising:
a first plate member of a metal, said first plate member having an inlet opening of a cooling medium;
a first branched groove provided on a first side of said first plate member, said first branched groove having a first end in communication with said inlet opening and a plurality of branches each in communication with said first end, each of said plurality of branches having a second end opposite to said first end, said first branched groove thereby transporting therethrough said cooling medium from said first end to each of said second ends;
a second plate member of a metal provided on said first side of said first plate member;
a plurality of apertures provided on said second plate member respectively in correspondence to said second ends of said branches, each of said apertures being isolated from each other and allowing a passage of said cooling medium therethrough;
a third plate member of a metal provided on said second plate member at a side of said second plate member opposite to a side facing said first plate member, said third plate member having an outlet opening of said cooling medium; and a second branched groove provided on said third plate member at a side thereof facing said second plate member, said second branched groove having a third end in communication with said outlet opening and a plurality of branches each in communication with said third end, each of said plurality of branches having a fourth end opposite to said third end, said second branched groove thereby transporting therethrough said cooling medium from said plurality of fourth ends to said third end;

said plurality of fourth ends of said second branched groove corresponding to said plurality of apertures, respectively;

said laser diode array being mounted on said third plate member along said fourth ends of said second branched groove.

42. An optical source, comprising:

a base having an inlet-side passage and an outlet-side passage of a cooling medium; and a plurality of planar optical sources provided detachably on said base along said inlet-side passage and outlet-side passage of said cooling medium, each of said planar optical sources comprising a plurality of linear optical sources stacked upon each other, each of said linear optical sources comprising:

a cooling device; and a laser diode array provided on said cooling device, said cooling device, comprising:

a layered body of plate members stacked upon each other and adapted for thermal contact with an object to be cooled;

said layered body comprising:

a first plate member of a metal, said first plate member having an inlet opening of a cooling medium;

a first branched groove provided on a first side of said first plate member, said first branched groove having a first end in communication with said inlet opening and a plurality of branches each in communication with said first end, each of said plurality of branches having a second end opposite to said first end, said first branched groove thereby transporting therethrough said cooling medium from said first end to each of said second ends;

a second plate member of a metal provided on said first side of said first plate member;

a plurality of apertures provided on said second plate member respectively in correspondence to said second ends of said branches, each of said apertures being isolated from each other and allowing a passage of said cooling medium therethrough;

a third plate member of a metal provided on said second plate member at a side of said second plate member opposite to a side facing said first plate member, said third plate member having an outlet opening of said cooling medium; and a second branched groove provided on said third plate member at a side thereof facing said second plate member, said second branched groove having a third end in communication with said outlet opening and a plurality of branches each in communication with said third end, each of said plurality of branches having a fourth end opposite to said third end, said second branched groove thereby transporting therethrough said cooling medium from said plurality of fourth ends to said third end;

said plurality of fourth ends of said second branched groove corresponding to said plurality of apertures, respectively;

said laser diode array being mounted on said third plate member along said fourth ends of said second branched groove;

wherein said base is formed with a plurality of outlet-side openings and a plurality of inlet-side openings in correspondence to said plurality of planar optical sources such that each of said inlet-side openings communicates with said inlet-side passage and such that each of said outlet-side openings communicates with said outlet-side passage;

each of said plurality of planar optical sources being mounted on said base such that said inlet opening of said cooling device communicates with said outlet-side openings on said base and such that said outlet opening of said cooling device communicates with said inlet-side openings.

43. A linear optical source, comprising:

a cooling device formed of a layered body of metal plate members stacked on each other, said layered body including a first coolant passage to which a cooling medium is supplied, a second coolant passage from which said cooling medium is discharged, and a third coolant passage interconnecting said first and second coolant passages;

a light emitting array provided on said cooling device, said light emitting array having a first electrode of a first polarity and connected to said cooling device and a second electrode of a second, opposite polarity;

a conductor plate provided on a top surface of said cooling device in electrical insulation therefrom, said conductor plate having an opening exposing said first and second coolant passages of said layered body;

an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages.

44. A linear optical source as claimed in claim 43, wherein said conductor plate has a reduced thickness in correspondence to an interconnection part to which said interconnecting structure is connected, said interconnection part thereby forming a stepped region.

45. A linear optical source as claimed in claim 43, wherein said opening is defined by an inclined side wall, said inclined side wall being inclined such that a size of said opening increases from a top surface to a bottom surface of said conductor plate.

46. A linear optical source as claimed in claim 43, wherein said opening includes a projection on a side wall thereof between a top surface and a bottom surface of said conductor place such that said projection reduces a size of said opening.

47. A planar optical source, comprising a plurality of linear optical sources stacked with each other, each of said linear optical sources comprising:

a cooling device formed of a layered body of metal plate members stacked with each other, said layered body including a first coolant passage to which a cooling medium is supplied, a second coolant passage from which said cooling medium is discharged, and a third coolant passage interconnecting said first and second coolant passages;

a light emitting array provided on said cooling device, said light emitting array having a first electrode of a first polarity and connected to said cooling device and a second electrode of a second, opposite polarity;

a conductor plate provided on a top surface of said cooling device in electrical insulation therefrom, said conductor plate having an opening exposing said first and second coolant passages of said layered body;

an interconnecting structure connecting said second electrode and said conductor plate electrically; and an elastic body fitted into said opening of said conductor plate, said elastic body having a thickness exceeding a thickness of said conductor plate and formed with first and second openings in correspondence to said first and second coolant passages;

said plurality of linear optical sources being stacked such that a first coolant passage of a linear optical source is aligned with a first coolant passage of an adjacent linear optical source and such that a second coolant passage of a linear optical source is aligned with a second coolant passage of an adjacent linear optical source.

48. A planar optical source as claimed in claim 47, wherein, in each of said plurality of linear optical sources, said conductor plate makes an intimate contact with a bottom surface of a cooling device of another linear optical source provided immediately thereabove.

49. A planar optical source as claimed in claim 47, further including a spacer between a first linear optical source and a second adjacent linear optical source provided immediately above said first linear optical source, said first and second linear optical sources being included in said plurality of linear optical sources, in a state such that said spacer makes an intimate contact with said conductor plate of said first linear optical source at a bottom surface of said spacer and such that said spacer makes an intimate contact with a bottom surface of a cooling device of said second optical source, said spacer comprising: a spacer conductor plate having a third opening in alignment with said first coolant passages of said first and second optical sources and a fourth opening in alignment with said second coolant passages of said first and second optical sources; and an elastic spacer member disposed on said spacer conductor plate and having a fifth opening in alignment with said third opening and a sixth opening in alignment with said fourth opening, said spacer conductor plate being formed with a depression for seating said elastic spacer member.

50. A planar optical source as claimed in claim 49, wherein said spacer conductor plate includes a lower conductor plate formed with said third and fourth openings and an upper conductor plate stacked on said lower conductor plate, said upper conductor plate carrying a seventh opening defining said depression.

51. A planar optical source as claimed in claim 50, wherein said depression is defined by an inclined side wall inclined such that a size of said opening increases from a top surface of said upper conductor plate to a bottom surface of said upper conductor plate.

52. A planar optical source as claimed in claim 50, wherein said depression is defined by a side wall having a projection that decreases a size of said opening between a top surface of said upper conductor plate and a bottom surface of said upper conductor plate.

53. A planar optical source as claimed in claim 49, wherein said conductor plate and said spacer conductor plate are formed, in each of said plurality of stacked linear optical sources, of an identical metal.

54. A planar optical source as claimed in claim 49, wherein said elastic body and said elastic spacer member are formed of a rubber.

55. A planar optical source as claimed in claim 47, further comprising a guide structure penetrating through said plurality of stacked linear optical sources for aligning said linear optical sources.

56. A planar optical source as claimed in claim 55, wherein said guide structure comprises a guide member extending through said plurality of stacked linear optical sources along said first and second coolant passages.

57. A planar optical source as claimed in claim 56, wherein said guide structure extends through said plurality of stacked linear optical sources in contact with an inner wall of said first and second coolant passages.

58. A planar optical source as claimed in claim 55, wherein said guide structure includes a guide rod disposed outside said plurality of stacked linear optical sources, each of said linear optical sources having an extension part extending outwardly therefrom and an opening provided in said extension part for inserting said guide rod.

59. A planar optical source as claimed in claim 55, further comprising a case for accommodating said plurality of stacked linear optical sources, each of said optical sources having an extension part extending outwardly therefrom, said guide structure thereby comprising: a cut formed on said case so as to extend in a direction crossing said plurality of stacked linear optical sources; and an engagement part formed on said extension part for each of said plurality of stacked linear optical sources for engagement with said cut, said engagement part having a reduced width as compared with a rest of said extension part.

60. A planar optical source as claimed in claim 47, wherein said plurality of linear optical sources are stacked in the same orientation such that said light emitting arrays point in a common direction, and wherein said planar optical source further includes an optical component at a side of said planar optical source in which optical beams of said light emitting arrays are emitted, said optical component including a plurality of lens bars each corresponding to a linear optical source forming said planar optical source.

* * * * *

UNITED STATES PATENT AND TRADEMARK OFFICE
CERTIFICATE OF CORRECTION

PATENT NO. : 6,097,744
DATED : August 1, 2000
INVENTOR(S) : Takigawa et al.

It is certified that error appears in the above-identified patent and that said Letters Patent is hereby corrected as shown below:

<u>Title page,</u>
Item [73], change the name of the assignee, "Fujitsu Limited" to -- Fanuc Ltd. --

Signed and Sealed this

Fifteenth Day of January, 2002

Attest:

JAMES E. ROGAN
*Director of the United States Patent and Trademark Office*

*Attesting Officer*